United States Patent
Yu et al.

(10) Patent No.: US 9,472,768 B2
(45) Date of Patent: Oct. 18, 2016

(54) MATERIAL FOR AN ORGANIC OPTOELECTRONIC DEVICE, ORGANIC LIGHT EMITTING DIODE INCLUDING THE SAME, AND DISPLAY DEVICE INCLUDING THE ORGANIC LIGHT EMITTING DIODE

(71) Applicants: Eun-Sun Yu, Uiwang-si (KR); Eui-Su Kang, Uiwang-si (KR); Nam-Heon Lee, Uiwang-si (KR); Mi-Young Chae, Uiwang-si (KR)

(72) Inventors: Eun-Sun Yu, Uiwang-si (KR); Eui-Su Kang, Uiwang-si (KR); Nam-Heon Lee, Uiwang-si (KR); Mi-Young Chae, Uiwang-si (KR)

(73) Assignee: CHEIL INDUSTRIES, INC., Gumi-Si, Kyeongsangbuk-Do (KR)

( * ) Notice: Subject to any disclaimer, the term of this patent is extended or adjusted under 35 U.S.C. 154(b) by 481 days.

(21) Appl. No.: 14/051,603

(22) Filed: Oct. 11, 2013

(65) Prior Publication Data

US 2014/0034940 A1  Feb. 6, 2014

Related U.S. Application Data

(63) Continuation of application No. PCT/KR2011/007182, filed on Sep. 29, 2011.

(30) Foreign Application Priority Data

Jun. 20, 2011 (KR) .................. 10-2011-0059835

(51) Int. Cl.
| | |
|---|---|
| *H01L 51/00* | (2006.01) |
| *C09B 57/00* | (2006.01) |
| *H05B 33/14* | (2006.01) |
| *H01L 51/50* | (2006.01) |

(52) U.S. Cl.
CPC ........... *H01L 51/0067* (2013.01); *C09B 57/00* (2013.01); *C09B 57/008* (2013.01); *H01L 51/0072* (2013.01); *H05B 33/14* (2013.01); *C09K 2211/1007* (2013.01); *C09K 2211/1011* (2013.01); *C09K 2211/1014* (2013.01); *C09K 2211/1029* (2013.01); *C09K 2211/1044* (2013.01); *C09K 2211/1059* (2013.01); *H01L 51/006* (2013.01); *H01L 51/0081* (2013.01); *H01L 51/0085* (2013.01); *H01L 51/5016* (2013.01); *H01L 2251/5384* (2013.01); *Y02E 10/549* (2013.01)

(58) Field of Classification Search
CPC ................. H01L 51/0067; H01L 51/0072
See application file for complete search history.

(56) References Cited

U.S. PATENT DOCUMENTS

| | | |
|---|---|---|
| 2006/0199038 A1 | 9/2006 | Lee |
| 2007/0252516 A1 | 11/2007 | Kondakova et al. |
| 2011/0031484 A1 | 2/2011 | Lee et al. |
| 2011/0278555 A1 | 11/2011 | Inoue et al. |
| 2012/0175599 A1 | 7/2012 | Yokoyama et al. |
| 2012/0211736 A1 | 8/2012 | Kim et al. |
| 2012/0235123 A1 | 9/2012 | Lee et al. |
| 2013/0056720 A1 | 3/2013 | Kim et al. |

FOREIGN PATENT DOCUMENTS

| | | |
|---|---|---|
| EP | 2 568 030 A2 | 3/2013 |
| JP | 08-003547 A | 1/1996 |
| JP | 2003 133075 * | 5/2003 |

(Continued)

OTHER PUBLICATIONS

JP 2003 133075 machine translation (2003).*

(Continued)

*Primary Examiner* — Kuo-Liang Peng
(74) *Attorney, Agent, or Firm* — Lee & Morse, P.C.

(57) ABSTRACT

A material for an organic optoelectronic device, an organic light emitting diode including the same, and a display device including the organic light emitting diode, the material including at least one compound represented by the following Chemical Formula A-1; and at least one compound represented by the following Chemical Formula B-1:

[Chemical Formula A-1]

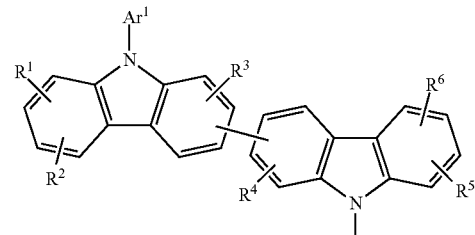

[Chemical Formula B-1]

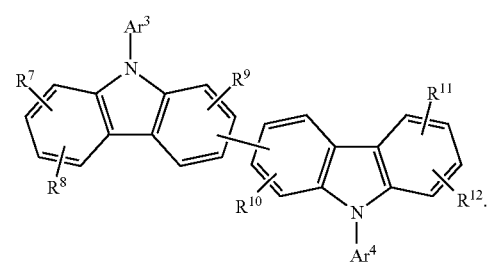

20 Claims, 8 Drawing Sheets

(56) References Cited

FOREIGN PATENT DOCUMENTS

| | | | |
|---|---|---|---|
| JP | 2003-133075 A | 5/2003 |
| KR | 10 2006-0097313 A | 9/2006 |
| KR | 10 2009-0007734 A | 1/2009 |
| KR | 10 2011-0015836 A | 2/2011 |
| KR | 10 2011-0016033 A | 2/2011 |
| KR | 10 2011-0122051 A | 11/2011 |
| TW | 201141989 A1 | 12/2011 |
| TW | 201141990 A1 | 12/2011 |
| TW | 201211003 | 3/2012 |
| WO | WO 2011/024451 A1 | 3/2011 |
| WO | WO 2011/055934 A2 | 5/2011 |
| WO | WO 2012/023947 A1 | 2/2012 |
| WO | WO 2012/087007 A1 | 6/2012 |
| WO | WO 2012/108881 A1 | 8/2012 |
| WO | WO 2012/121561 A1 | 9/2012 |
| WO | WO 2012/141499 A1 | 10/2012 |
| WO | WO 2012/161382 A1 | 11/2012 |

OTHER PUBLICATIONS

Provisional double patenting rejection of claims; USPTO Office action mailed Apr. 22, 2016, in U.S. Appl. No. 14/042,981.

Lee, et al.; "Mixed host organic light-emitting devices with low driving voltage and long lifetime;" Applied Physics Letters, 86, pp. 103506 1-3; 2005; American Institute of Physics; USA.

International Search Report in PCT/KR2011/007182, dated May 30, 2012 (Yu, et al.).

Taiwanese Search Report in TW 100137505, dated Sep. 6, 2013, with English translation (Yu, et al.).

Search Report mailed Oct. 20, 2014 in corresponding European Patent Application No. 11868334.1.

USPTO Office Action mailed Jul. 15, 2015, in U.S. Appl. No. 13/668,550, wherein claims were provisionally rejected on the ground of nonstatutory double patenting over claims of the captioned application.

\* cited by examiner

MATERIAL FOR AN ORGANIC OPTOELECTRONIC DEVICE, ORGANIC LIGHT EMITTING DIODE INCLUDING THE SAME, AND DISPLAY DEVICE INCLUDING THE ORGANIC LIGHT EMITTING DIODE

CROSS-REFERENCE TO RELATED APPLICATIONS

Korean Patent Application No. 10-2011-0059835, filed on Jun. 20, 2011, in the Korean Intellectual Property Office, and entitled: "Material for Organic Optoelectronic Device, Organic Light Emitting Diode Including the Same and Display Including the Organic Light Emitting Diode," is incorporated by reference herein in its entirety.

This application is a continuation of pending International Application No. PCT/KR2011/007182, entitled "Material for Organic Optoelectronic Device, Organic Light Emitting Diode Including the Same and Display Including the Organic Light Emitting Diode," which was filed on Sep. 29, 2011, the entire contents of which are hereby incorporated by reference.

BACKGROUND

1. Field

Embodiments relate to a material for an organic optoelectronic device, an organic light emitting diode including the same, and a display device including the organic light emitting diode.

2. Description of the Related Art

An organic optoelectronic device is a device in which a charge exchange occurs between an electrode and an organic material by using a hole or an electron.

An organic optoelectronic device may be classified as follows in accordance with its driving principles. One type of organic optoelectronic device is an electronic device driven as follows: excitons are generated in an organic material layer by photons from an external light source; the excitons are separated into electrons and holes; and the electrons and holes are transferred to different electrodes as a current source (voltage source).

Another type of organic optoelectronic device is an electronic device driven as follows: a voltage or a current is applied to at least two electrodes to inject holes and/or electrons into an organic material semiconductor positioned at an interface of the electrodes; and the device is driven by the injected electrons and holes.

An organic optoelectronic device may include a photoelectric device, an organic light emitting diode (OLED), an organic solar cell, an organic photo-conductor drum, an organic transistor, an organic memory device, or the like, and may include a hole injecting or transporting material, an electron injecting or transporting material, or a light emitting material.

For example, the organic light emitting diode (OLED) has recently drawn attention due to an increase in demand for flat panel displays. Organic light emission may refer to transformation of electrical energy to photo-energy.

The organic light emitting diode may transform electrical energy into light by applying current to an organic light emitting material. It may have a structure in which a functional organic material layer is interposed between an anode and a cathode. The organic material layer may include a multi-layer including different materials, e.g., a hole injection layer (HIL), a hole transport layer (HTL), an emission layer, an electron transport layer (ETL), and/or an electron injection layer (EIL), in order to help improve efficiency and stability of an organic light emitting diode.

In such an organic light emitting diode, when a voltage is applied between an anode and a cathode, holes from the anode and electrons from the cathode may be injected to an organic material layer. Generated excitons generate light having certain wavelengths while shifting to a ground state.

SUMMARY

Embodiments are directed to a material for an organic optoelectronic device, an organic light emitting diode including the same, and a display device including the organic light emitting diode.

The embodiments may be realized by providing a material for an organic optoelectronic device, the material including at least one compound represented by the following Chemical Formula A-1; and at least one compound represented by the following Chemical Formula B-1:

[Chemical Formula A-1]

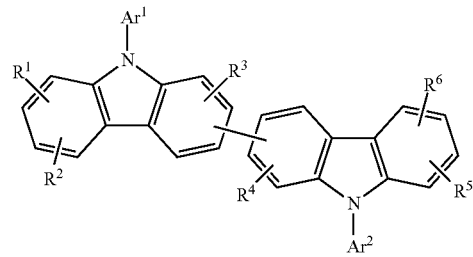

wherein, in Chemical Formula A-1 $Ar^1$ may be a substituted or unsubstituted pyridinyl group, $Ar^2$ may be hydrogen, deuterium, a C1 to C30 alkyl group, a C6 to C30 aryl group, or a substituted or unsubstituted pyrimidyl group, and $R^1$ to $R^6$ may each independently be hydrogen, deuterium, a C1 to C30 alkyl group, a C6 to C30 aryl group, or a combination thereof, and

[Chemical Formula B-1]

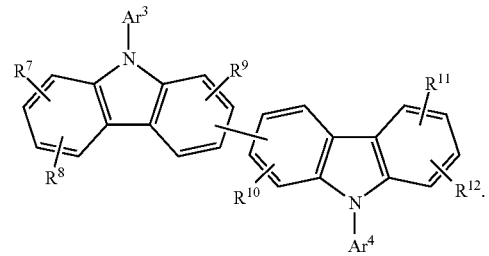

wherein, in Chemical Formula B-1 $Ar^3$ may be a substituted or unsubstituted heteroaryl group including at least two nitrogen atoms, $Ar^4$ may be hydrogen, deuterium, a C1 to C30 alkyl group, C6 to C30 aryl group, or a substituted or unsubstituted heteroaryl group that includes at least two nitrogen atoms, and $R^7$ to $R^{12}$ may each independently be hydrogen, deuterium, a C1 to C30 alkyl group, a C6 to C30 aryl group, or a combination thereof.

The at least one compound represented by Chemical Formula A-1 may be represented by the following Chemical Formula A-2, and the at least one compound represented by Chemical Formula B-1 may be represented by the following Chemical Formula B-2:

[Chemical Formula A-2]

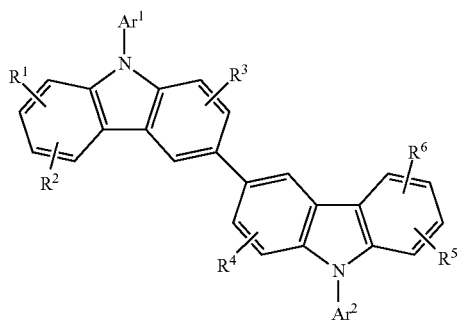

[Chemical Formula B-5]

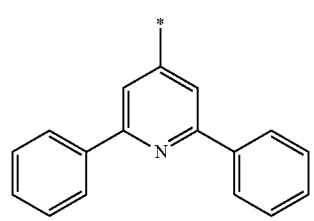

[Chemical Formula B-6]

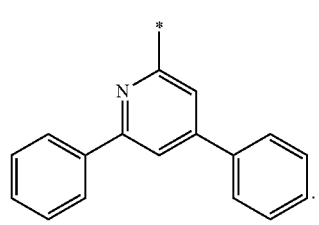

wherein, in Chemical Formula A-2 $Ar^1$ may be a substituted or unsubstituted pyridinyl group, $Ar^2$ may be hydrogen, deuterium, a C1 to C30 alkyl group, a C6 to C30 aryl group, or a substituted or unsubstituted pyrimidyl group, and $R^1$ to $R^6$ may each independently be hydrogen, deuterium, a C1 to C30 alkyl group, a C6 to C30 aryl group, or a combination thereof, and wherein in Chemical Formulae B-3, B-4, B-5, and B-6, $R^1$ to $R^4$ may each independently be a single bond, hydrogen, deuterium, a C1 to C30 alkyl group, a C6 to C30 aryl group, or a combination thereof, in Chemical Formulae B-3 and B-4, one of $R^1$ to $R^4$ may be a single bond linked to a nitrogen atom of Chemical Formula B-1, and in Chemical Formulae B-5 and B-6, one of $R^1$ to $R^3$ may be a single bond linked to a nitrogen atom of Chemical Formula B-1.

$Ar^2$ and $Ar^4$ may each independently be a substituted phenyl group.

$Ar^1$ of Chemical Formula A-1 may be represented by one of the following Chemical Formula A-3 or Chemical Formula A-4, in which * is a bonding location to a nitrogen atom of Chemical Formula A-1:

[Chemical Formula B-2]

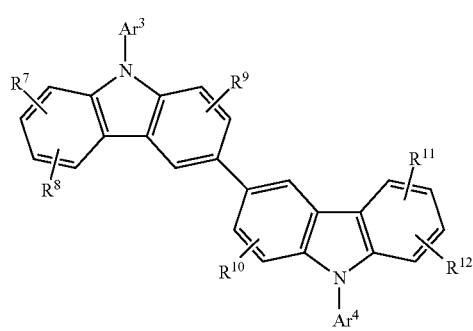

[Chemical Formula A-3]

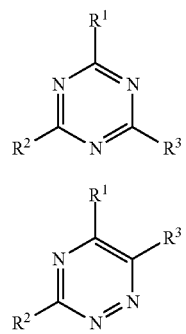

[Chemical Formula A-4]

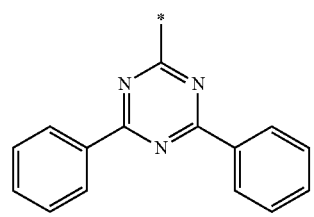

wherein, in Chemical Formula B-2 $Ar^3$ may be a substituted or unsubstituted heteroaryl group including at least two nitrogen atoms, $Ar^4$ may be hydrogen, deuterium, a C1 to C30 alkyl group, C6 to C30 aryl group, or a substituted or unsubstituted heteroaryl group that includes at least two nitrogen atoms, and $R^7$ to $R^{12}$ may each independently be hydrogen, deuterium, a C1 to C30 alkyl group, a C6 to C30 aryl group, or a combination thereof.

$Ar^3$ of Chemical Formula B-1 may be represented by one of the following Chemical Formulae B-3, B-4, B-5, or B-6:

$Ar^3$ of Chemical Formula B-1 may be represented by one of the following Chemical Formulae B-7, B-8, or B-9, in which * is a bonding location to a nitrogen atom of Chemical Formula B-1:

[Chemical Formula B-3]

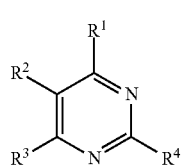

[Chemical Formula B-4]

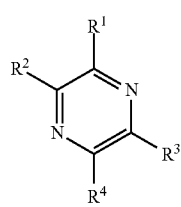

[Chemical Formula B-7]

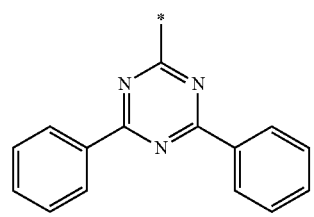

[Chemical Formula B-8]

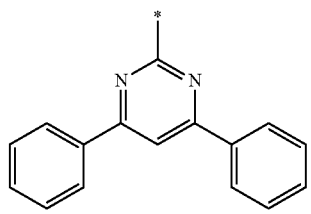

[Chemical Formula B-9]

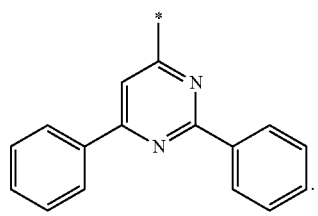

Ar³ of Chemical Formula B-1 may be a substituted or unsubstituted triazinyl group.

Ar³ of Chemical Formula B-1 may be a substituted or unsubstituted pyrimidinyl group.

The compound represented by Chemical Formula A-1 may be represented by one of the following Chemical Formulae A-101 to A-121:

[Chemical Formula A-101]

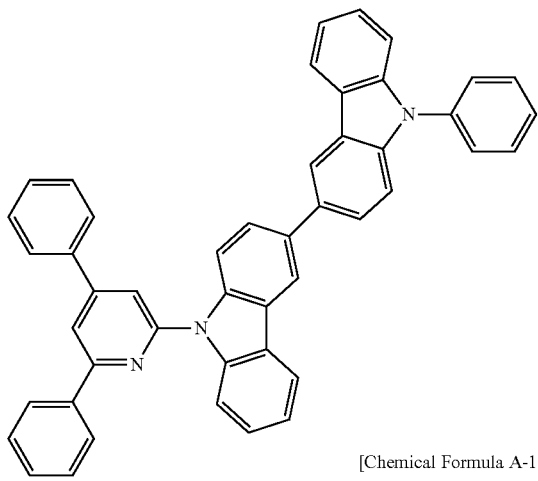

[Chemical Formula A-102]

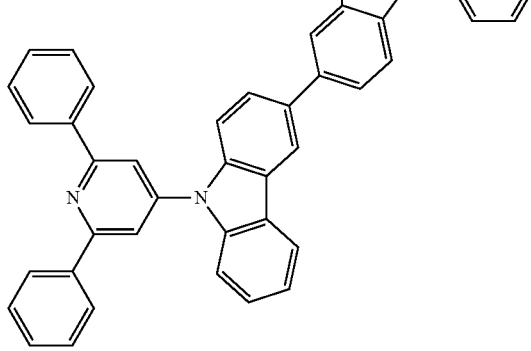

[Chemical Formula A-103]

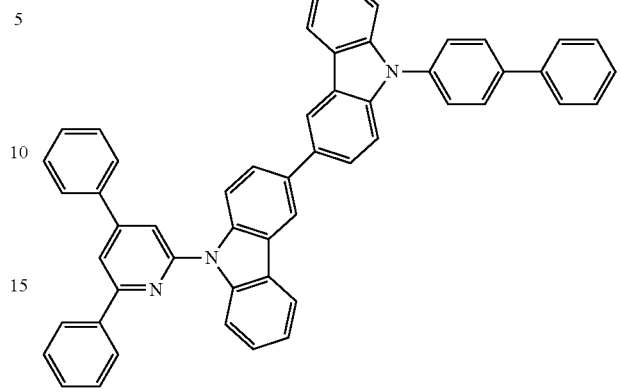

[Chemical Formula A-104]

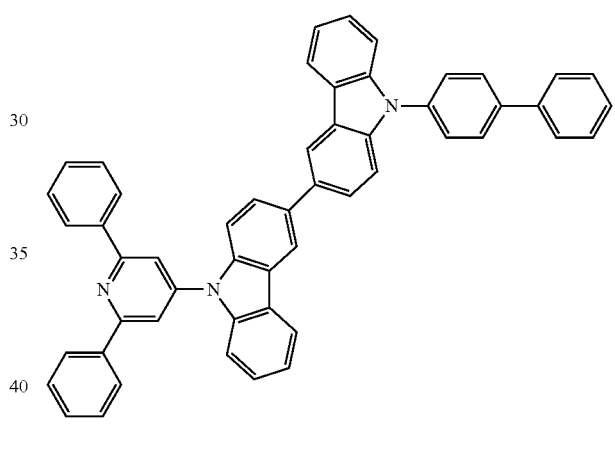

[Chemical Formula A-105]

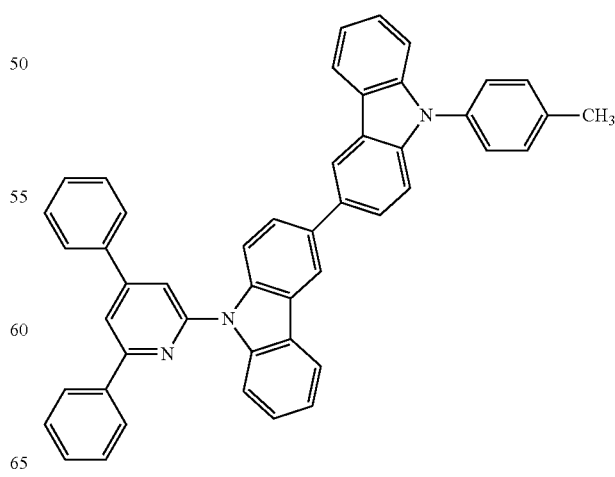

[Chemical Formula A-106]
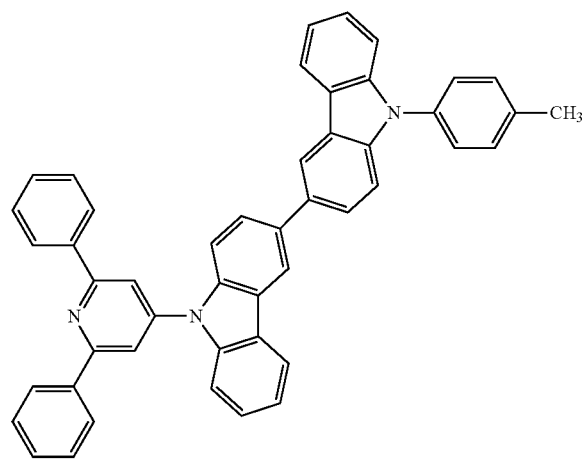
[Chemical Formula A-107]
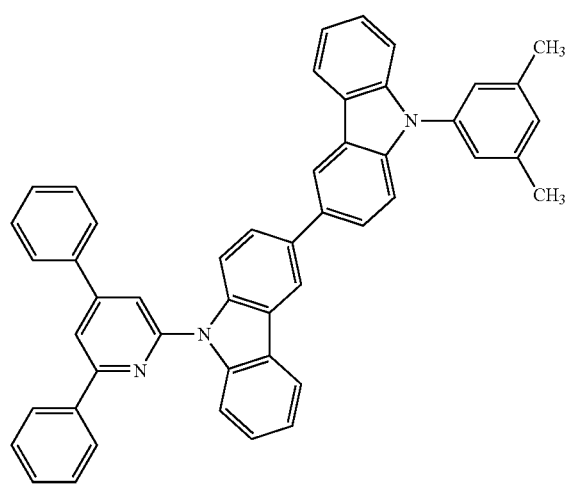
[Chemical Formula A-108]
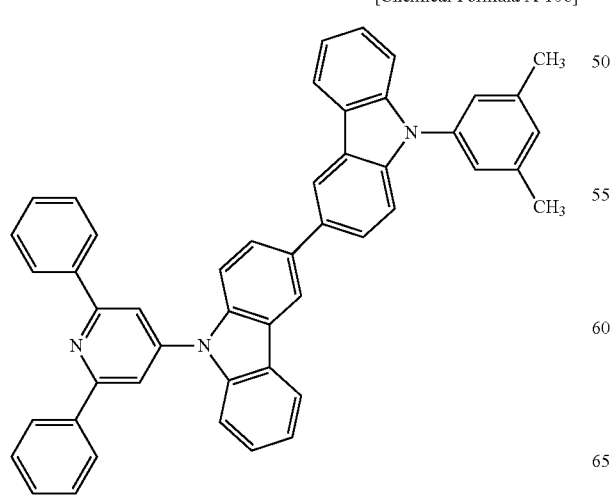
[Chemical Formula A-109]
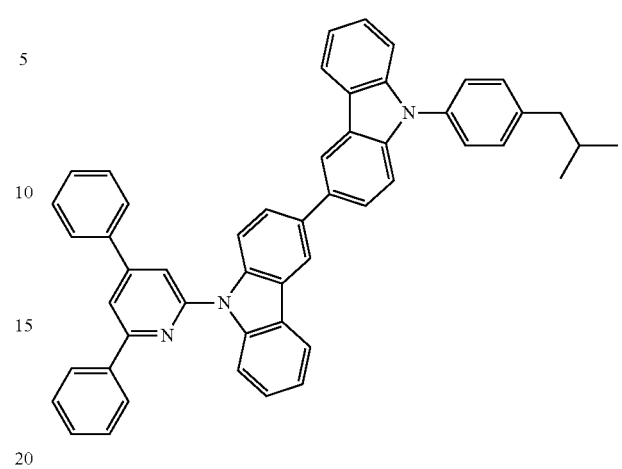
[Chemical Formula A-110]
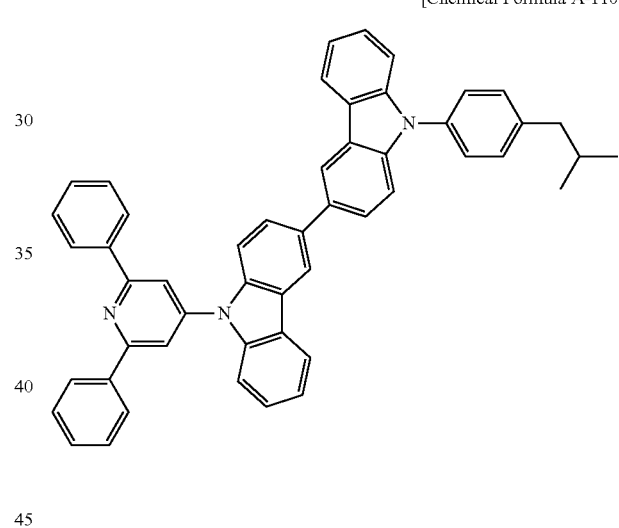
[Chemical Formula A-111]
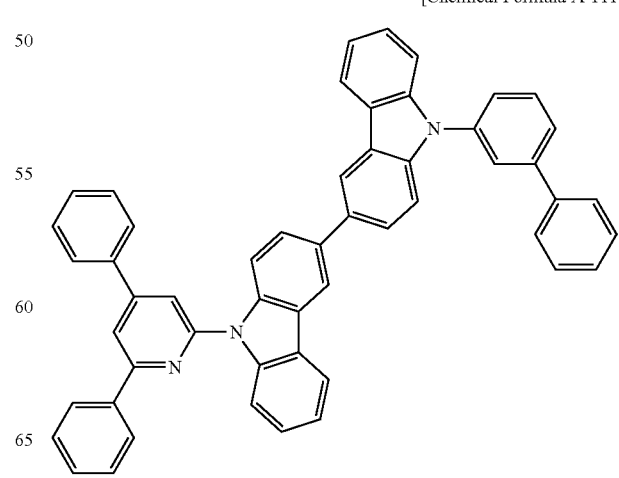

[Chemical Formula A-112]
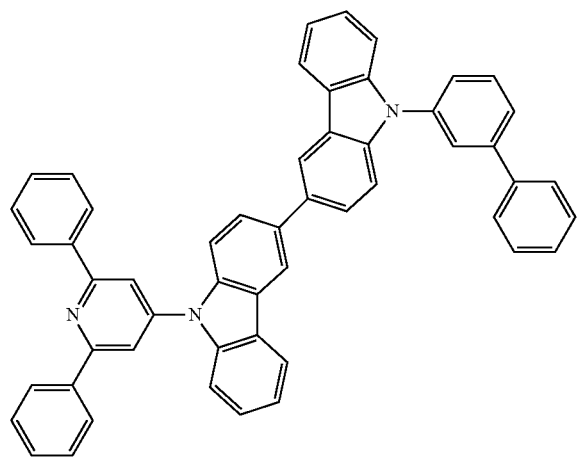
[Chemical Formula A-113]
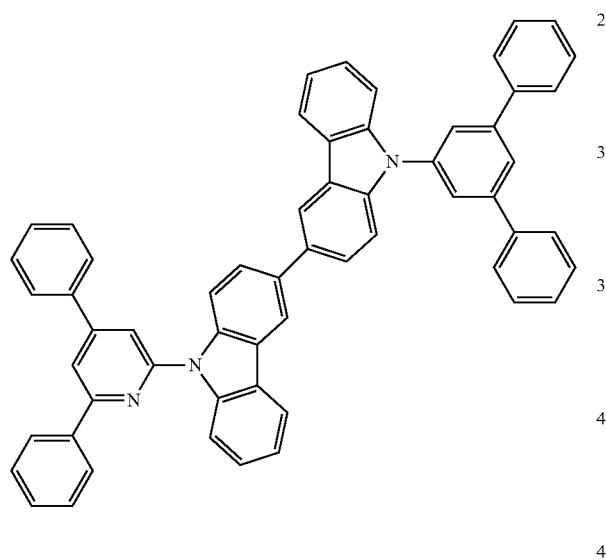
[Chemical Formula A-114]
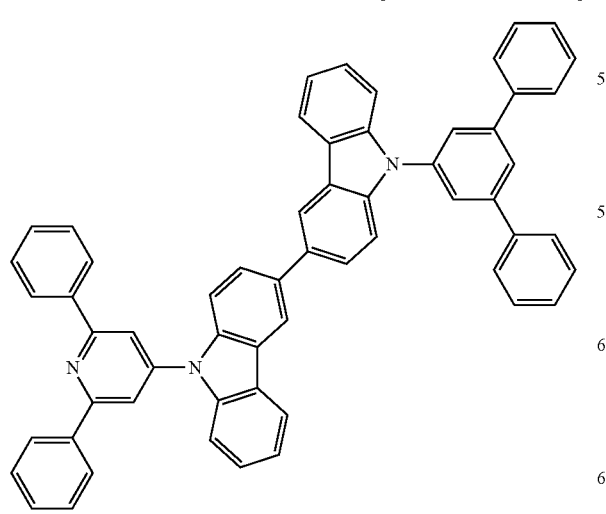
[Chemical Formula A-115]
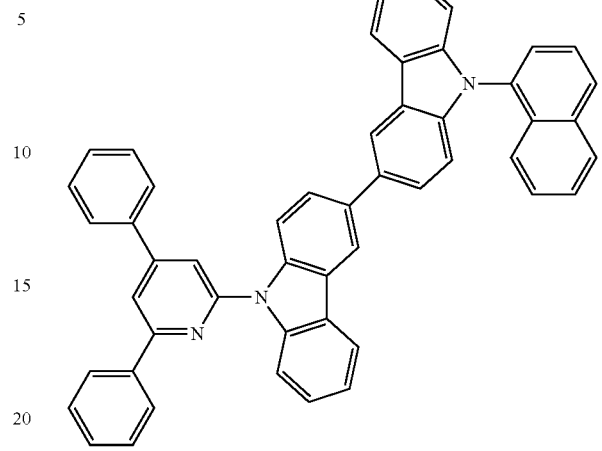
[Chemical Formula A-116]
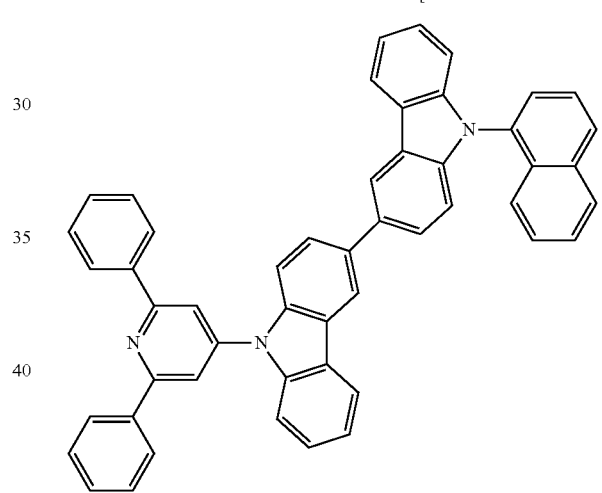
[Chemical Formula A-117]
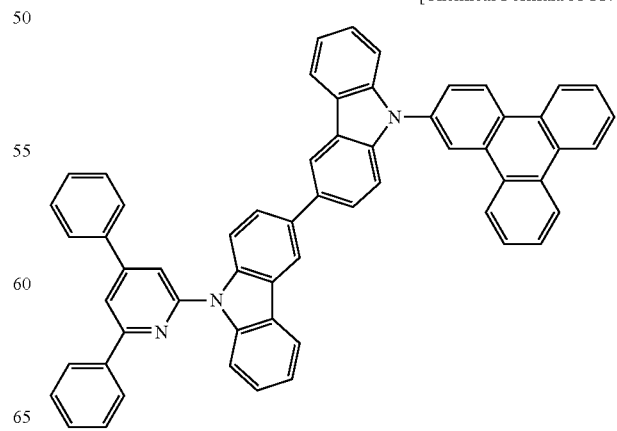

[Chemical Formula A-118]
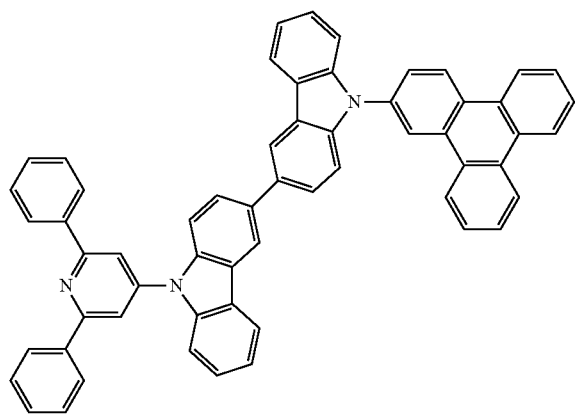
[Chemical Formula A-119]
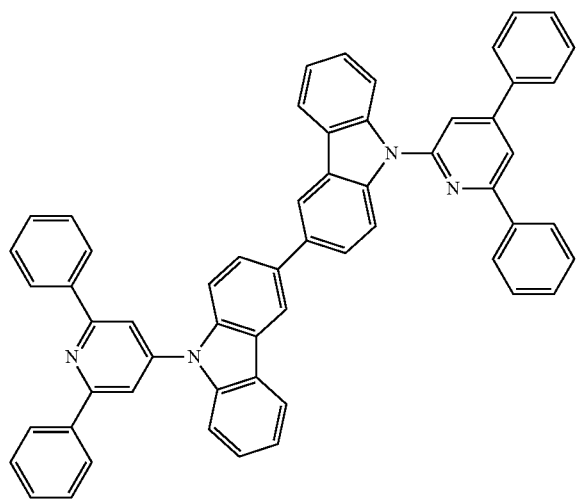
[Chemical Formula A-120]
[Chemical Formula A-121]
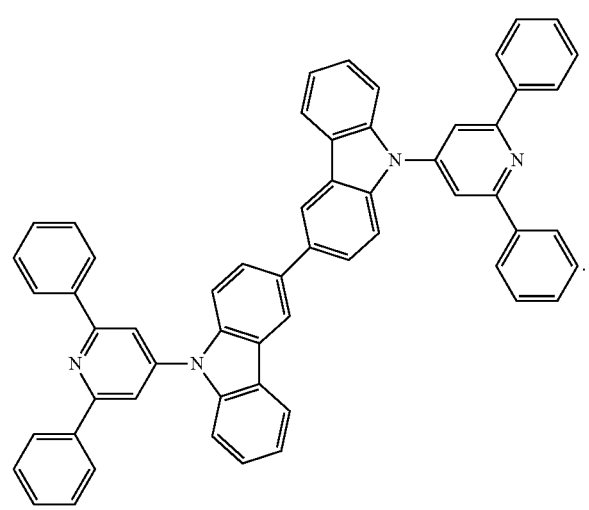
The compound represented by Chemical Formula B-1 may be represented by one of the following Chemical Formulae B-101 to B-111:
[Chemical Formula B-101]
[Chemical Formula B-102]
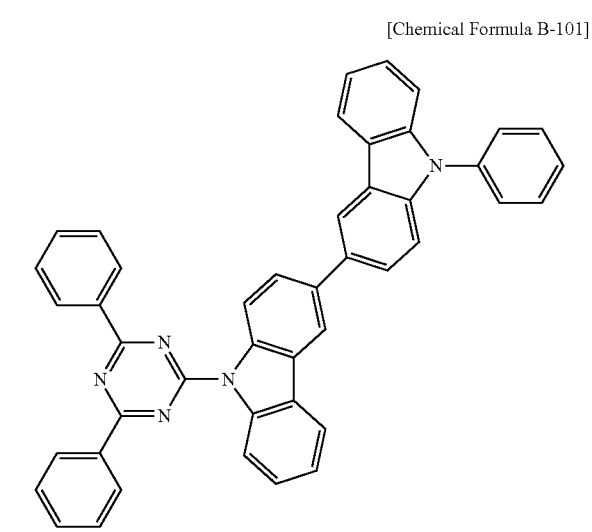

[Chemical Formula B-103]
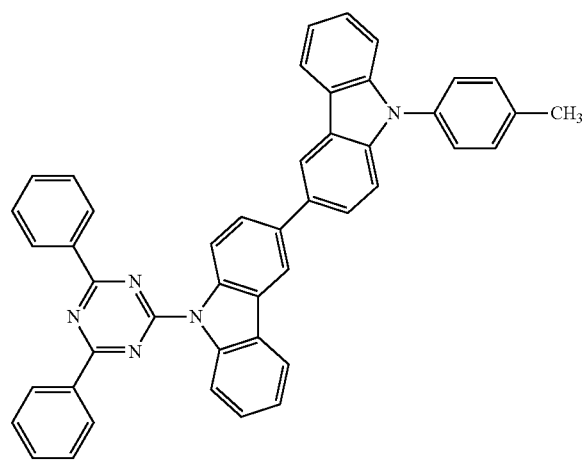
[Chemical Formula B-104]
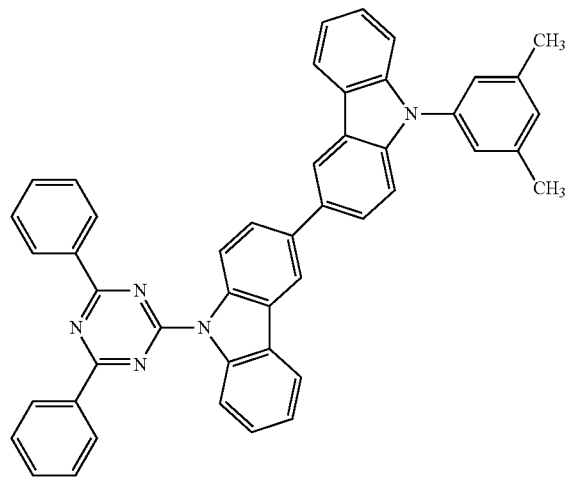
[Chemical Formula B-105]
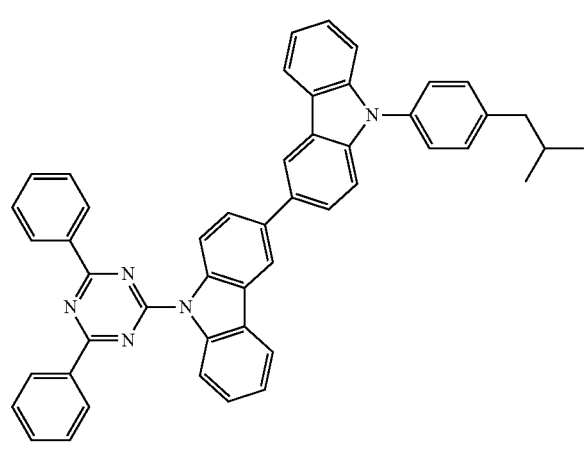
[Chemical Formula B-106]
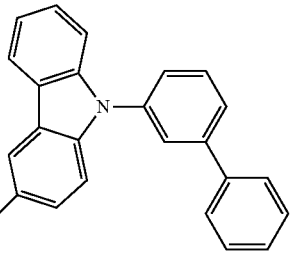
[Chemical Formula B-107]
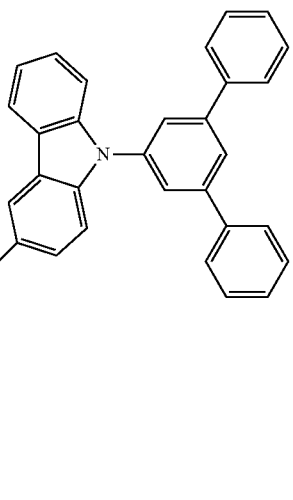
[Chemical Formula B-108]
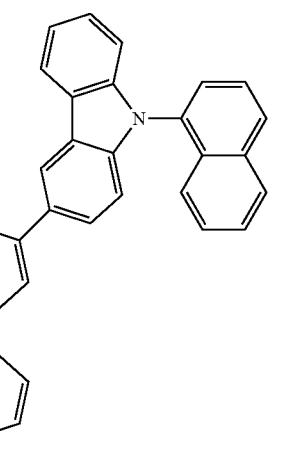

[Chemical Formula B-109]
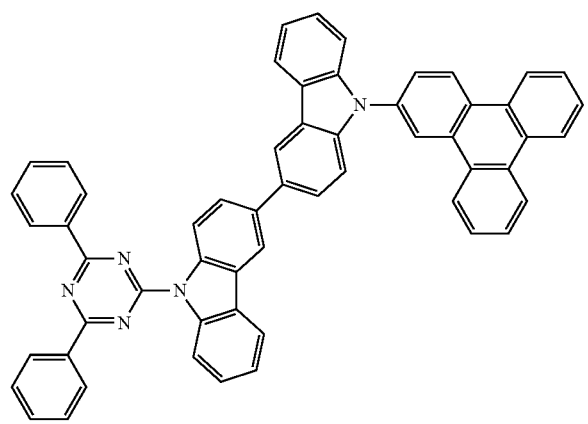
[Chemical Formula B-110]
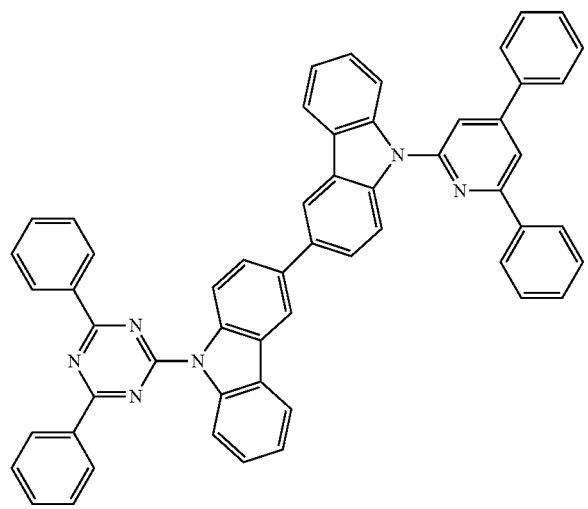
[Chemical Formula B-111]
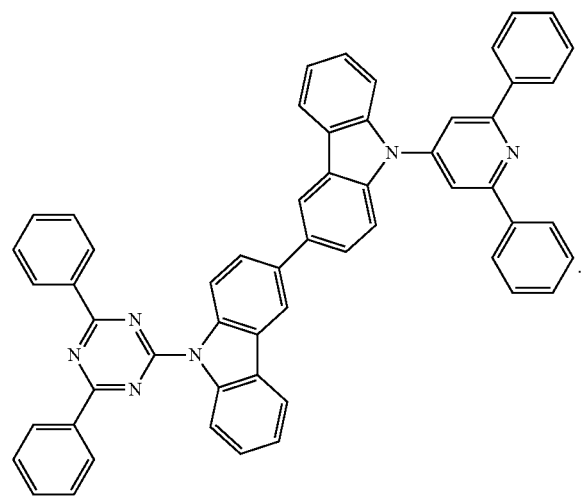
The compound represented by Chemical Formula B-1 may be represented by one of the following Chemical Formulae B-201 to B-221:
[Chemical Formula B-201]
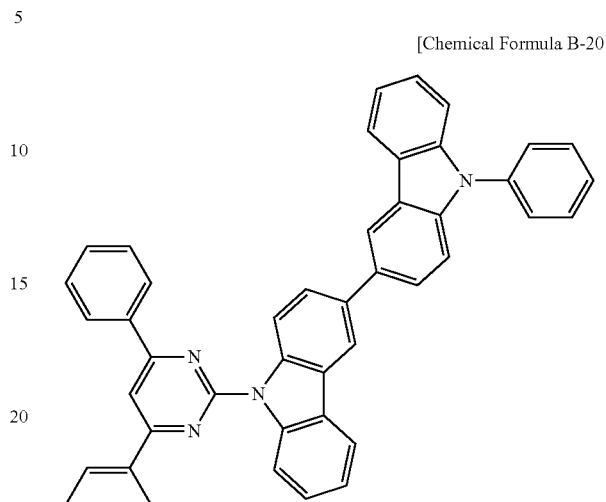
[Chemical Formula B-202]
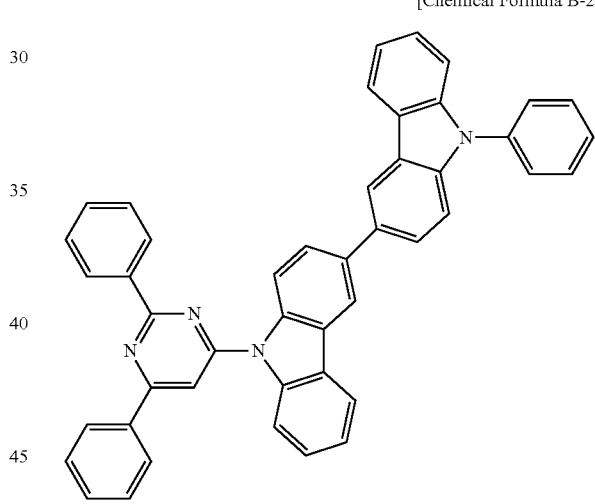
[Chemical Formula B-203]
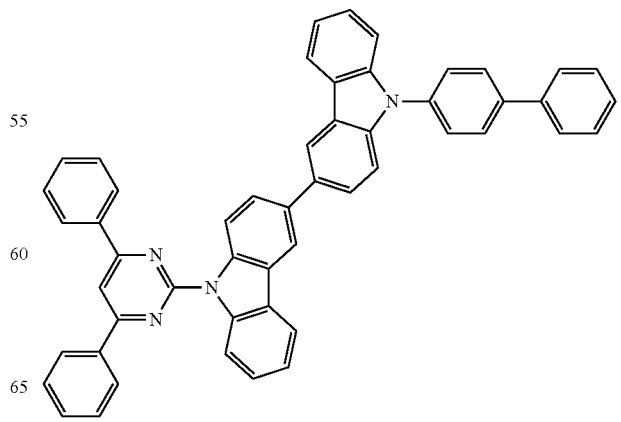

-continued
[Chemical Formula B-204]
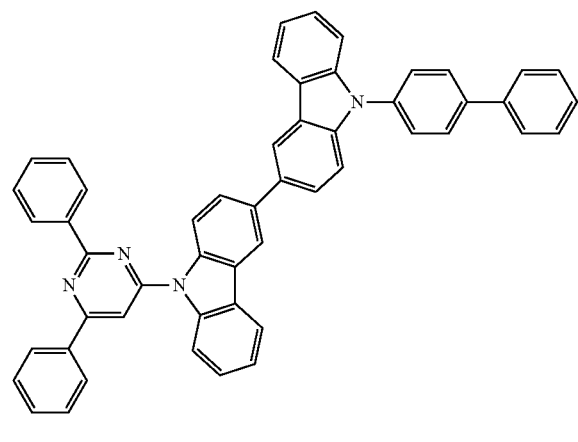
[Chemical Formula B-205]
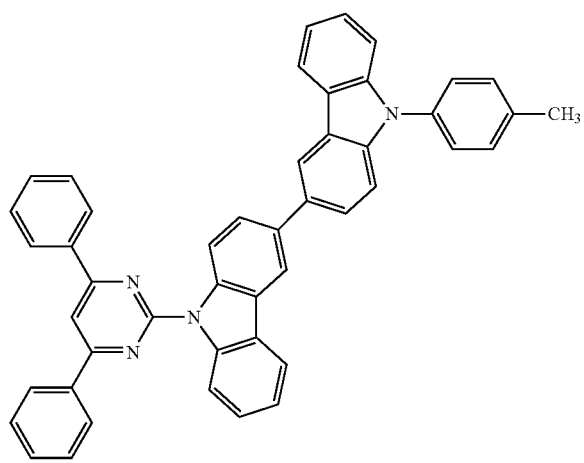
[Chemical Formula B-206]
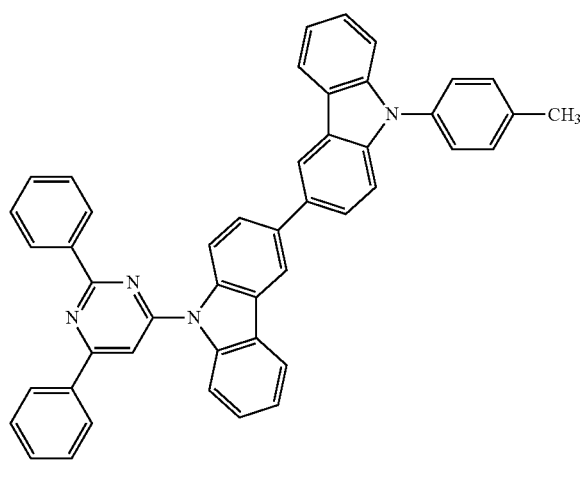
-continued
[Chemical Formula B-207]
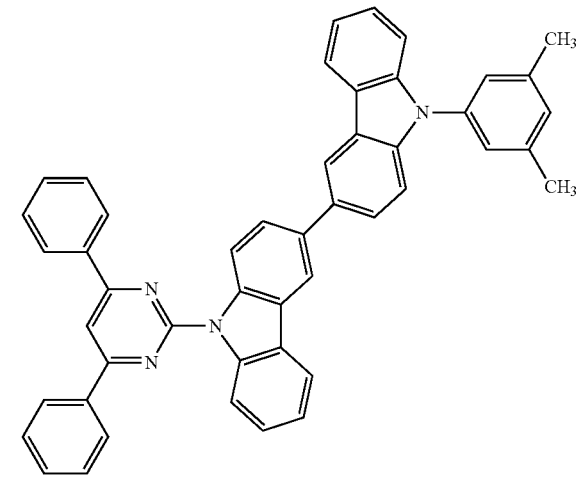
[Chemical Formula B-208]
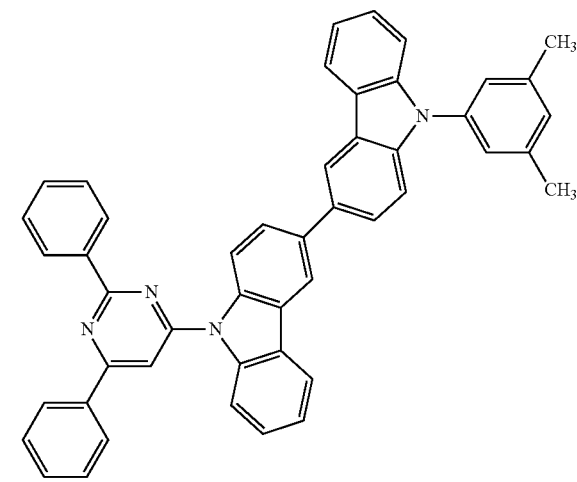
[Chemical Formula B-209]
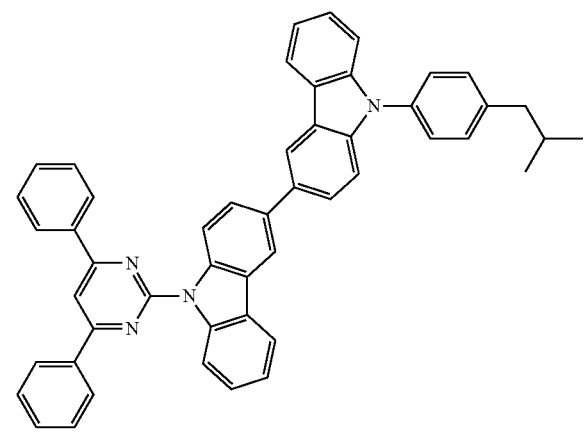

[Chemical Formula B-210]
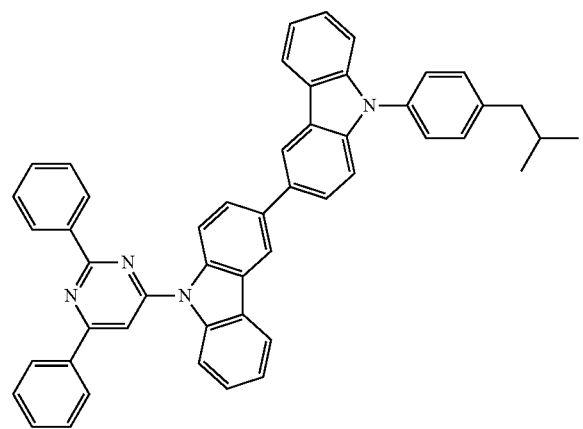
[Chemical Formula B-213]
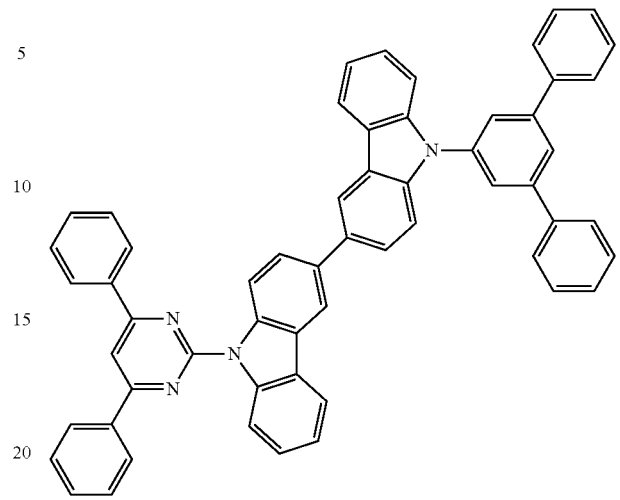
[Chemical Formula B-211]
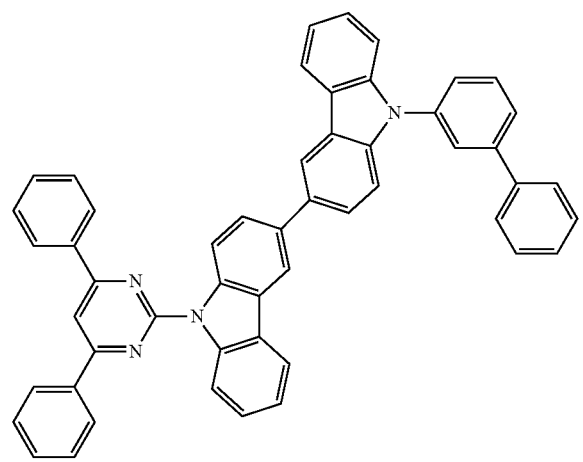
[Chemical Formula B-214]
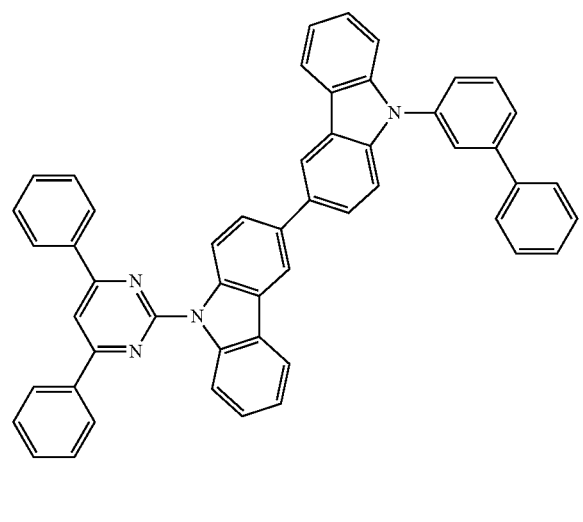
[Chemical Formula B-212]
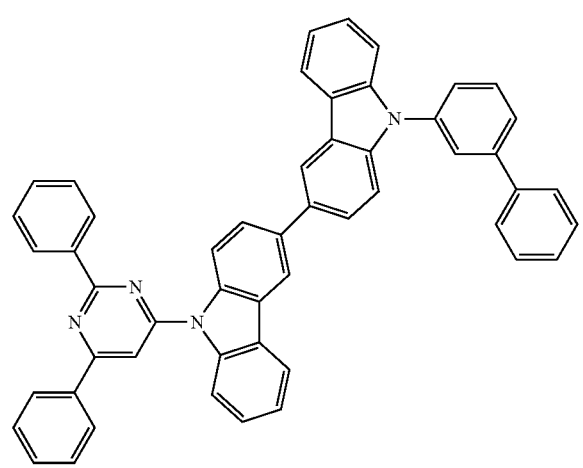
[Chemical Formula B-215]
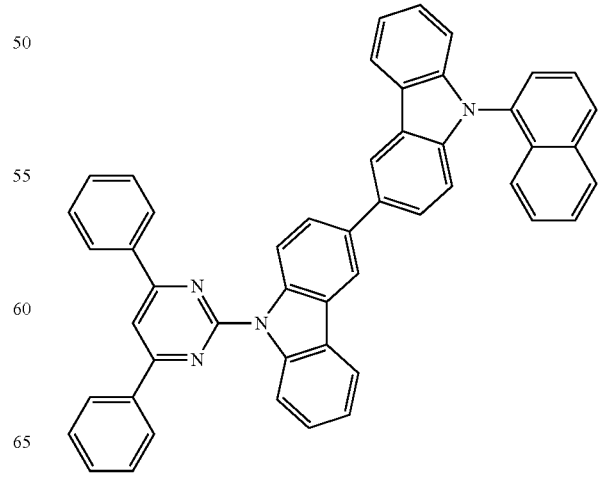

[Chemical Formula B-216]
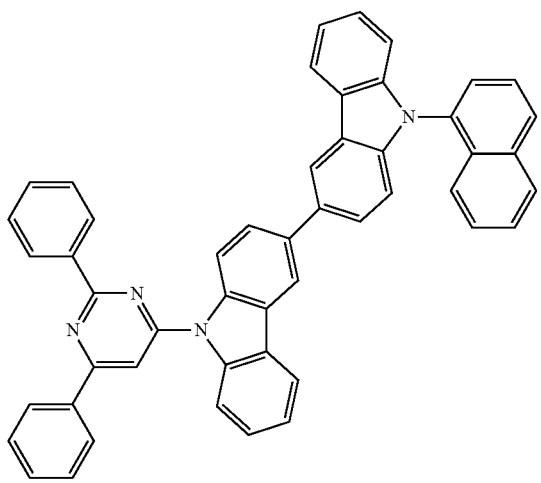
[Chemical Formula B-217]
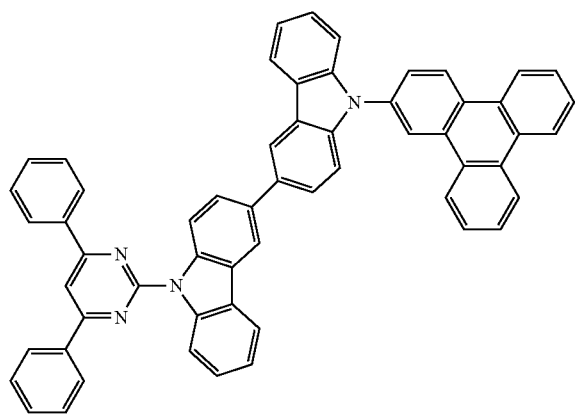
[Chemical Formula B-218]
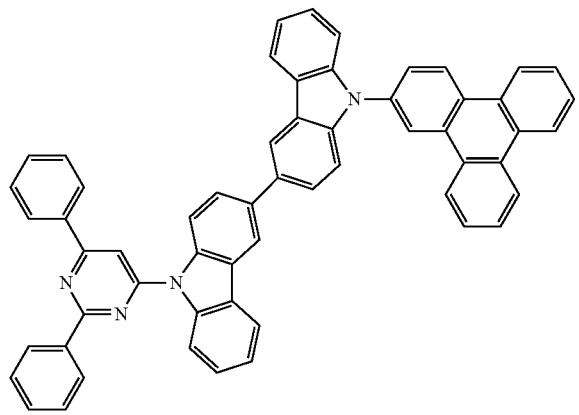
[Chemical Formula B-219]
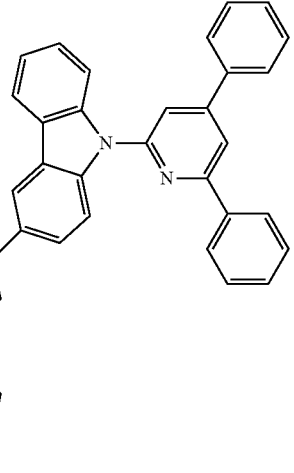
[Chemical Formula B-220]
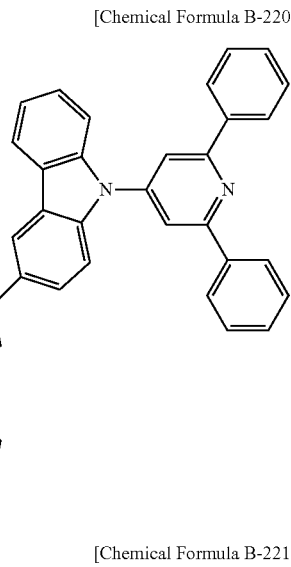
[Chemical Formula B-221]
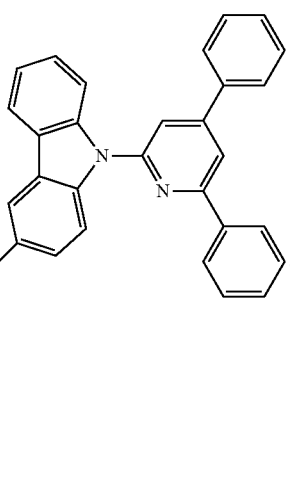
The compound represented by Chemical Formula B-1 may have a LUMO energy level that is lower by 0.2 eV or more than a LUMO energy level of the compound represented by Chemical Formula A-1.

The organic optoelectronic device may be selected from the group of an organic photoelectric device, an organic light emitting diode, an organic solar cell, an organic transistor, an organic photo-conductor drum, and an organic memory device.

The embodiments may also be realized by providing an organic light emitting diode including an anode; a cathode; and at least one organic thin layer between the anode and the cathode, wherein the at least one organic thin layer includes the material for an organic optoelectronic device according to an embodiment.

The at least one organic thin layer may be an emission layer, a hole transport layer (HTL), a hole injection layer (HIL), an electron transport layer (ETL), an electron injection layer (EIL), a hole blocking layer, or a combination thereof.

The at least one organic thin layer may include the hole transport layer (HTL) or the hole injection layer (HIL), and the material for an organic optoelectronic device may be included in the hole transport layer (HTL) or the hole injection layer (HIL).

The at least one organic thin layer may include the electron transport layer (ETL) or the electron injection layer (EIL), and the material for an organic optoelectronic device is included in the electron transport layer (ETL) or the electron injection layer (EIL).

The at least one organic thin layer may include the emission layer, and the material for an organic optoelectronic device may be included in the emission layer.

The material for an organic optoelectronic device may be a phosphorescent or fluorescent host material in the emission layer.

The embodiments may also be realized by providing a display device comprising the organic light emitting diode according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
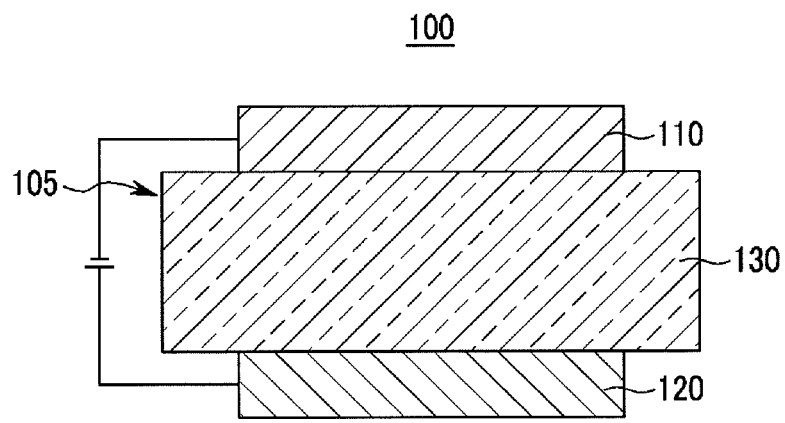
FIGS. 1 to 5 illustrate cross-sectional views showing organic light emitting diodes including compounds according to various embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

As used herein, when specific definition is not otherwise provided, the term "substituted" may refer to one substituted with deuterium, a halogen, a hydroxy group, an amino group, a substituted or unsubstituted C1 to C20 amine group, a nitro group, a substituted or unsubstituted C3 to C40 silyl group, a C1 to C30 alkyl group, a C1 to C10 alkylsilyl group, a C3 to C30 cyclo alkyl group, a C6 to C30 aryl group, a C1 to C20 alkoxy group, a fluoro group, a C1 to C10 trifluoro alkyl group such as a trifluoromethyl group, or a cyano group, instead of hydrogen.

Two adjacent substituents of the substituted hydroxy group, amino group, a substituted or unsubstituted C1 to C20 amine group, nitro group, a substituted or unsubstituted C3 to C40 silyl group, a C1 to C30 alkyl group, a C1 to C10 an alkylsilyl group, C3 to C30 cycloalkyl group, a C6 to C30 aryl group, C1 to C20 alkoxy group, a C1 to C10 trifluoroalkyl group such as a trifluoromethyl group, or a cyano group may be linked to each other to provide a fused ring.

As used herein, when specific definition is not otherwise provided, the term "hetero" may refer to one including 1 to 3 of N, O, S, or P, and remaining carbons in one ring.

As used herein, when a definition is not otherwise provided, the term "combination thereof" may refer to at least two substituents bound to each other by a linker, or at least two substituents condensed to each other.

As used herein, when a definition is not otherwise provided, the term "alkyl group" may refer to an aliphatic hydrocarbon group. The alkyl may be a saturated alkyl group that does not include any double bond or triple bond. Alternatively, the alkyl may be an unsaturated alkyl group that includes at least one double bond or triple bond.

The term "alkenylene group" may refer to a group in which at least two carbon atoms are bound in at least one carbon-carbon double bond, and the term "alkynylene group" may refer to a group in which at least two carbon atoms are bound in at least one carbon-carbon triple bond. Regardless of being saturated or unsaturated, the alkyl may be branched, linear, or cyclic.

The alkyl group may be a C1 to C20 alkyl group. For example, the alkyl group may be a C1 to C10 alkyl group or a C1 to C6 alkyl group.

For example, a C1 to C4 alkyl group may have 1 to 4 carbon atoms and may be selected from the group consisting of methyl, ethyl, propyl, iso-propyl, n-butyl, iso-butyl, sec-butyl, and t-butyl.

Examples of the alkyl group may be a methyl group, an ethyl group, a propyl group, an isopropyl group, a butyl group, an isobutyl group, a t-butyl group, a pentyl group, a hexyl group, an ethenyl group, a propenyl group, a butenyl group, a cyclopropyl group, a cyclobutyl group, a cyclopentyl group, a cyclohexyl group, and the like.

The term "aromatic group" may refer to a cyclic functional group where all elements have conjugated p-orbital. Examples of the aromatic group include an aryl group and a heteroaryl group.

The term "aryl group" may refer to an aryl group including a carbocyclic aryl (e.g., phenyl) having at least one ring having a covalent pi electron system.

The term "heteroaryl group" may refer to an aryl group where 1 to 3 heteroatoms selected from N, O, S, and P, and remaining carbon. When the heteroaryl group is a fused ring, each ring may include 1 to 3 heteroatoms.

As used herein, hole properties refer to properties in which holes generated at an anode are easily injected into an emission layer and moved therein due to conduction properties according to HOMO levels.

As used herein, electron properties refer to properties in which electrons generated at a cathode are easily injected into an emission layer and moved therein due to conduction properties according to LUMO levels.

According to an embodiment, a material for an organic optoelectronic device may include two or more different compounds having bicarbazolyl groups as cores thereof.

Accordingly, an organic optoelectronic device may exhibit characteristics of both of the two compounds.

For example, an emission layer for an organic optoelectronic device may deliver both holes and electrons and thus, may use an amphiphilic material having excellent hole properties and electron properties. However, an organic low molecular compound with amphiphilic properties may be hard to develop. For example, an organic low molecular compound may tend to only have either electron properties or hole properties.

Accordingly, an embodiment provides a material for an organic optoelectronic device in which two or more compounds are mixed, to satisfy or to provide amphiphilic properties. For example, the material for an organic optoelectronic device in which two or more compounds are mixed according to an embodiment may exhibit excellent hole properties and excellent electron properties.

According to an embodiment, an organic material for an organic optoelectronic device may include at least one compound represented by the following Chemical Formula A-1; and at least one compound represented by the following Chemical Formula B-1.

[Chemical Formula A-1]

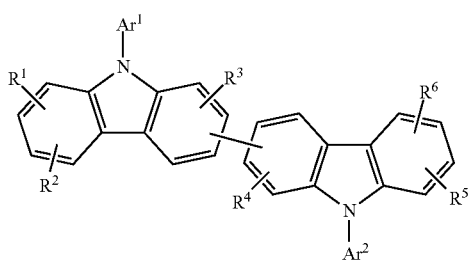

In Chemical Formula A-1, $Ar^1$ may be a substituted or unsubstituted pyridinyl group, $Ar^2$ may be hydrogen, deuterium, a C1 to C30 alkyl group, a C6 to C30 aryl group, or a substituted or unsubstituted pyrimidyl group, and $R^1$ to $R^6$ may each independently be hydrogen, deuterium, a C1 to C30 alkyl group, a C6 to C30 aryl group, or a combination thereof.

[Chemical Formula B-1]

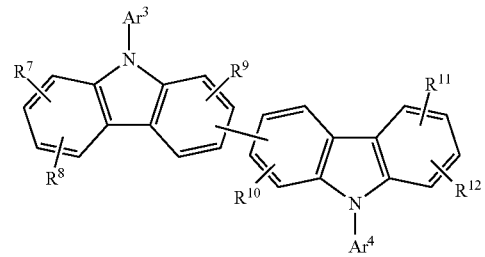

In Chemical Formula B-1, $Ar^3$ may be a substituted or unsubstituted heteroaryl group (including at least two nitrogen atoms), $Ar^4$ may be hydrogen, deuterium, a C1 to C30 alkyl group, C6 to C30 aryl group, or a substituted or unsubstituted heteroaryl group (including at least two nitrogen atoms), and $R^7$ to $R^{12}$ may each independently be hydrogen, deuterium, a C1 to C30 alkyl group, a C6 to C30 aryl group, or a combination thereof.

The compound represented by the above Chemical Formula A-1 may be a bicarbazole-based compound substituted with a pyridinyl group and having relatively excellent properties.

The compound represented by the above Chemical Formula B-1 may have a LUMO energy level that is lower by 0.2 eV or more than a LUMO energy level of the compound represented by the above Chemical Formula A-1. For example, the compound represented by the above Chemical Formula B-1 may have a LUMO energy level that is lower by 0.3 eV or more than a LUMO energy level of the compound represented by the above Chemical Formula A-1.

The compound including a pyridinyl group (represented by the above Chemical Formula A-1) may have relatively higher LUMO energy level than that of an electron transport layer (ETL) material and may help improve a driving voltage of a device. Accordingly, the compound may be mixed with a material with a low LUMO energy level. Herein, the material may have the same LUMO energy level as or a little higher LUMO energy level than an electron transport layer (ETL) material. In an implementation, the material may be a compound including a pyrimidinyl group or a triazinyl group represented by the above Chemical Formula B-1.

The compound may have a core moiety and another substituent substituted for a substituent on the core moiety and may have various energy band gaps.

In addition, when a compound with an appropriate energy level (depending on a substituent) is used to fabricate an organic optoelectronic device, the organic optoelectronic device may have excellent efficiency and driving voltage, as well as excellent electrochemical and thermal stability and thus, excellent life-span.

The two different compounds may be mixed to prepare a material, e.g., an organic material, for an organic optoelectronic device, which has excellent luminance; hole or electron properties; film stability; and thermal stability; and/or high triplet excitation energy (T1).

The at least one compound represented by Chemical Formula A-1 may be represented by the following Chemical Formula A-2, and the at least one compound represented by Chemical Formula B-1 may be represented by the following Chemical Formula B-2.

[Chemical Formula A-2]

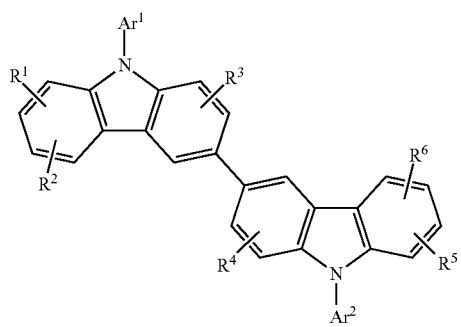

[Chemical Formula B-4]

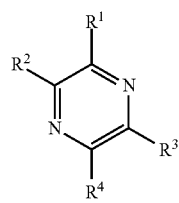

In Chemical Formula A-2, Ar¹ may be a substituted or unsubstituted pyridinyl group, Ar² may be hydrogen, deuterium, a C1 to C30 alkyl group, a C6 to C30 aryl group, or a substituted or unsubstituted pyrimidyl group, and R¹ to R⁶ may each independently be hydrogen, deuterium, a C1 to C30 alkyl group, a C6 to C30 aryl group, or a combination thereof.

[Chemical Formula B-5]

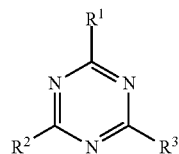

[Chemical Formula B-6]

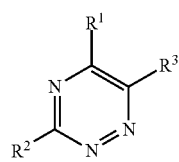

[Chemical Formula B-2]

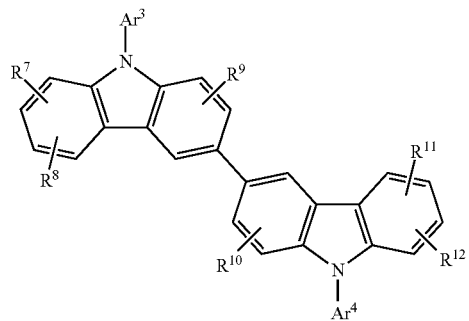

In Chemical Formulae B-3, B-4, B-5, and B-6, R¹ to R⁴ may each independently be a single bond, hydrogen, deuterium, a C1 to C30 alkyl group, a C6 to C30 aryl group, or a combination thereof. In an implementation, in Chemical Formulae B-3 and B-4, one of R¹ to R⁴ may be a single bond linked to nitrogen of Chemical Formula B-1, and/or in Chemical Formulae B-5 and B-6, and one of R¹ to R³ may be a single bond linked to nitrogen of Chemical Formula B-1.

When the Ar³ is one of the above Chemical Formulae B-3, B-4, B-5, or B-6, a compound represented by Chemical Formula B-1 may be mixed with a compound represented by Chemical Formula A-1, thereby preparing an organic material for an organic optoelectronic device having an appropriate energy level.

In Chemical Formula B-2, Ar³ may be a substituted or unsubstituted heteroaryl group including at least two nitrogen, Ar⁴ may be hydrogen, deuterium, a C1 to C30 alkyl group, C6 to C30 aryl group, or a substituted or unsubstituted heteroaryl group including at least two nitrogen, and R⁷ to R¹² may each independently be hydrogen, deuterium, a C1 to C30 alkyl group, a C6 to C30 aryl group, or a combination thereof.

In an implementation, Ar² and Ar⁴ may each independently be a substituted phenyl group. In an implementation, a compound may be prepared to have a bulky structure and thus, may have lower crystallinity. The compound having low crystallinity may help extend a life-span of a device.

As may be seen in the above Chemical Formulae A-2 and B-2, when a bicarbazolyl group is bonded at the 3-position of each carbazolyl group, compounds represented by the above Chemical Formula A-2 and Chemical Formula B-2 may be easily synthesized.

In an implementation, Ar¹ may be represented by one of the following Chemical Formula A-3 or Chemical Formula A-4, but is not limited thereto. In Chemical Formula A-3 and Chemical Formula A-4, * may be a connection point to a nitrogen atom in Chemical Formula A-1.

Ar³ of Chemical Formula B-2 may be represented by one of the following Chemical Formulae B-3, B-4, B-5, or B-6.

[Chemical Formula A-3]

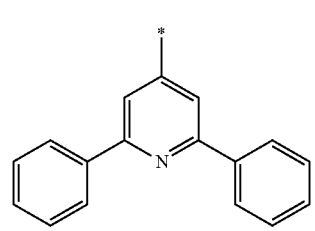

[Chemical Formula B-3]

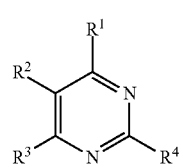

[Chemical Formula A-4]

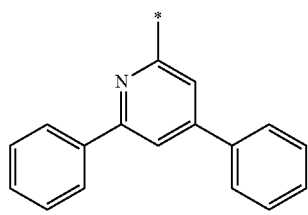

In an implementation, Ar³ of Chemical Formula B-1 may be a substituted or unsubstituted triazinyl group. In an implementation, Ar³ of the above Chemical Formula B-1 may be a substituted or unsubstituted pyrimidinyl group. In an implementation, Ar³ of the above Chemical Formula B-1 may be the following Chemical Formulae B-7, B-8, or B-9, but is not limited thereto.

[Chemical Formula B-7]

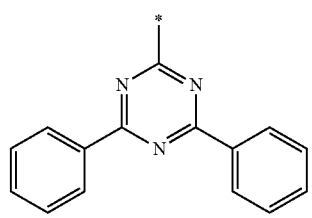

[Chemical Formula B-8]

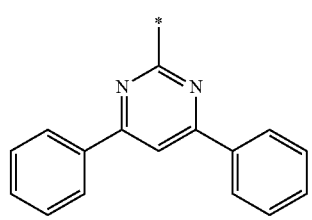

[Chemical Formula B-9]

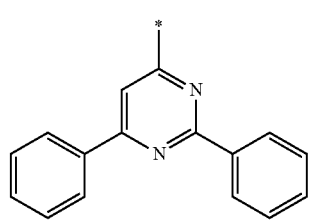

The compounds represented by the above Chemical Formulae A-1 and B-1 may be mixed at a weight ratio of 1:9 to 9:1, e.g., 2:8 to 8:2, 3:7 to 7:3, or 1:1. The mixing ratio of the compounds may be selectively controlled depending on desired properties of an organic optoelectronic device.

In an implementation, the compound represented by the above Chemical Formula A-1 may be represented by one of the following Chemical Formulae A-101 to A-121, but is not limited thereto.

[Chemical Formula A-101]

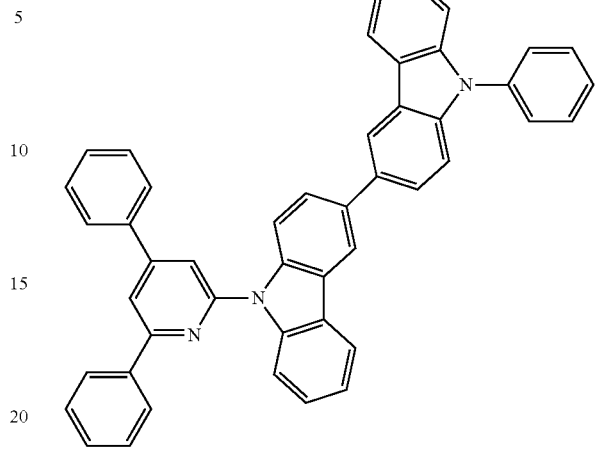

[Chemical Formula A-102]

[Chemical Formula A-103]

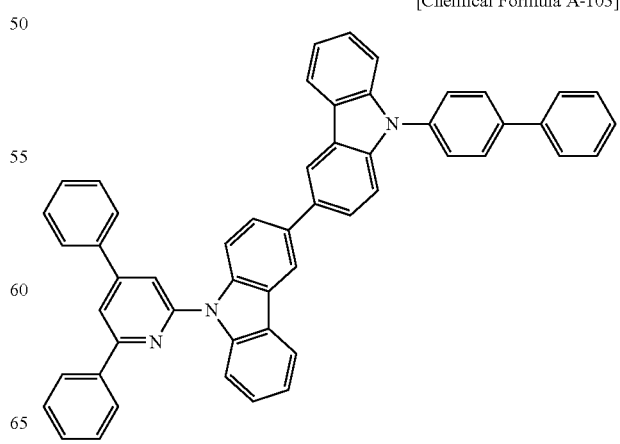

-continued
[Chemical Formula A-104]
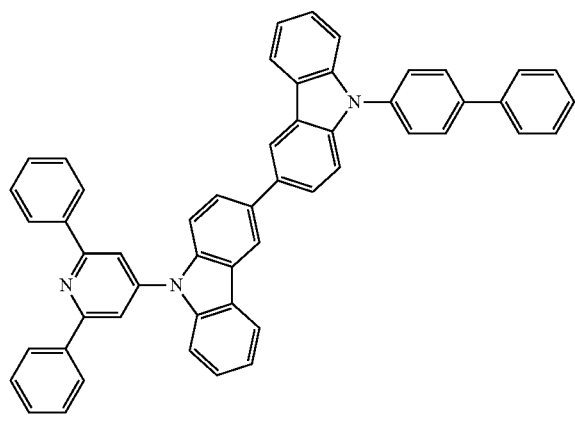
[Chemical Formula A-105]
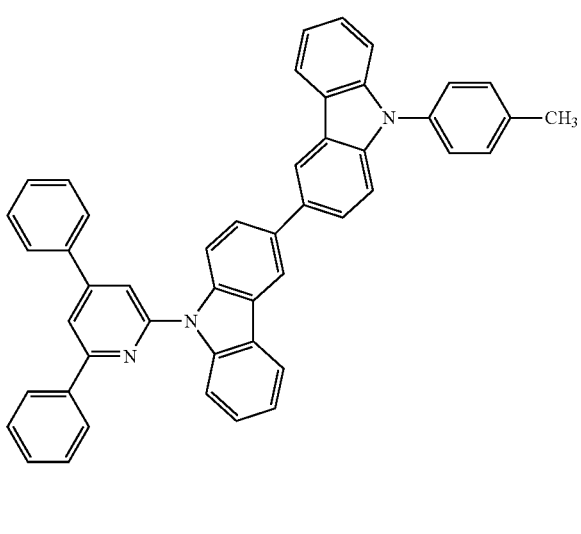
[Chemical Formula A-106]
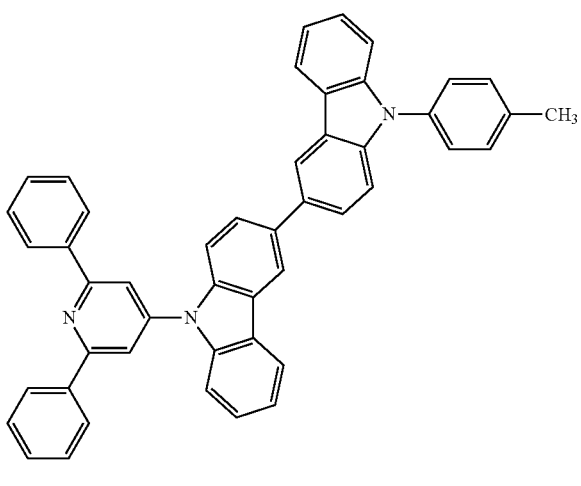
-continued
[Chemical Formula A-107]
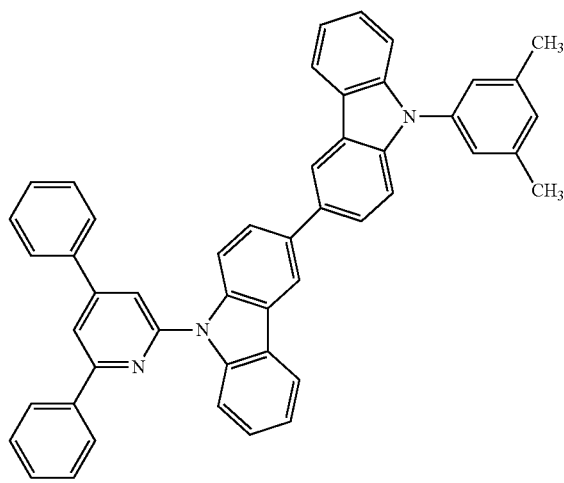
[Chemical Formula A-108]
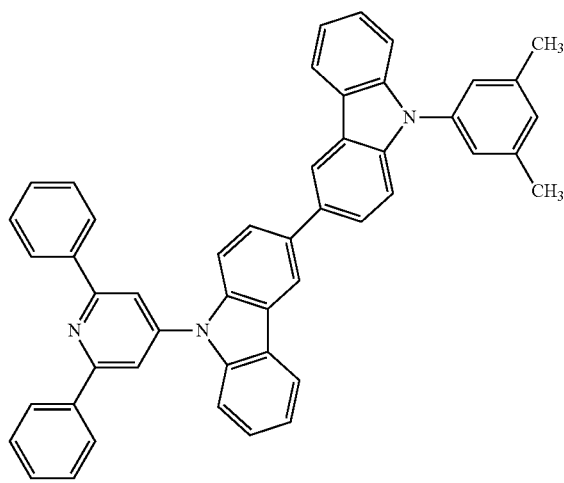
[Chemical Formula A-109]
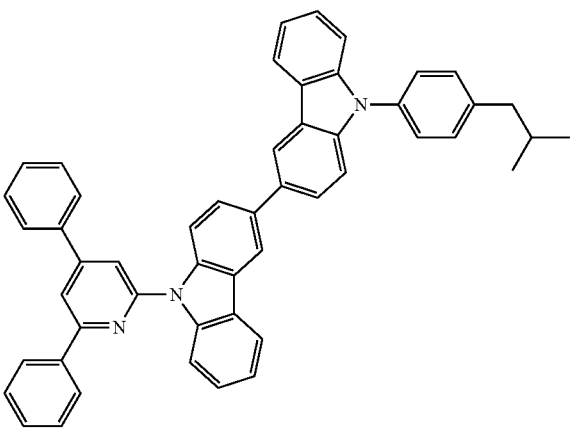

[Chemical Formula A-110]
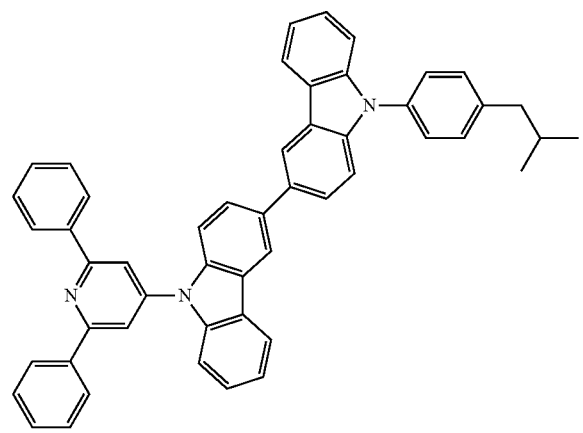
[Chemical Formula A-111]
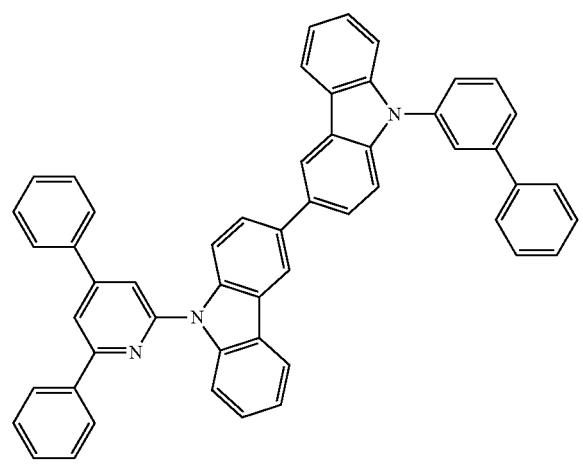
[Chemical Formula A-112]
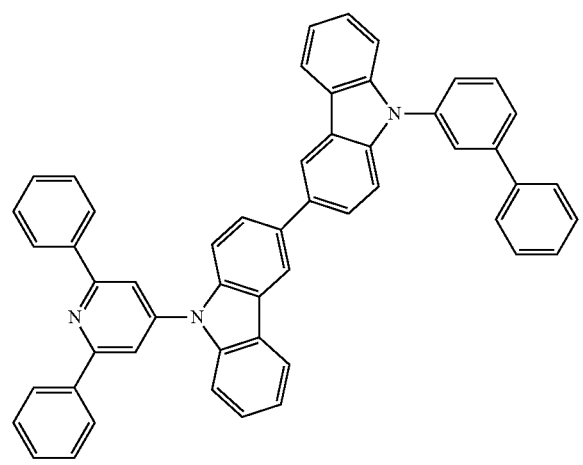
[Chemical Formula A-113]
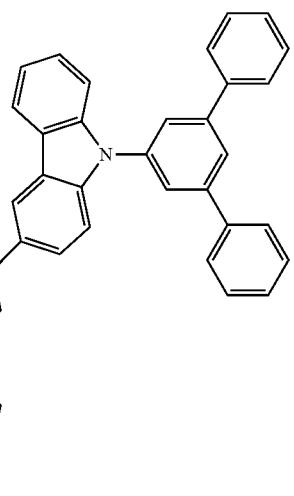
[Chemical Formula A-114]
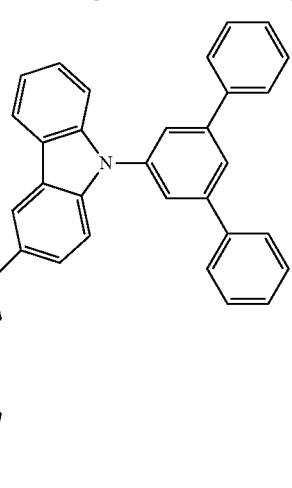
[Chemical Formula A-115]
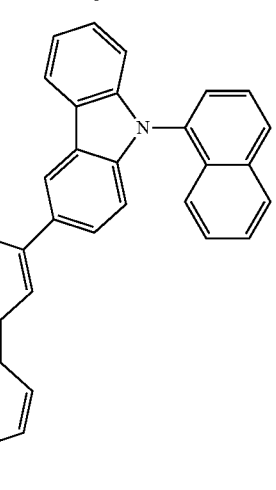

[Chemical Formula A-116]
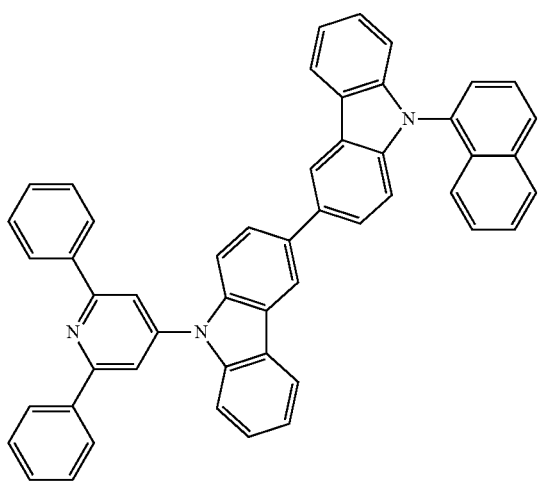
[Chemical Formula A-117]
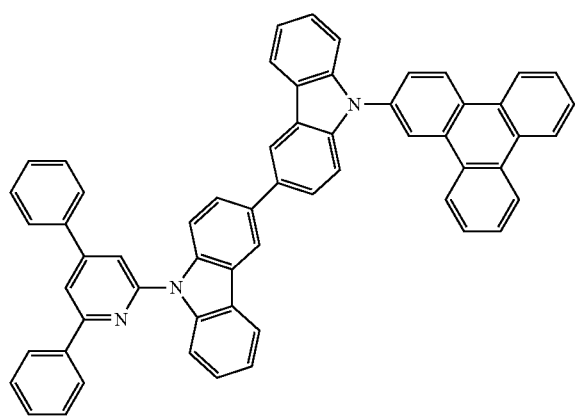
[Chemical Formula A-118]
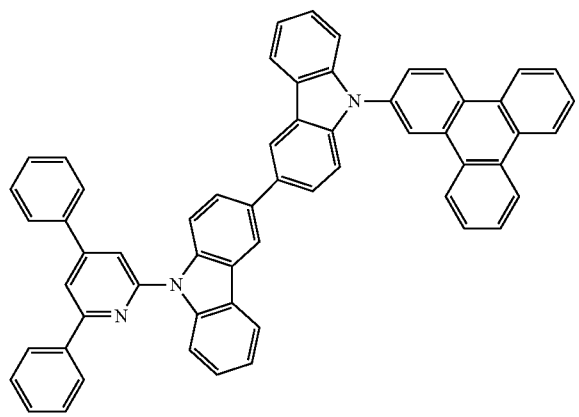
[Chemical Formula A-119]
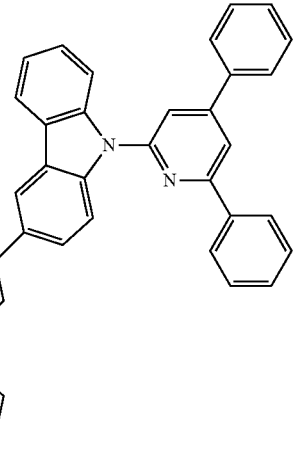
[Chemical Formula A-120]
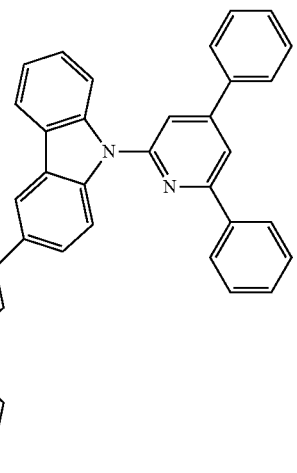
[Chemical Formula A-121]
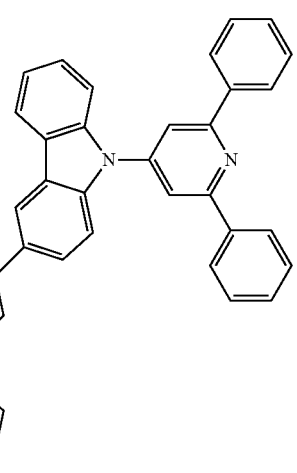
In an implementation, the compound represented by the above Chemical Formula B-1 may be represented by one of the following Chemical Formulae B-101 to B-111, but is not limited thereto.

[Chemical Formula B-101]
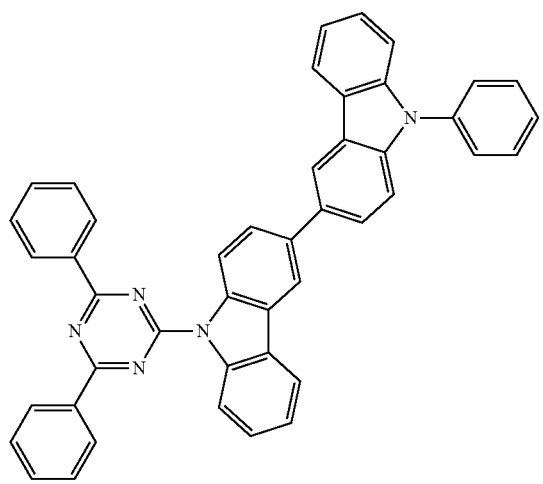
[Chemical Formula B-102]
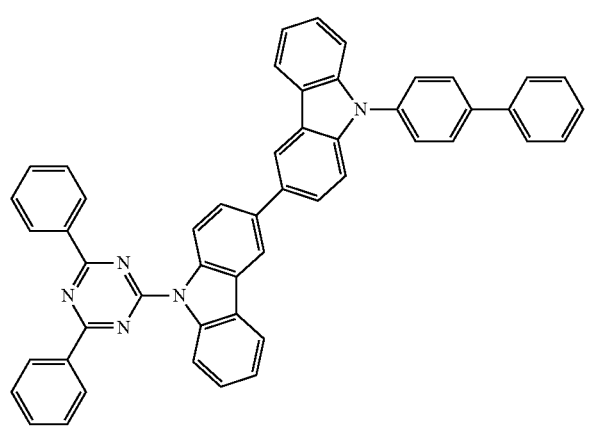
[Chemical Formula B-103]
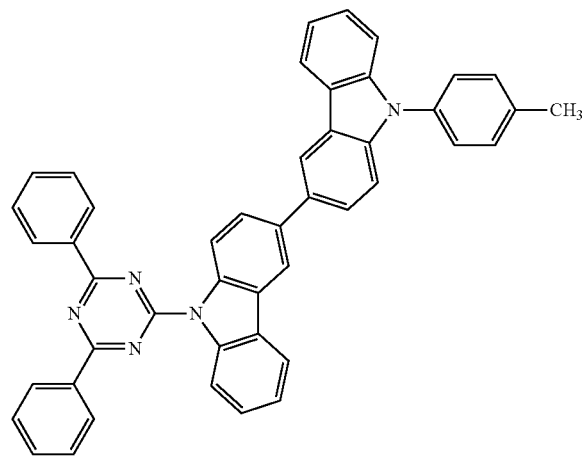
-continued
[Chemical Formula B-104]
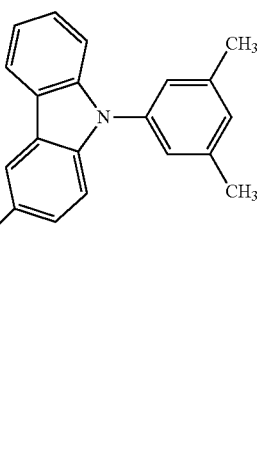
[Chemical Formula B-105]
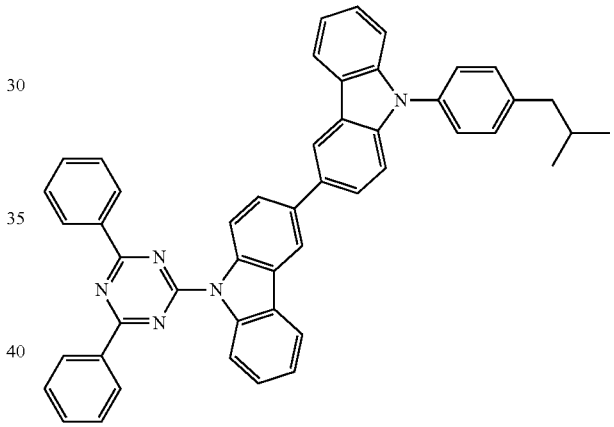
[Chemical Formula B-106]
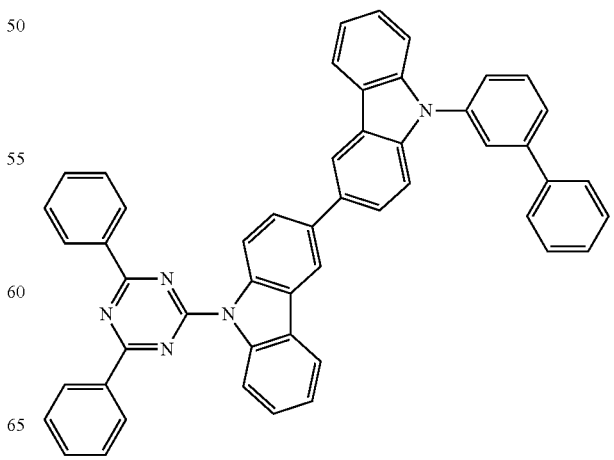

[Chemical Formula B-107]
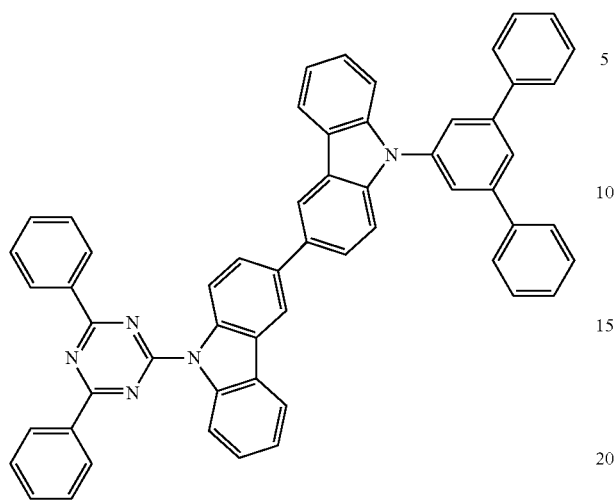
[Chemical Formula B-108]
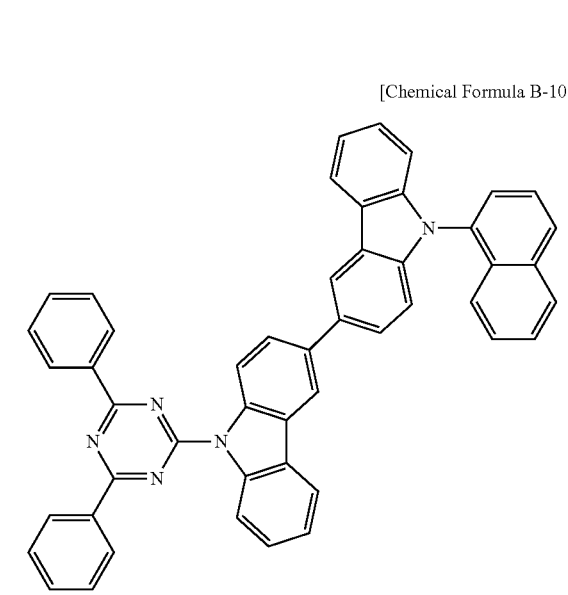
[Chemical Formula B-109]
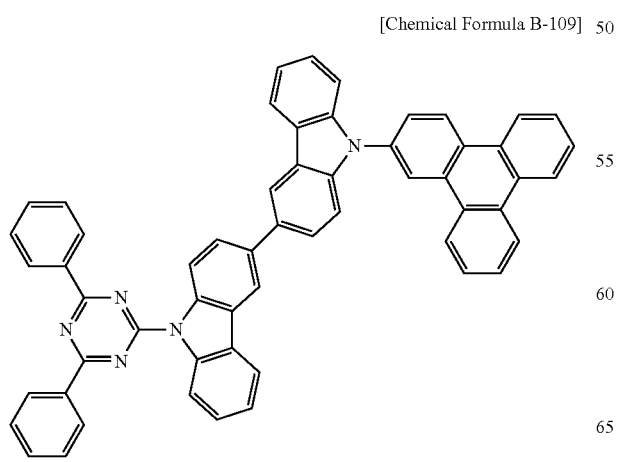
[Chemical Formula B-110]
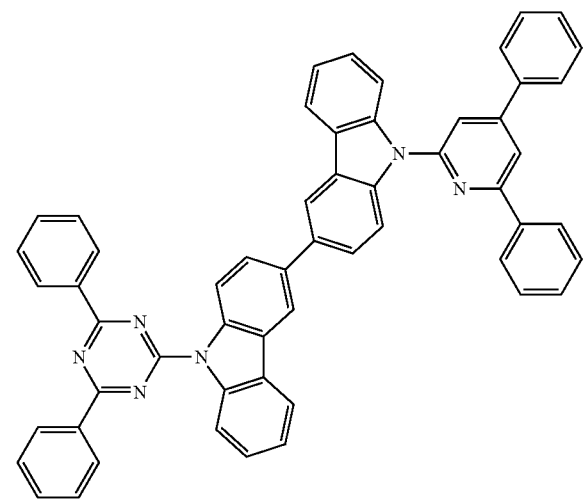
[Chemical Formula B-111]
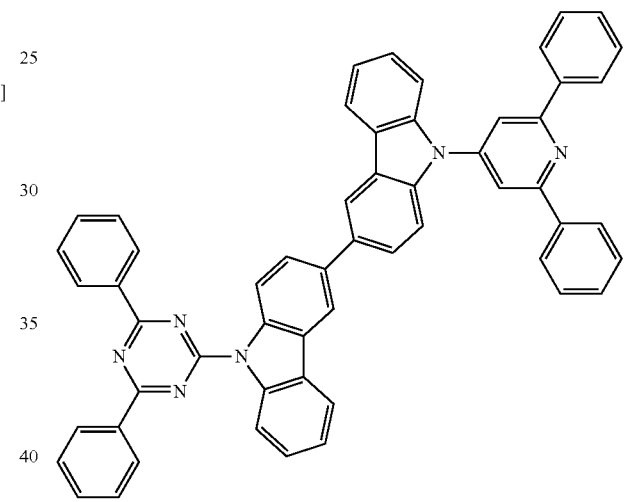
The compound represented by the above Chemical Formula B-1 may be represented by one of the following Chemical Formulae B-201 to B-221, but is not limited thereto.
[Chemical Formula B-201]
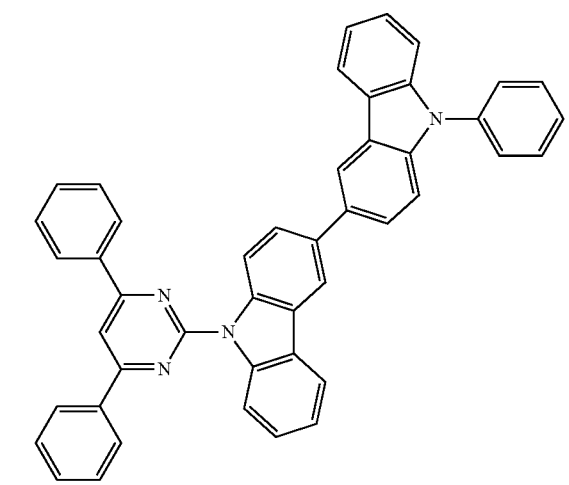

[Chemical Formula B-202]
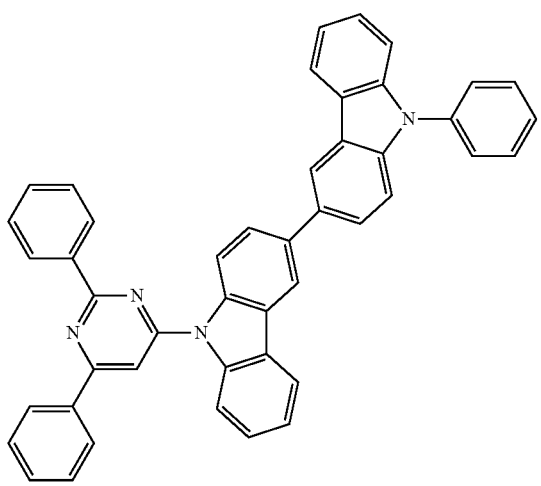
[Chemical Formula B-203]
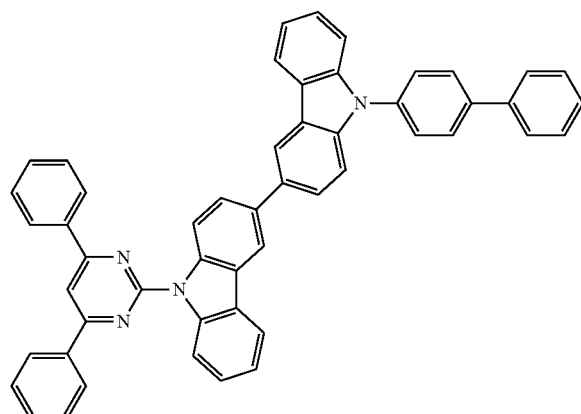
[Chemical Formula B-204]
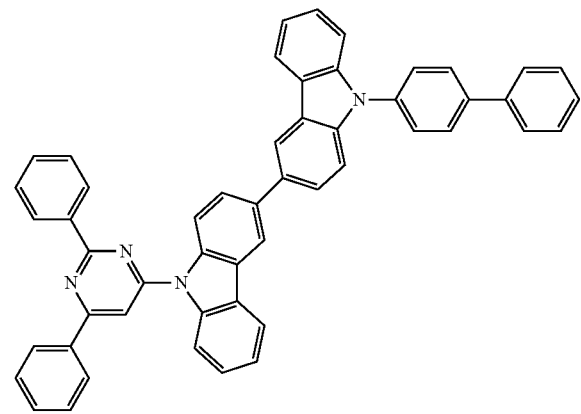
[Chemical Formula B-205]
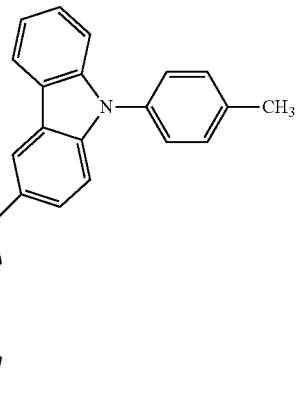
[Chemical Formula B-206]
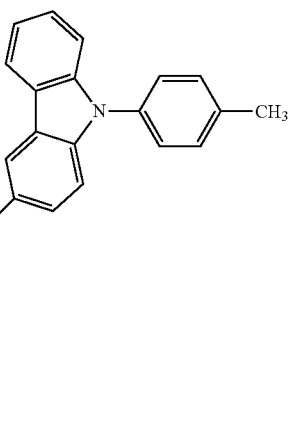
[Chemical Formula B-207]
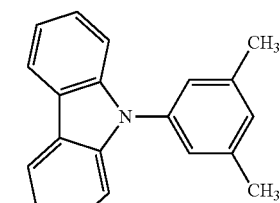

[Chemical Formula B-208]
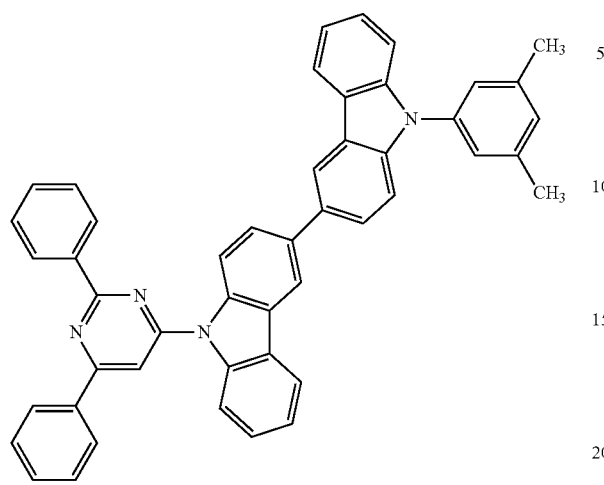
[Chemical Formula B-211]
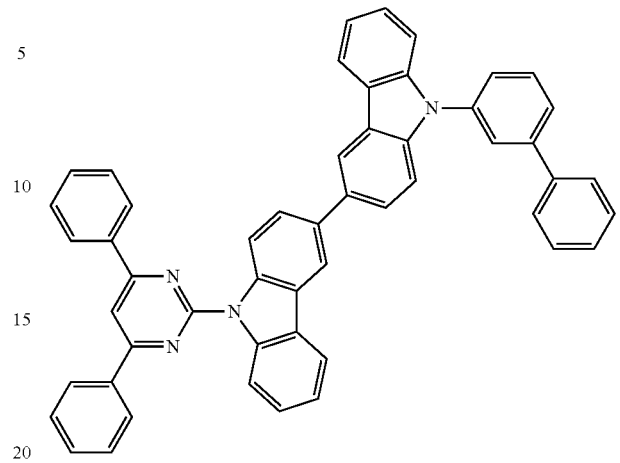
[Chemical Formula B-209]
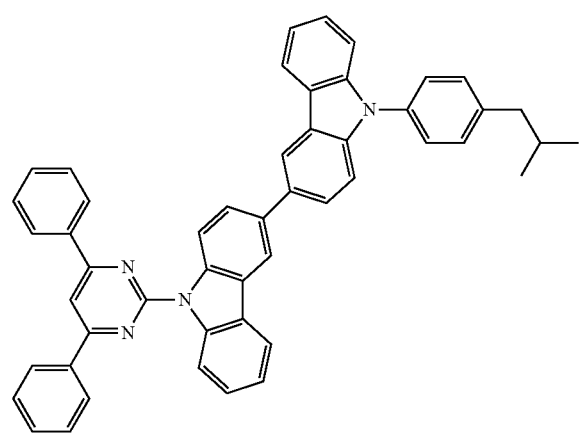
[Chemical Formula B-212]
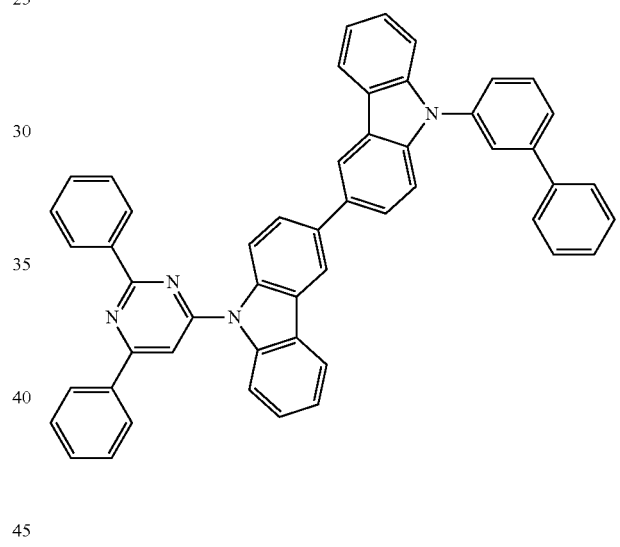
[Chemical Formula B-210]
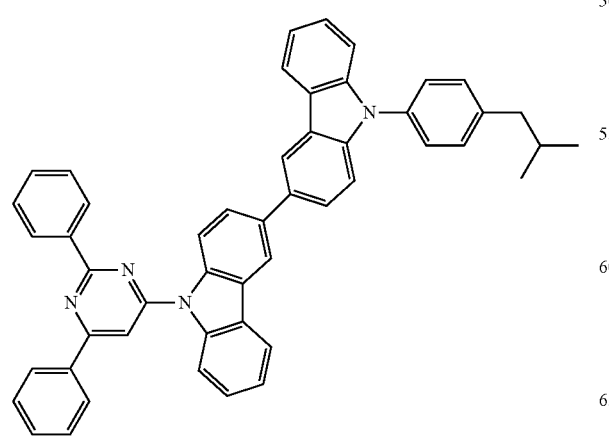
[Chemical Formula B-213]
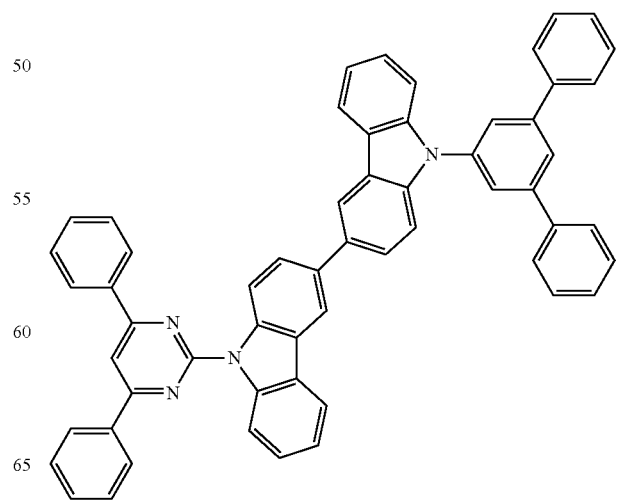

[Chemical Formula B-214]
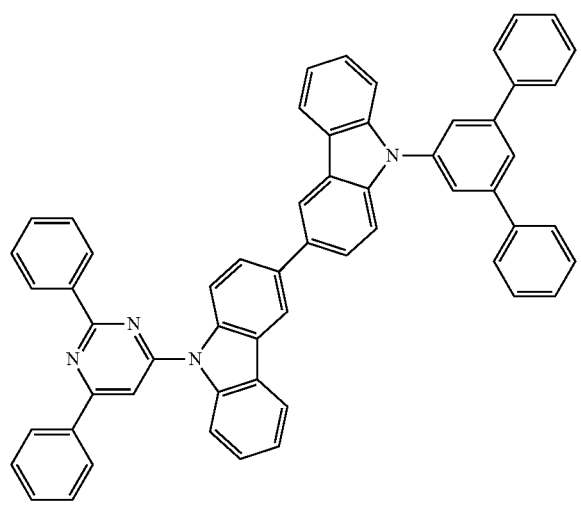
[Chemical Formula B-215]
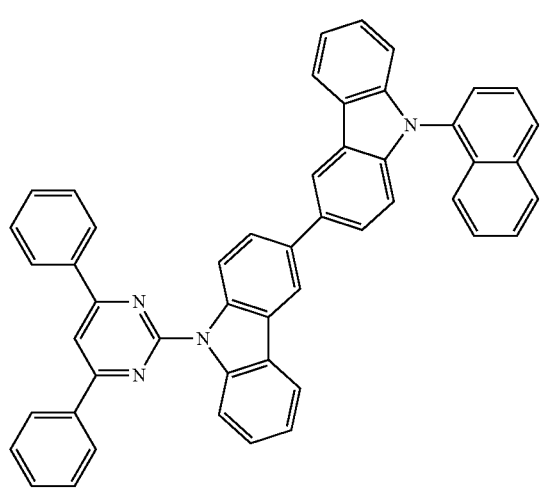
[Chemical Formula B-216]
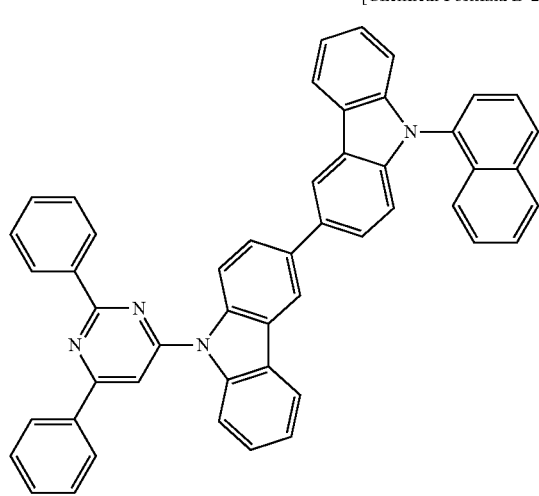
[Chemical Formula B-217]
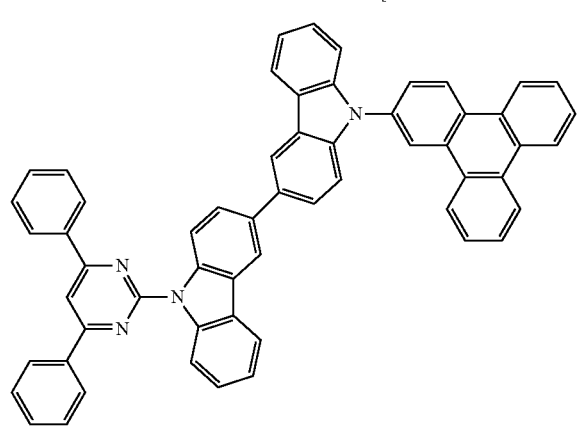
[Chemical Formula B-218]
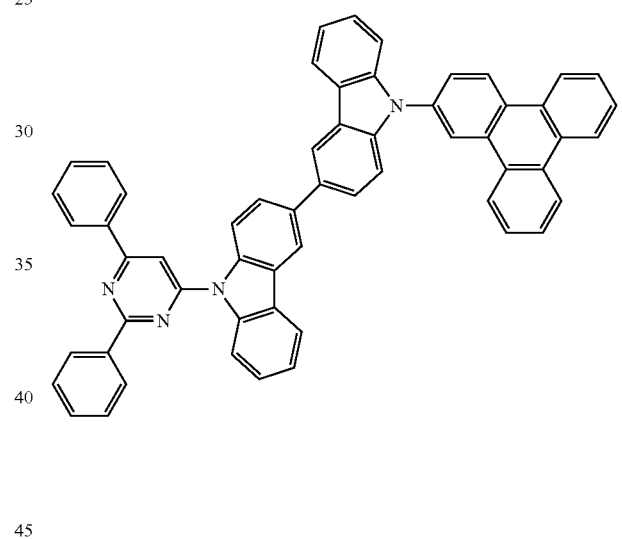
[Chemical Formula B-219]
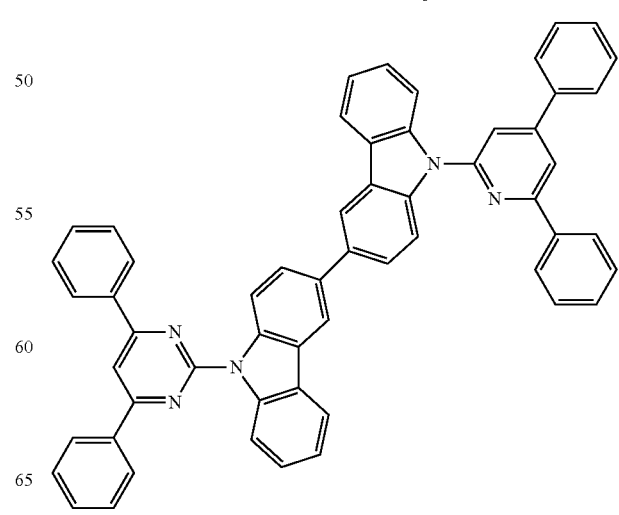

[Chemical Formula B-220]

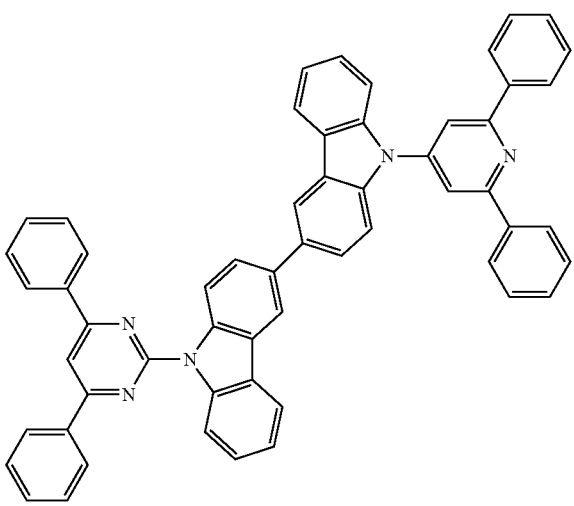

[Chemical Formula B-221]

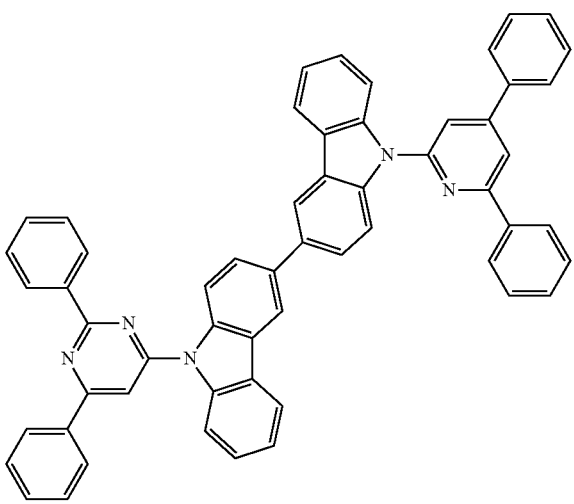

According to an embodiment, the material for an organic optoelectronic device may have a maximum light emitting wavelength of 320 to 500 nm, and a triplet excitation energy of 2.0 eV or more (T1), e.g., 2.0 to 4.0 eV. When the material has such a high excitation energy, it may transport a charge to a dopant well, may help improve luminous efficiency of the dopant, and may also decrease the driving voltage by freely regulating HOMO and LUMO energy levels. Accordingly, the material may be usefully applied as a host material or a charge-transporting material.

The material for an organic optoelectronic device may be also used as a nonlinear optical material, an electrode material, a chromic material, and as a material applicable to an optical switch, a sensor, a module, a waveguide, an organic transistor, a laser, an optical absorber, a dielectric material, and a membrane due to its optical and electrical properties.

The material for an organic optoelectronic device including the above compounds may have a glass transition temperature of 90° C. or higher and a thermal decomposition temperature of 400° C. or higher, so as to help improve thermal stability. Accordingly, it is possible to produce an organic optoelectronic device having a high efficiency.

The material for an organic optoelectronic device including the above compounds may play a role in emitting light or injecting and/or transporting electrons, and it may act as a light emitting host together with a suitable dopant. For example, the material for an organic optoelectronic device may be used as a phosphorescent or fluorescent host material, a blue light emitting dopant material, or an electron transporting material.

The material for an organic optoelectronic device according to an embodiment may be used for an organic thin layer. Thus, it may help improve the life span characteristic, efficiency characteristic, electrochemical stability, and thermal stability of an organic optoelectronic device, and decrease the driving voltage.

Therefore, according to another embodiment, an organic optoelectronic device is provided that includes the material for an organic optoelectronic device. The organic optoelectronic device may refer to an organic photoelectric device, an organic light emitting diode, an organic solar cell, an organic transistor, an organic photo-conductor drum, an organic memory device, or the like. For example, the material for an organic optoelectronic device according to an embodiment may be included in an electrode or an electrode buffer layer in the organic solar cell to help improve quantum efficiency, and/or it may be used as an electrode material for a gate, a source-drain electrode, or the like in the organic transistor.

Hereinafter, a detailed described relating to the organic light emitting diode will be provided.

According to another embodiment, an organic light emitting diode may include an anode, a cathode, and at least one organic thin layer interposed between the anode and the cathode. The at least one organic thin layer may include the material for an organic optoelectronic device according to an embodiment.

The organic thin layer including the material for an organic optoelectronic device may include a layer selected from the group of an emission layer, a hole transport layer (HTL), a hole injection layer (HIL), an electron transport layer (ETL), an electron injection layer (EIL), a hole blocking film, or a combination thereof. At least one layer may include the material for an organic optoelectronic device according to an embodiment. For example, the electron transport layer (ETL) or the electron injection layer (EIL) may include the material for an organic optoelectronic device according to an embodiment. In an implementation, when the material for an organic photoelectric device is included in the emission layer, the compound for an organic photoelectric device may be a phosphorescent or fluorescent host and/or a fluorescent blue dopant material.

FIGS. 1 to 5 illustrate cross-sectional views showing an organic light emitting diode including the compound for an organic optoelectronic device according to an embodiment.

Referring to FIGS. 1 to 5, organic light emitting diodes 100, 200, 300, 400, and 500 according to an embodiment may include at least one organic thin layer 105 interposed between an anode 120 and a cathode 110.

The anode 120 includes an anode material having a large work function to facilitate hole injection into an organic thin layer. The anode material may include: a metal such as nickel, platinum, vanadium, chromium, copper, zinc, and gold, or alloys thereof; a metal oxide such as zinc oxide, indium oxide, indium tin oxide (ITO), and indium zinc oxide (IZO); a combined metal and oxide such as ZnO:Al or SnO$_2$:Sb; or a conductive polymer such as poly(3-methylthiophene), poly[3,4-(ethylene-1,2-dioxy)thiophene] (PEDT), polypyrrole, and polyaniline, but is not limited thereto. In an implementation, a transparent electrode including indium tin oxide (ITO) may be included as an anode.

The cathode 110 may include a cathode material having a small work function to facilitate electron injection into an organic thin layer. The cathode material may include: a metal such as magnesium, calcium, sodium, potassium, titanium, indium, yttrium, lithium, gadolinium, aluminum, silver, tin, lead, cesium, barium, or the like, or alloys thereof, or a multi-layered material such as LiF/Al, LiO$_2$/Al, LiF/Ca, LiF/Al, and BaF$_2$/Ca, but is not limited thereto. In an implementation, a metal electrode including aluminum may be included as a cathode.

Referring to FIG. 1, the organic light emitting diode 100 may include an organic thin layer 105 including only an emission layer 130.

Figure 2:
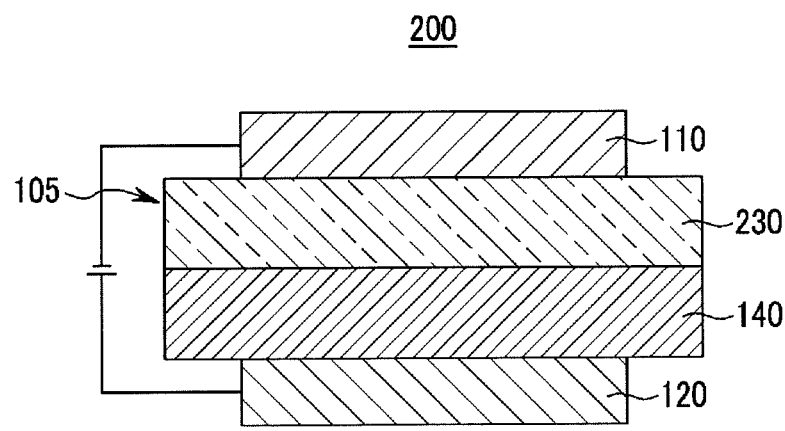

Referring to FIG. 2, a double-layered organic light emitting diode 200 may include an organic thin layer 105 including an emission layer 230 (including an electron transport layer (ETL)) and a hole transport layer (HTL) 140. For example, the emission layer 230 may also functions as the electron transport layer (ETL), and the hole transport layer (HTL) 140 layer may have an excellent binding property with a transparent electrode such as ITO or an excellent hole transporting property.

Figure 3:
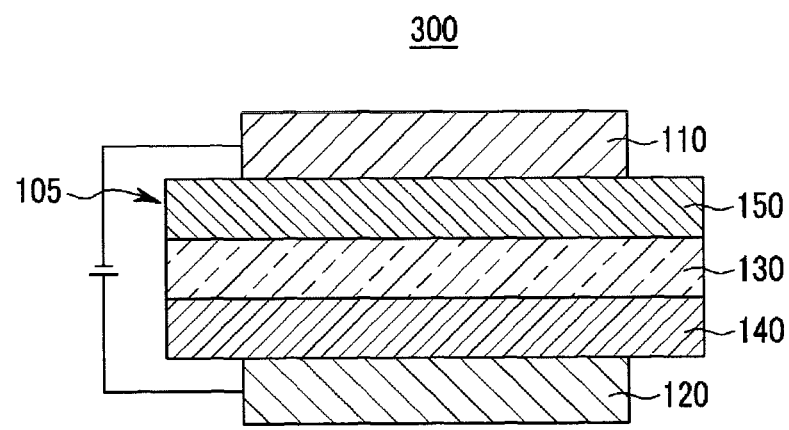

Referring to FIG. 3, a three-layered organic light emitting diode 300 may include an organic thin layer 105 including an electron transport layer (ETL) 150, an emission layer 130, and a hole transport layer (HTL) 140. For example emission layer 130 may be independently installed, and layers having an excellent electron transporting property or an excellent hole transporting property are separately stacked.

Figure 4:
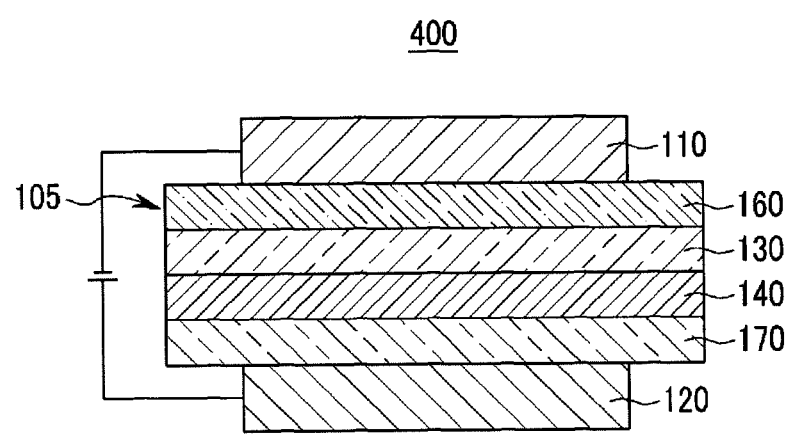

As shown in FIG. 4, a four-layered organic light emitting diode 400 may include an organic thin layer 105 including an electron injection layer (EIL) 160, an emission layer 130, a hole transport layer (HTL) 140, and a hole injection layer (HIL) 170 for binding with the anode 120 of ITO.

Figure 5:
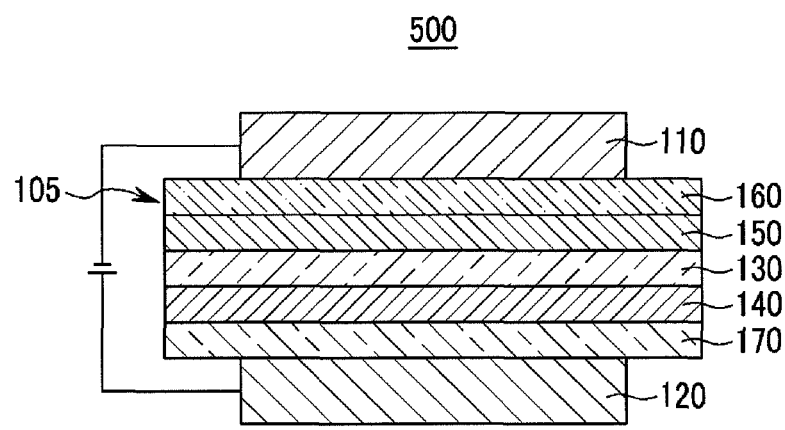

As shown in FIG. 5, a five layered organic light emitting diode 500 may include an organic thin layer 105 including an electron transport layer (ETL) 150, an emission layer 130, a hole transport layer (HTL) 140, and a hole injection layer (HIL) 170, and further includes an electron injection layer (EIL) 160 to achieve a low voltage.

In FIG. 1 to FIG. 5, the organic thin layer 105 (including at least one selected from the group of an electron transport layer (ETL) 150, an electron injection layer (EIL) 160, an emission layer 130 and 230, a hole transport layer (HTL) 140, a hole injection layer (HIL) 170, or combinations thereof) may include the compound or material for an organic optoelectronic device. The material for an organic optoelectronic device may be used for an electron transport layer (ETL) 150 or electron injection layer (EIL) 160. When it is used for the electron transport layer (ETL), it is possible to provide an organic light emitting diode having a simpler structure because an additional hole blocking layer (not shown) may not be required.

Furthermore, when the material for an organic optoelectronic device is included in the emission layer 130 or 230, the material for an organic optoelectronic device may be included as, e.g., a phosphorescent or fluorescent host or a fluorescent blue dopant.

The organic light emitting diode may be fabricated by: forming an anode on a substrate; forming an organic thin layer in accordance with a dry coating method such as evaporation, sputtering, plasma plating, and ion plating, or a wet coating method such as spin coating, dipping, and flow coating; and providing a cathode thereon.

The organic thin layer may be formed in various methods. Herein, two different compounds according to an embodiment may be simultaneously or sequentially formed into an organic thin layer.

In an implementation, the compounds represented by the above Chemical Formulae A-1 and B-1 may be mixed to prepare a mixture, and the mixture may be deposited to form an organic thin layer on an anode.

In an implementation, the compounds represented by the above Chemical Formulae A-1 and B-1 may be separately prepared and then, simultaneously or sequentially deposited on the anode.

The deposition may vary depending on desired effects and is not limited thereto.

Another embodiment provides a display device including the organic light emitting diode according to the above embodiment.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

(Preparation of Compound for an Organic Optoelectronic Device)

Synthesis Example 1

Preparation of Compound A-101

[Reaction Scheme 1]

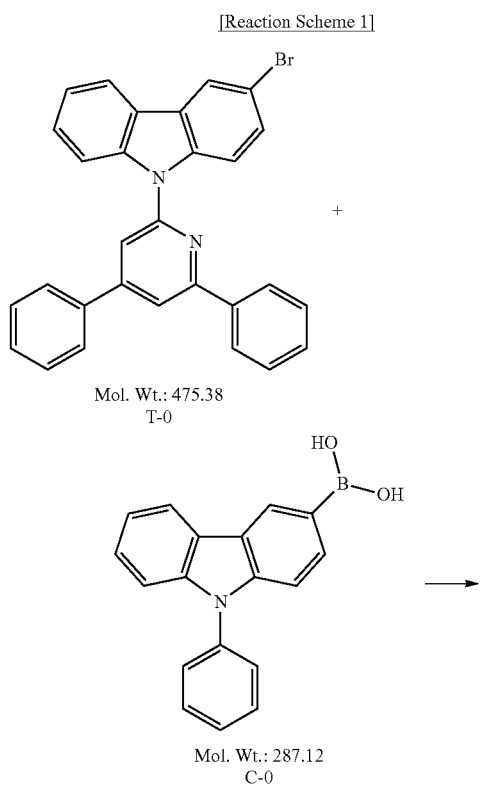

Mol. Wt.: 475.38
T-0

Mol. Wt.: 287.12
C-0

-continued

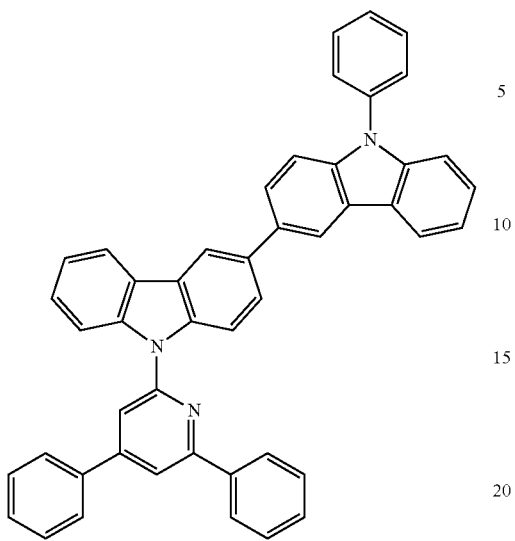

Mol. Wt.: 637.77

9.5 g of an intermediate compound T-0 and 6.9 g of an intermediate compound C-0 were dissolved in 100 mL of tetrahydrofuran in a 250 mL round-bottomed flask equipped with a thermometer, a reflux-condenser, and an agitator under a nitrogen atmosphere. 80 mL of a 2M-potassium carbonate aqueous solution was added thereto. Next, 1.2 g of tetrakis(triphenylphosphine)palladium was added to the mixture and refluxed for 12 hours. When the reaction was complete, the reactant was extracted with methylene chloride several times, treated with anhydrous sulfuric acid magnesium to remove moisture, filtered, and then the solvent was removed therefrom.

The resulting reactant was purified by performing column chromatography and recrystallization, obtaining 10.2 g of a compound A-101.

Synthesis Example 2

Preparation of Compound A-103

[Reaction Scheme 2]

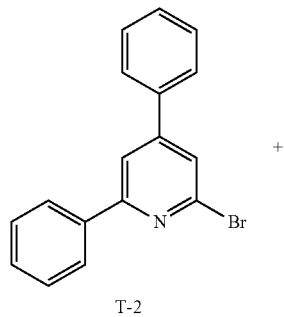

T-2

+

-continued

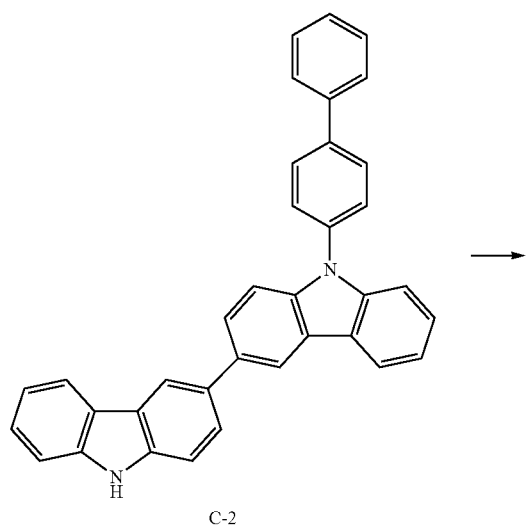

C-2

→

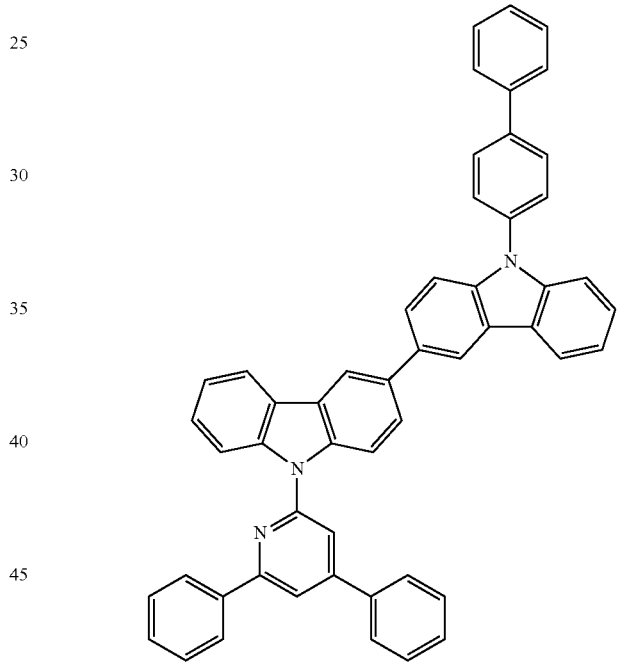

7.4 g of an intermediate compound T-2 and 9.7 g of an intermediate compound C-2 were dissolved in 100 mL of toluene in a 250 mL round-bottomed flask equipped with a thermometer, a reflux-condenser, and an agitator under a nitrogen atmosphere. 0.3 g of sodium tert-butoxide, 0.9 g of palladium dibenzylideneamine, and 0.4 g of tertiarybutyl phosphorus were added thereto. The mixture was refluxed for 12 hours. When the reaction was complete, the reactant was extracted with methylene chloride several times, treated with anhydrous sulfuric acid magnesium to remove moisture, filtered, and then the solvent was removed therefrom.

The reactant was recrystallized for purification, obtaining 10.7 g of a compound A-103. The compound A-103 was analyzed using LC-Mass Spec and had a [M+H]$^+$ molecular weight of 715.31.

Synthesis Example 3

Preparation of Compound B-103

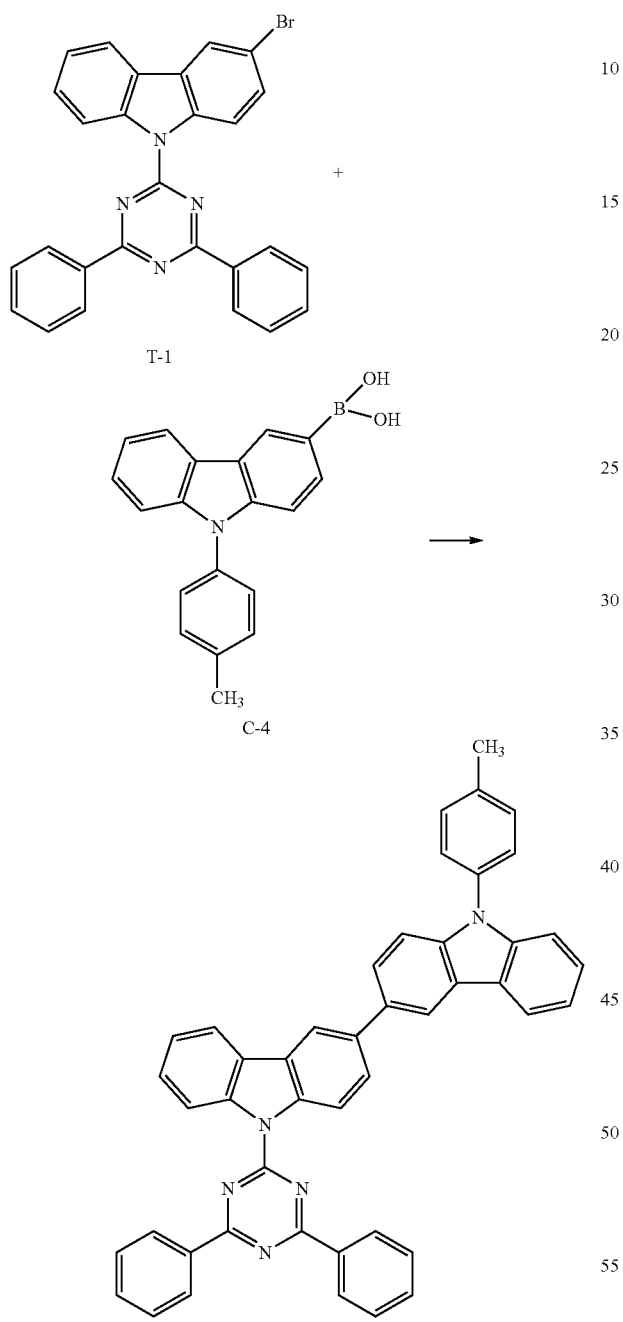

9.5 g of an intermediate compound T-1 and 7.2 g of an intermediate compound C-4 were dissolved in 100 mL of tetrahydrofuran in a 250 mL round-bottomed flask equipped with a thermometer, a reflux-condenser, and an agitator under a nitrogen atmosphere. 80 mL of a 2M-potassium carbonate aqueous solution was added thereto. Then, 1.2 g of tetrakis(triphenylphosphine)palladium was added to the mixture. The resulting mixture was refluxed for 12 hours. When the reaction was complete, the reactant was extracted with methylene chloride several times, treated with anhydrous sulfuric acid magnesium to remove moisture, filtered, and then the solvent was removed therefrom.

The resulting reactant was purified by performing column chromatography and recrystallization, obtaining 8.5 g of a compound B-103. The compound B-103 was analyzed using LC-Mass Spec and had a $[M+H]^+$ molecular weight of 654.74.

Synthesis Example 4

Preparation of Compound B-106

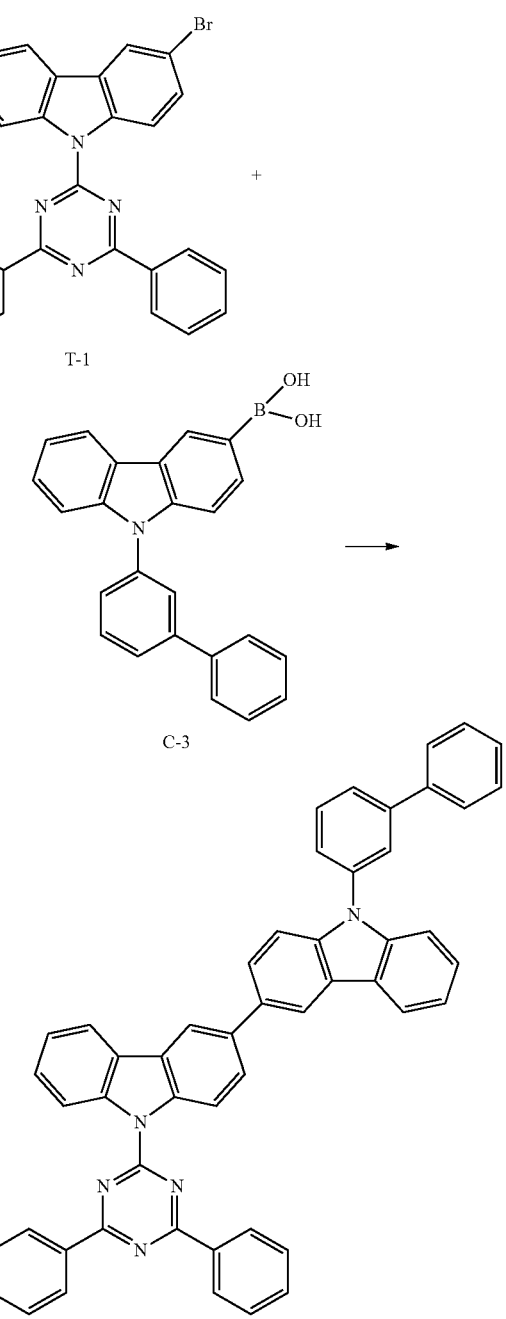

9.6 g of an intermediate compound T-1 and 8.7 g of an intermediate compound C-3 was dissolved in 100 mL of tetrahydrofuran and 80 mL of an 2M-potassium carbonate aqueous solution in a 250 mL round-bottomed flask equipped with a thermometer, a reflux-condenser, and an agitator under a nitrogen atmosphere. Then, 1.2 g of tetrakis(triphenylphosphine)palladium was added to the mixture. The resulting mixture was refluxed for 12 hours. When the reaction was complete, the reactant was extracted several times with methylene chloride, treated with anhydrous sulfuric acid magnesium to remove moisture, filtered, and then the solvent was removed therefrom.

The reactant was recrystallized for purification, obtaining 10.7 g of a compound B-106. The compound B-106 was analyzed using LC-Mass Spec and had a [M+H]$^+$ molecular weight of 717.42.

Synthesis Example 5

Preparation of Compound B-205

[Reaction Scheme 5]

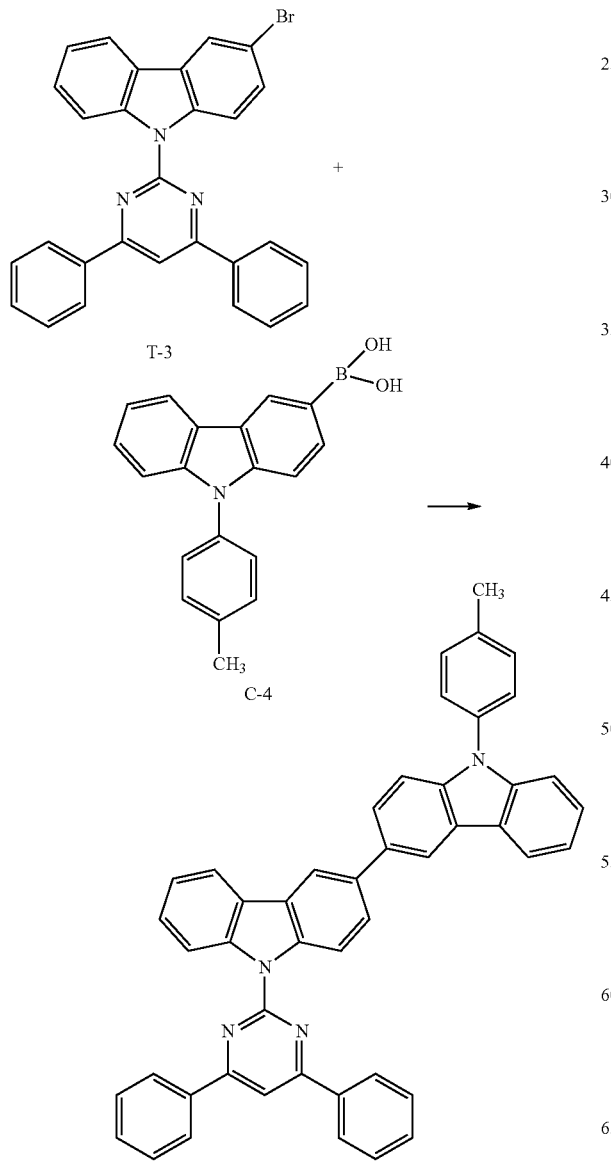

9.0 g of an intermediate compound T-3 and 7.2 g of an intermediate compound C-4 were dissolved in 100 mL of tetrahydrofuran in a 250 mL round-bottomed flask equipped with a thermometer, a reflux-condenser, and an agitator under a nitrogen atmosphere. 80 mL of a 2M-potassium carbonate aqueous solution was added thereto. Next, 1.2 g of tetrakis(triphenylphosphine)palladium was added to the mixture. The resulting mixture was refluxed for 12 hours. When the reaction was complete, the reactant was extracted several times with methylene chloride, treated with anhydrous sulfuric acid magnesium to remove moisture, filtered, and then the solvent was removed therefrom.

The resulting reactant was purified by performing column chromatography and recrystallization, obtaining 9.2 g of a compound B-205. The compound B-205 was analyzed using LC-Mass Spec and had a [M+H]$^+$ molecular weight of 654.74.

Synthesis Example 6

Preparation of Compound B-211

[Reaction Scheme 6]

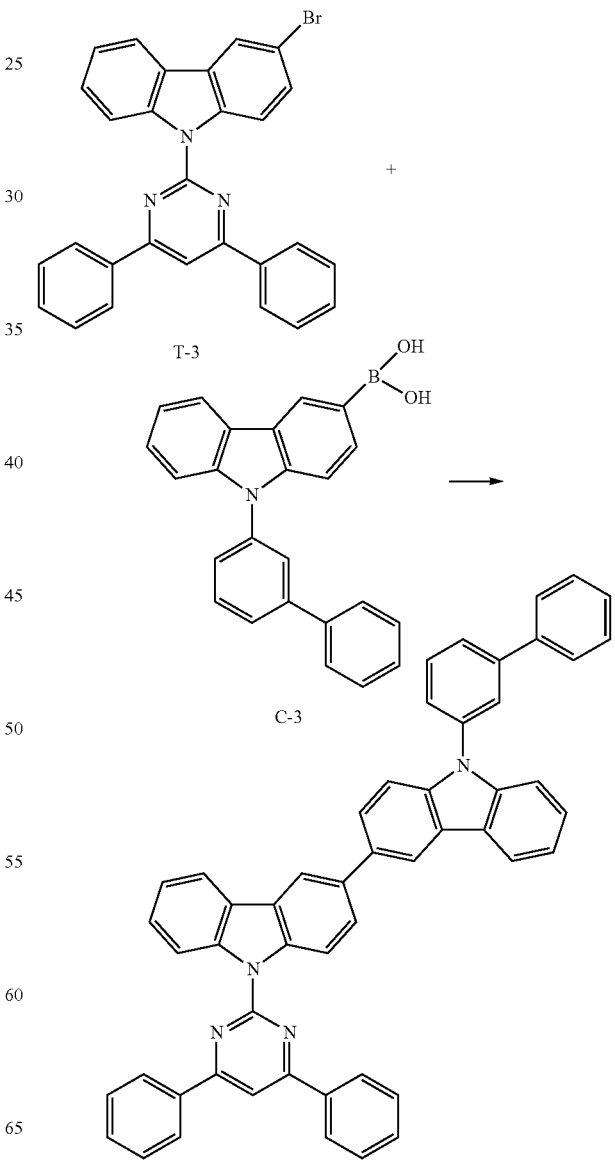

9.5 g of an intermediate compound T-3 and 8.7 g of an intermediate compound C-3 were dissolved in 100 mL of tetrahydrofuran in a 250 mL round-bottomed flask equipped with a thermometer, a reflux-condenser, and an agitator under a nitrogen atmosphere. 80 mL of a 2M-potassium carbonate aqueous solution was added thereto. Then, 1.2 g of tetrakis(triphenylphosphine)palladium was added to the mixture, and the resulting mixture was refluxed for 12 hours. When the reaction was complete, the reactant was extracted several times with methylene chloride, treated with anhydrous sulfuric acid magnesium to remove moisture, filtered, and then the solvent was removed therefrom.

The resulting reactant was recrystallized for purification, obtaining 12.1 g of a compound B-211. The compound B-211 was analyzed using LC-Mass Spec and had a $[M+H]^+$ molecular weight of 715.86.

(Preparation of Organic Light Emitting Diode)

Example 1

Mixing Compounds A-101 and B-103 at 1:1

A glass substrate coated with ITO (Indium tin oxide) to be 1,500 Å thick was washed with ultrasonic wave using distilled water.

Next, the substrate was washed with ultrasonic wave using a solvent of isopropyl alcohol, acetone, methanol, or the like.

Then, the substrate was moved to a plasma cleaner and cleaned with an oxygen plasma for 5 minutes and then, moved to a vacuum depositor.

The ITO transparent electrode was used as an anode, and the following HTM compound was vacuum-deposited to form a 1,200 Å-thick hole injection layer (HIL) thereon.

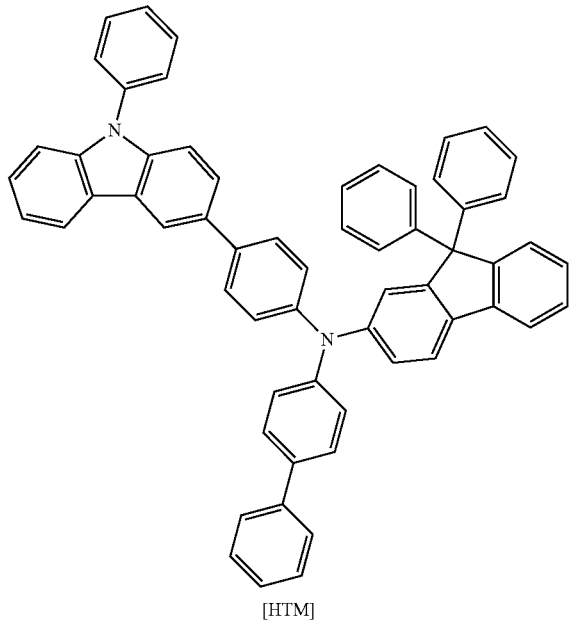

[HTM]

On a hole transport layer (HTL), a mixture prepared by mixing the compound A-101 and the compound B-103 in a weight ratio of 1:1 was used as a host, while the following PhGD compound (as a green phosphorescent dopant) was doped thereon in an amount of 7 wt % to form a 300 Å-thick emission layer in a vacuum-deposition.

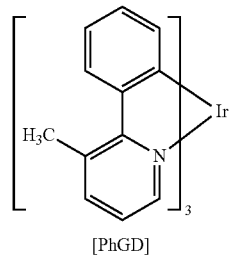

[PhGD]

On the emission layer, the following BAlq[Bis(2-methyl-8-quinolinolato-N1,O8)-(1,1'-Biphenyl-4-olato)aluminum] compound and sequentially, the following $Alq_3$-[Tris(8-hydroxyquinolinato)aluminum] compound were laminated to be 50 Å thick and 250 Å thick, respectively thereon, forming an electron transport layer (ETL). On the electron transport layer (ETL), 5 Å-thick LiF and 1,000 Å-thick Al were sequentially vacuum deposited to fabricate a cathode. The cathode was used to fabricate an organic light emitting diode.

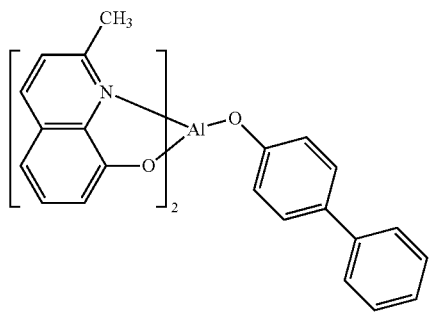

[Balq]

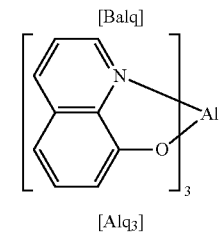

[Alq3]

Example 2

Mixing Compounds A-101 and B-205 at 1:1

An organic light emitting diode was fabricated according to the same method as Example 1, except for using a mixture of the compounds A-101 and B-205 mixed in a weight ratio of 1:1 instead of the mixture of the compounds A-101 and B-103 mixed in a weight ratio of 1:1.

Example 3

Mixing Compounds A-101 and B-106 at 1:1

An organic light emitting diode was fabricated according to the same method as Example 1, except for using a mixture of the compounds A-101 and B-106 mixed in a weight ratio of 1:1 instead of the mixture of the compounds A-101 and B-103 mixed in a weight ratio of 1:1.

Example 4

Mixing Compounds A-101 and B-211 at 1:1

An organic light emitting diode was fabricated according to the same method as Example 1, except for using a mixture of the compounds A-101 and B-211 mixed in a weight ratio of 1:1 instead of the mixture of the compounds A-101 and B-103 mixed in a weight ratio of 1:1.

Example 5

Mixing Compounds A-103 and B-103 at 1:1

An organic light emitting diode was fabricated according to the same method as Example 1, except for using a mixture of the compounds A-103 and B-211 mixed in a weight ratio of 1:1 instead of the mixture of the compounds A-101 and B-103 mixed in a weight ratio of 1:1.

Comparative Example 1

Compound A-101

An organic light emitting diode was fabricated according to the same method as Example 1, except for using the compound A-101 instead of the mixture of the compounds A-101 and B-103 mixed in a weight ratio of 1:1.

Comparative Example 2

Compound B-103

An organic light emitting diode was fabricated according to the same method as Example 1, except for using the compound B-103 instead of the mixture of the compounds A-101 and B-103 mixed in a weight ratio of 1:1.

Comparative Example 3

Compound B-205

An organic light emitting diode was fabricated according to the same method as Example 1, except for using the compound B-205 instead of the mixture of the compounds A-101 and B-103 mixed in a weight ratio of 1:1.

Comparative Example 4

Compound B-106

An organic light emitting diode was fabricated according to the same method as Example 1, except for using the compound B-106 instead of the mixture of the compounds A-101 and B-103 mixed in a weight ratio of 1:1.

Comparative Example 5

Compound B-211

An organic light emitting diode was fabricated according to the same method as Example 1, except for using the compound B-211 instead of the mixture of the compounds A-101 and B-103 mixed in a weight ratio of 1:1.

Comparative Example 6

Compound A-103

An organic light emitting diode was fabricated according to the same method as Example 1, except for using the compound A-103 instead of the mixture of the compounds A-101 and B-103 mixed in a weight ratio of 1:1.

Performance Evaluation of Organic Light Emitting Diode

Each organic light emitting diode according to Examples 1 to 5 and Comparative Examples 1 to 6 was measured regarding current density change and luminance change depending on a voltage and luminous efficiency. The measurement method was as follows.

(1) Current Density Change Depending on Voltage Change

The organic light emitting diodes were measured regarding current flowing in a unit device by using a current-voltage meter (Keithley 2400) while a voltage was increased from 0 V to 10 V. The current measurement was divided by an area to calculate current density.

(2) Luminance Change Depending on Voltage Change

The organic light emitting diodes were measured regarding luminance by using a luminance meter (Minolta Cs-1000A) while a voltage was increased from 0 V to 10 V.

(3) Luminous Efficiency

The luminance and current density obtained from the above (1) and (2) and a voltage were used to calculate current efficiency (cd/A) at the same current density (10 $mA/cm^2$).

(4) Life-Span Characteristic Evaluation

The organic light emitting diodes were measured regarding time (h) taking from their initial luminance of 3,000 $cd/m^2$ to decrease down to 2,910 $cd/m^2$ by 3%.

The following Table 1 shows the evaluation results of the organic light emitting diodes according to Example 1 and Comparative Examples 1 and 2.

TABLE 1

|  | $V_d$ (V) | Cd/A | lm/W | $Cd/m^2$ | $CIE_x$ | $CIE_y$ | Life-span (h) |
|---|---|---|---|---|---|---|---|
| Comparative Example 1 | 5.14 | 58.4 | 35.7 | 3,000 | 0.335 | 0.624 | 20 |
| Comparative Example 2 | 5.11 | 62.4 | 38.4 | 3,000 | 0.337 | 0.624 | 130 |
| Example 1 | 4.92 | 63.7 | 40.7 | 3,000 | 0.334 | 0.626 | 151 |

The device using more than two compounds according to Example 1 had excellent efficiency and life-span characteristic compared with the devices according to Comparative Examples 1 and 2.

The following Table 2 shows the evaluation results of the devices according to Example 2 and Comparative Examples 1 and 3.

TABLE 2

|  | $V_d$ (V) | Cd/A | lm/W | $Cd/m^2$ | $CIE_x$ | $CIE_y$ | Life-span (h) |
|---|---|---|---|---|---|---|---|
| Comparative Example 1 | 5.14 | 58.4 | 35.7 | 3,000 | 0.335 | 0.624 | 20 |
| Comparative Example 3 | 4.91 | 66.3 | 42.5 | 3,000 | 0.339 | 0.623 | 36 |
| Example 2 | 4.84 | 65.0 | 42.2 | 3,000 | 0.331 | 0.628 | 63 |

The device using more than two compounds according to Example 2 had roughly equal efficiency to the device of Comparative Examples 1 and 3 but a remarkably improved life-span characteristic.

The following Table 3 shows the evaluation results of the devices according to Example 3 and Comparative Examples 1 and 4.

TABLE 3

|  | $V_d$ (V) | Cd/A | lm/W | Cd/m² | $CIE_x$ | $CIE_y$ | Life-span (h) |
|---|---|---|---|---|---|---|---|
| Comparative Example 1 | 5.14 | 58.4 | 35.7 | 3,000 | 0.335 | 0.624 | 20 |
| Comparative Example 4 | 5.32 | 64.9 | 38.4 | 3,000 | 0.340 | 0.621 | 100 |
| Example 3 | 5.02 | 65.3 | 40.9 | 3,000 | 0.341 | 0.621 | 123 |

The device using more than two compounds according to Example 3 had excellent device efficiency and life-span characteristics compared with the devices of Comparative Examples 1 and 4.

The following Table 4 shows the evaluation results of the devices according to Example 4 and Comparative Examples 1 and 5.

TABLE 4

|  | $V_d$ (V) | Cd/A | lm/W | Cd/m² | $CIE_x$ | $CIE_y$ | Life-span (h) |
|---|---|---|---|---|---|---|---|
| Comparative Example 1 | 5.14 | 58.4 | 35.7 | 3,000 | 0.335 | 0.624 | 20 |
| Comparative Example 5 | 4.84 | 66.6 | 43.3 | 3,000 | 0.340 | 0.621 | 78 |
| Example 4 | 4.85 | 65.7 | 42.7 | 3,000 | 0.338 | 0.623 | 108 |

The devices using two compounds according to Example 4 had roughly equal efficiency to the devices according to Comparative Examples 1 and 5 but a much improved life-span.

The following Table 5 shows the evaluation results of the devices according to Example 5 and Comparative Examples 2 and 6.

TABLE 5

|  | $V_d$ (V) | Cd/A | lm/W | Cd/m² | $CIE_x$ | $CIE_y$ | Life-span (h) |
|---|---|---|---|---|---|---|---|
| Comparative Example 6 | 5.02 | 58.4 | 35.7 | 3,000 | 0.335 | 0.624 | 36 |
| Comparative Example 2 | 5.11 | 62.4 | 38.4 | 3,000 | 0.337 | 0.624 | 130 |
| Example 5 | 4.87 | 64.2 | 41.5 | 3,000 | 0.333 | 0.627 | 194 |

The devices using two compounds according to Example 5 had excellent efficiency and life-span characteristics, compared with the devices according to Comparative Examples 2 and 6.

Figure 6:
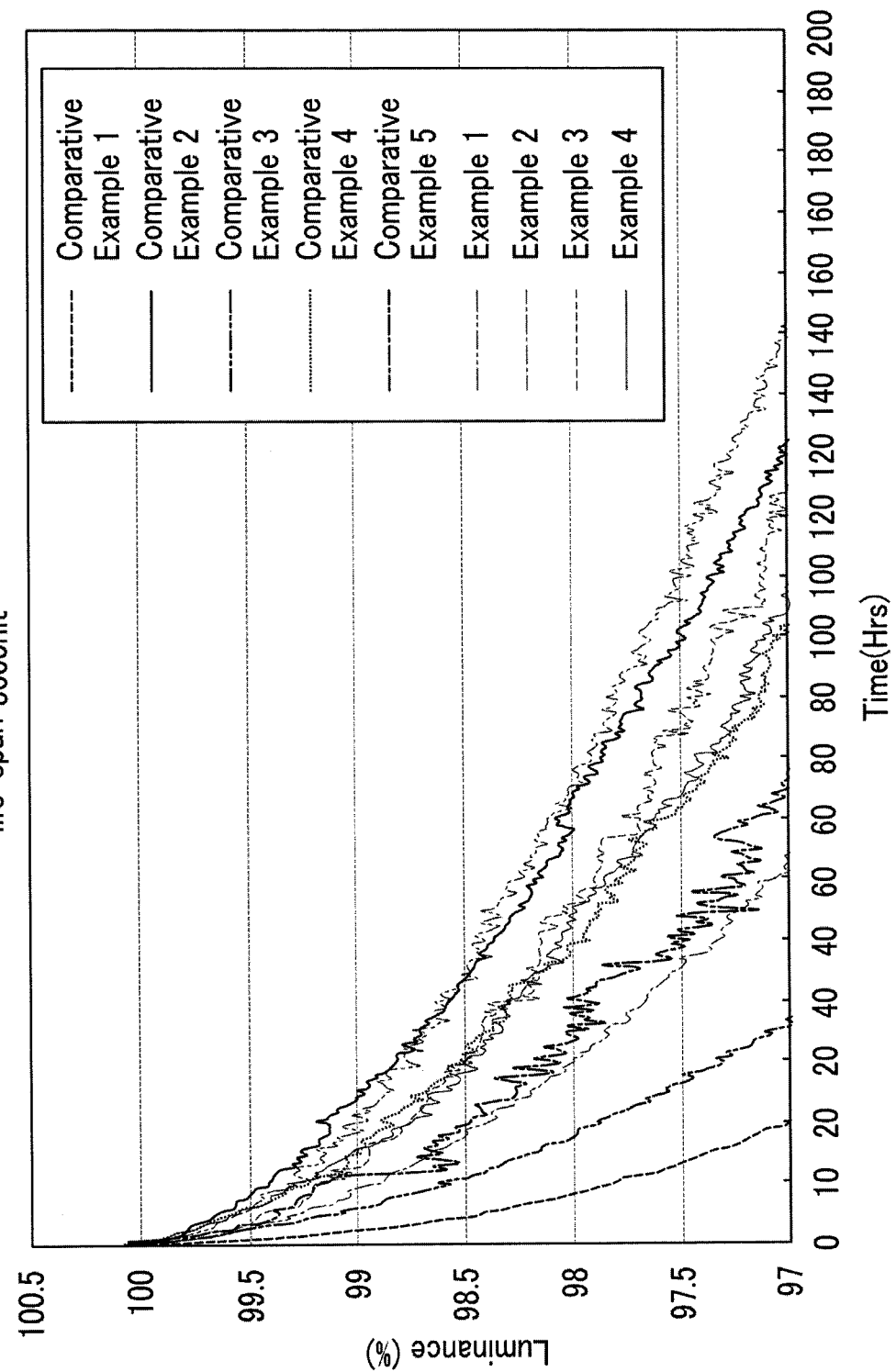
FIG. 6 illustrates a graph showing life-span characteristics of the organic light emitting diodes according to Examples 1 to 4 and Comparative Examples 1 to 5.

FIG. 6 illustrates a graph showing life-span characteristics of the organic light emitting diodes according to Examples 1 to 4 and Comparative Examples 1 to 5.

Figure 7:
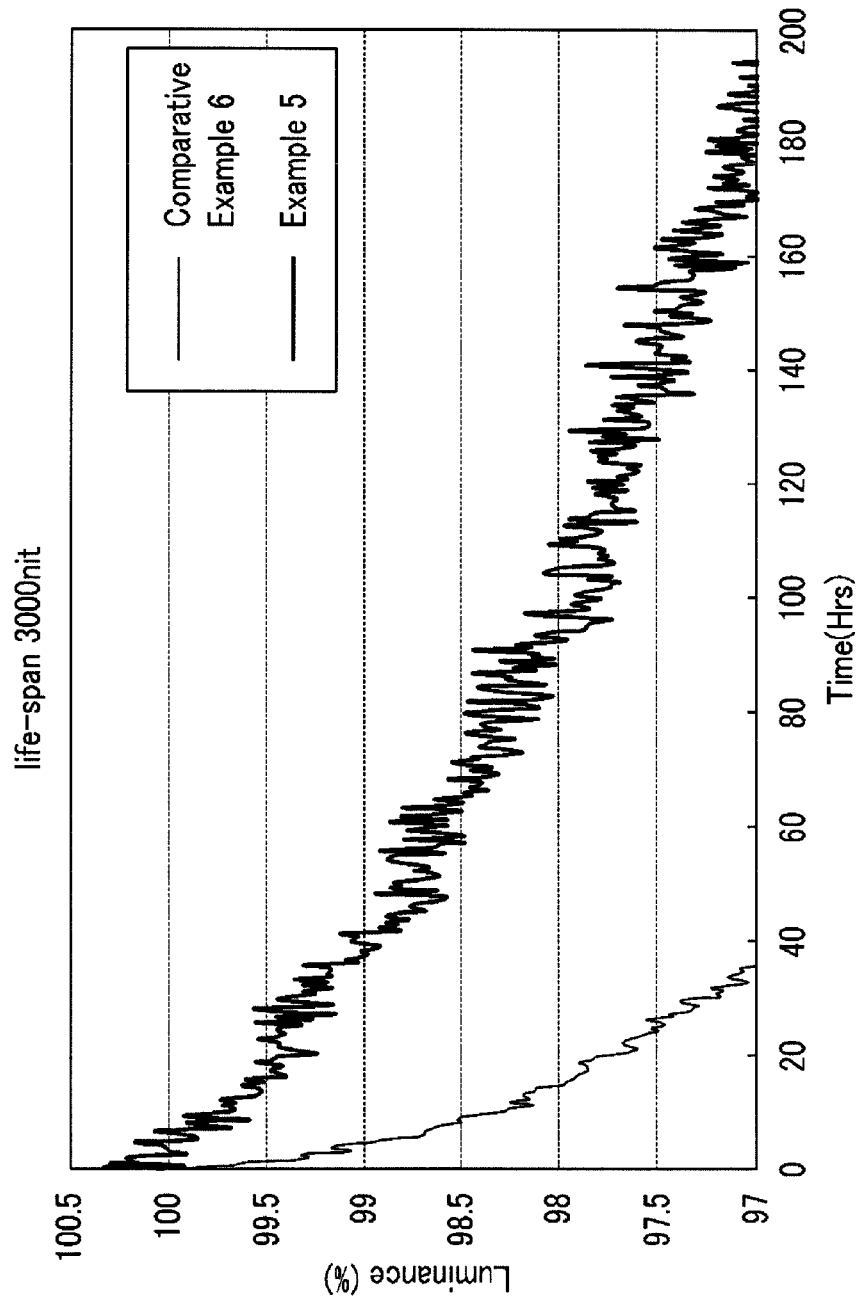
FIG. 7 illustrates a graph showing life-span characteristics of the organic light emitting diodes according to Example 5 and Comparative Example 6.

FIG. 7 illustrates a graph showing life-span characteristics of the organic light emitting diodes according to Example 5 and Comparative Example 6.

As shown in Tables 1 to 5 and FIGS. 6 and 7, the organic light emitting diode using two or more compounds according to an exemplary embodiment exhibited excellent characteristics, e.g., efficiency, life-span, and the like.

(Energy Level of Compound)

The compounds A-101, A-103, B-205, B-211, B-103, and B-106 were measured regarding energy level.

The energy levels of the compounds were calculated by using a B3LYP/6-31G set of Gaussian 03 package, and the results are provided in the following Table 6.

TABLE 6

| Material | HOMO (eV) | LUMO (eV) | ΔE (T1) | ΔE (S1) |
|---|---|---|---|---|
| B-101 | −5.16 | −1.89 | 2.83 | 2.90 |
| B-102 | −5.14 | −1.89 | 2.83 | 2.89 |
| B-106 | −5.15 | −1.89 | 2.82 | 2.89 |
| B-103 | −5.12 | −1.88 | 2.82 | 2.88 |
| B-201 | −5.05 | −1.72 | 2.78 | 2.93 |
| B-211 | −5.03 | −1.77 | 2.71 | 2.84 |
| B-205 | −5.00 | −1.76 | 2.71 | 2.84 |
| A-101 | −4.97 | −1.45 | 2.91 | 3.09 |
| A-103 | −4.97 | −1.46 | 2.91 | 3.08 |

The compounds had a HOMO energy level ranging of about −5.0 to −5.1 eV and thus, exhibited similar hole properties. The HOMO energy levels of the compounds are between those of materials for an electron transport layer (ETL) and/or a hole transport layer (HTL), and thus are appropriate energy levels.

The compounds had various LUMO energy levels depending on a substituent. The compound including a pyrimidinyl group and the compound including a triazinyl group had a LUMO energy level more than 0.3 eV lower than the compound including a pyridinyl group.

Accordingly, the compounds respectively including a pyrimidinyl group or a triazinyl group may exhibit excellent electron properties.

(Mixing Ratio of Compound of Example 1)

Two compounds used in the organic light emitting diode according to Example 1 were measured regarding a mixing ratio. The mixing ratio was identified through a liquid chromatography (High Performance Liquid Chromatography, HPLC) ratio.

Figure 8:
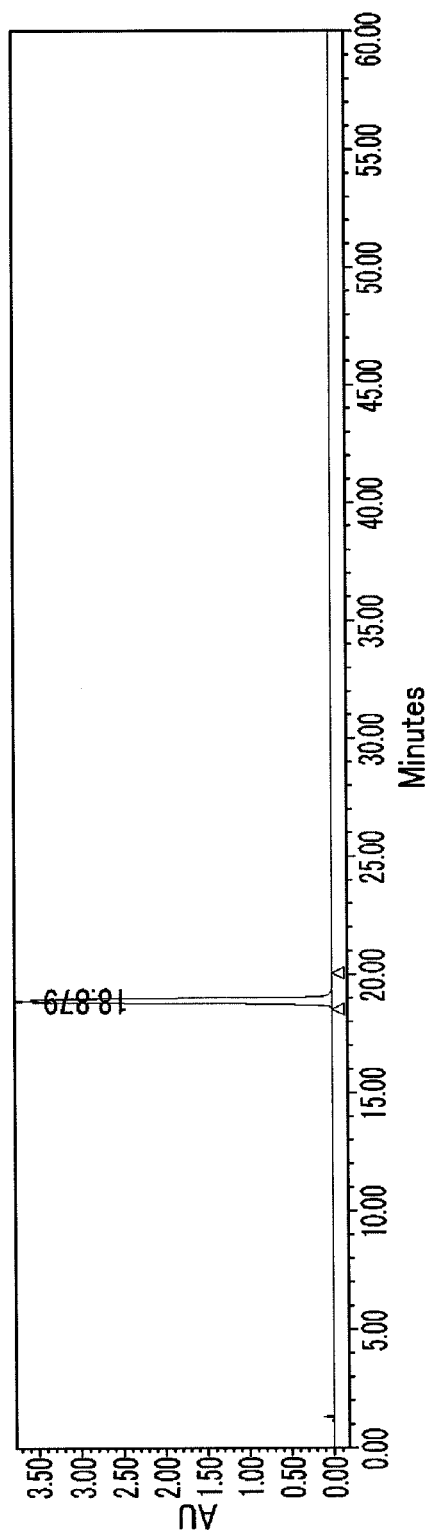
FIG. 8 illustrates a liquid chromatography result of 100% of the compound A-101.

FIG. 8 illustrates 100% liquid chromatography result of the compound A-101. The compound A-101 had a peak at the retention time of about 19 minutes.

Figure 9:
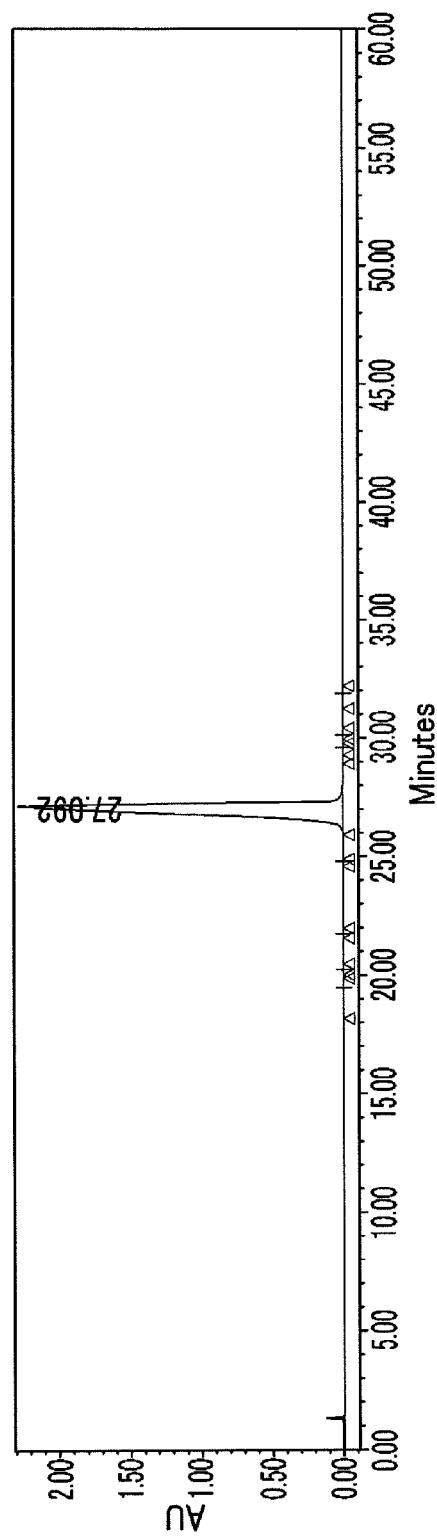
FIG. 9 illustrates a liquid chromatography result of 99.98% of the compound B-103.

FIG. 9 illustrates the liquid chromatography result of the compound B-103 99.98%. The compound B-103 had a peak at the retention time of about 27 minutes.

Figure 10:
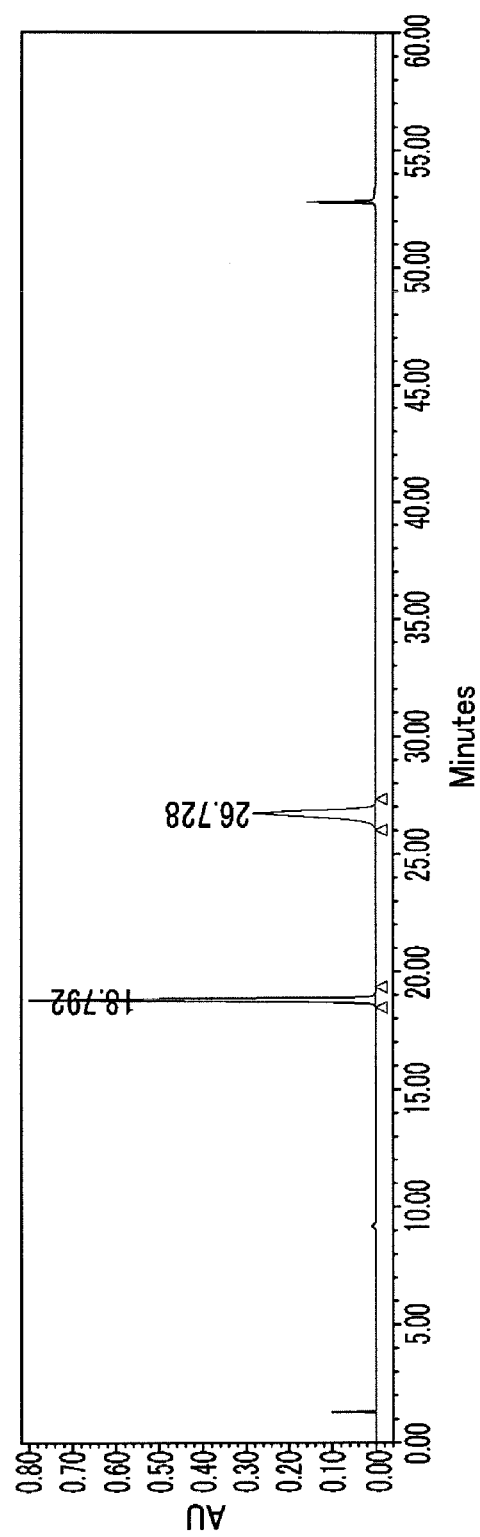
FIG. 10 illustrates a liquid chromatography result of the materials used in an emission layer for an organic light emitting diode according to Example 1.

FIG. 10 illustrates that the peak areas at 19 and 27 minutes had a ratio of 1:1 of a ratio based on the liquid chromatography results for materials used in an emission layer for an organic light emitting diode.

By way of summation and review, a phosphorescent light emitting material may be used for a light emitting material of an organic light emitting diode in addition to or in place of the fluorescent light emitting material. Such a phosphorescent material may emit lights by transiting the electrons from a ground state to an exited state, non-radiance transiting of a singlet exciton to a triplet exciton through intersystem crossing, and transiting a triplet exciton to a ground state to emit light.

As described above, in an organic light emitting diode, an organic material layer may include a light emitting material and a charge transport material, e.g., a hole injection material, a hole transport material, an electron transport material, an electron injection material, or the like.

The light emitting material may be classified as blue, green, and red light emitting materials according to emitted colors. Yellow and orange light emitting materials may emit colors approaching natural colors.

When one material is used as a light emitting material, a maximum light emitting wavelength may be shifted to a long wavelength, or color purity may decrease because of interactions between molecules, or device efficiency may decrease because of a light emitting quenching effect. Therefore, a host/dopant system may be included as a light emitting material in order to help improve color purity and increase luminous efficiency and stability through energy transfer.

In order to implement excellent performance of an organic light emitting diode, a material constituting an organic material layer, e.g., a hole injection material, a hole transport material, a light emitting material, an electron transport material, an electron injection material, and a light emitting material such as a host and/or a dopant, should be stable and have good efficiency.

A low molecular organic light emitting diode may be manufactured as a thin film in a vacuum deposition method and may have good efficiency and life-span performance. A polymer organic light emitting diode may be manufactured in an Inkjet or spin coating method and may have an advantage of low initial cost and being large-sized.

Both low molecular organic light emitting and polymer organic light emitting diodes may have an advantage of being self-light emitting, and having high speed response, wide viewing angle, ultrathin, high image quality, durability, large driving temperature range, or the like. For example, they may have good visibility due to self-light emitting characteristic compared with a conventional LCD (liquid crystal display), and may have an advantage of decreasing thickness and weight of LCD up to a third, because they do not need a backlight.

In addition, they may have a response speed 1,000 time faster microsecond unit than LCD. Thus, they may realize a perfect motion picture without after-image. Based on these advantages, they have been remarkably developed to have 80 times efficiency and more than 100 times life-span since they come out for the first time in the late 1980s. Recently, they keep being rapidly larger such as a 40-inch organic light emitting diode panel.

They should simultaneously have improved luminous efficiency and life-span in order to be larger. Herein, their luminous efficiency may need smooth combination between holes and electrons in an emission layer. However, an organic material in general may have slower electron mobility than hole mobility. Thus, inefficient combination between holes and electrons may occur. Accordingly, increasing electron injection and mobility from a cathode and simultaneously preventing movement of holes may be desirable.

In order to improve life-span, a material crystallization caused by Joule heat (generated during device operating) should be prevented. Accordingly, an organic material having excellent electron injection and mobility, and high electrochemical stability may be desirable.

The embodiments provide a material for an organic optoelectronic device that may act as a hole injection and hole transport, or an electron injection and transport, and also act as a light emitting host along with an appropriate dopant.

The embodiments provide a light emitting diode having excellent life span, efficiency, a driving voltage, electrochemical stability, and thermal stability.

The compound for an organic optoelectronic device may have an excellent hole or electron transporting property, high film stability, thermal stability, and triplet excitation energy.

The material may be used as a hole injection/transport material of an emission layer, a host material, or an electron injection/transport material. The organic optoelectronic device may have an excellent electrochemical and thermal stability, and therefore, may provide an organic light emitting diode having an excellent life-span characteristic, and high luminous efficiency at a low driving voltage.

The embodiments provide a material for an organic optoelectronic device that is capable of providing an organic optoelectronic device having excellent life-span, efficiency, electrochemical stability, and thermal stability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A material for an organic optoelectronic device, the material comprising:
   at least one compound represented by the following Chemical Formula A-1; and
   at least one compound represented by the following Chemical Formula B-1:

[Chemical Formula A-1]

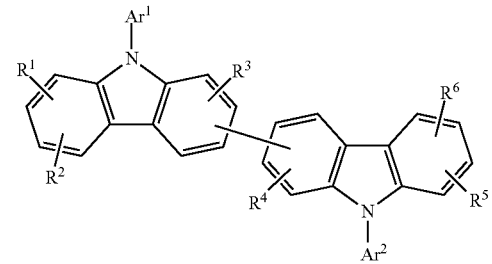

wherein, in Chemical Formula A-1:
   $Ar^1$ is a substituted or unsubstituted pyridinyl group,
   $Ar^2$ is hydrogen, deuterium, a C1 to C30 alkyl group, a C6 to C30 aryl group, or a substituted or unsubstituted pyrimidyl group, and
   $R^1$ to $R^6$ are each independently hydrogen, deuterium, a C1 to C30 alkyl group, a C6 to C30 aryl group, or a combination thereof, and

[Chemical Formula B-1]

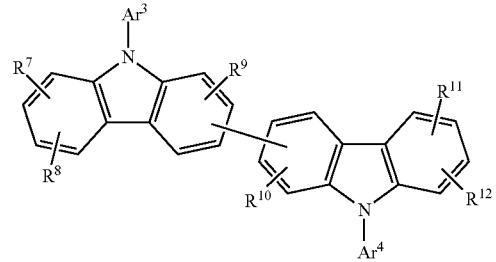

wherein, in Chemical Formula B-1:
Ar³ is a substituted or unsubstituted heteroaryl group including at least two nitrogen atoms,
Ar⁴ is hydrogen, deuterium, a C1 to C30 alkyl group, C6 to C30 aryl group, or a substituted or unsubstituted heteroaryl group that includes at least two nitrogen atoms, and
R⁷ to R¹² are each independently hydrogen, deuterium, a C1 to C30 alkyl group, a C6 to C30 aryl group, or a combination thereof.

2. The material for an organic optoelectronic device as claimed in claim 1, wherein the at least one compound represented by Chemical Formula A-1 is represented by the following Chemical Formula A-2, and the at least one compound represented by Chemical Formula B-1 is represented by the following Chemical Formula B-2:

[Chemical Formula A-2]

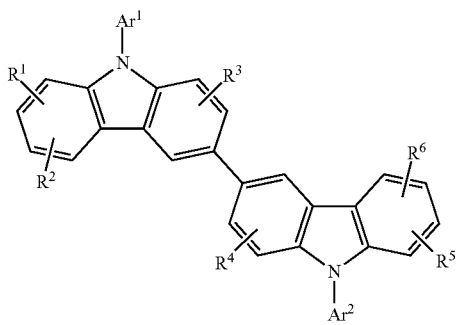

wherein, in Chemical Formula A-2:
Ar¹ is a substituted or unsubstituted pyridinyl group,
Ar² is hydrogen, deuterium, a C1 to C30 alkyl group, a C6 to C30 aryl group, or a substituted or unsubstituted pyrimidyl group, and
R¹ to R⁶ are each independently hydrogen, deuterium, a C1 to C30 alkyl group, a C6 to C30 aryl group, or a combination thereof, and

[Chemical Formula B-2]

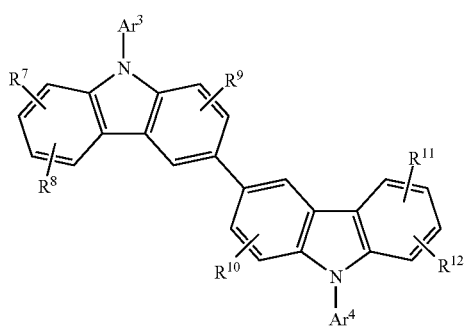

wherein, in Chemical Formula B-2:
Ar³ is a substituted or unsubstituted heteroaryl group including at least two nitrogen atoms, Ar⁴ is hydrogen, deuterium, a C1 to C30 alkyl group, C6 to C30 aryl group, or a substituted or unsubstituted heteroaryl group that includes at least two nitrogen atoms, and
R⁷ to R¹² are each independently hydrogen, deuterium, a C1 to C30 alkyl group, a C6 to C30 aryl group, or a combination thereof.

3. The material for an organic optoelectronic device as claimed in claim 1, wherein Ar³ of Chemical Formula B-1 is represented by one of the following Chemical Formulae B-3, B-4, B-5, or B-6:

[Chemical Formula B-3]

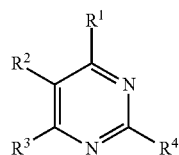

[Chemical Formula B-4]

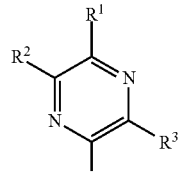

[Chemical Formula B-5]

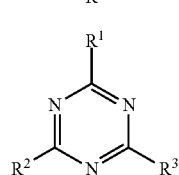

[Chemical Formula B-6]

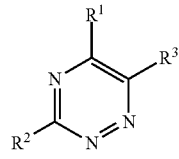

wherein:
in Chemical Formulae B-3, B-4, B-5, and B-6, R¹ to R⁴ are each independently a single bond, hydrogen, deuterium, a C1 to C30 alkyl group, a C6 to C30 aryl group, or a combination thereof,
in Chemical Formulae B-3 and B-4, one of R¹ to R⁴ is a single bond linked to a nitrogen atom of Chemical Formula B-1, and
in Chemical Formulae B-5 and B-6, one of R¹ to R³ is a single bond linked to a nitrogen atom of Chemical Formula B-1.

4. The material for an organic optoelectronic device as claimed in claim 1, wherein Ar² and Ar⁴ are each independently a substituted phenyl group.

5. The material for an organic optoelectronic device as claimed in claim 1, wherein Ar¹ of Chemical Formula A-1 is represented by one of the following Chemical Formula A-3 or Chemical Formula A-4, in which * is a bonding location to a nitrogen atom of Chemical Formula A-1:

[Chemical Formula A-3]

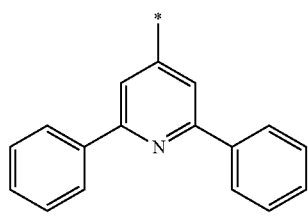

[Chemical Formula A-4]

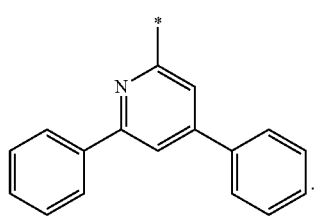

6. The material for an organic optoelectronic device as claimed in claim 1, wherein $Ar^3$ of Chemical Formula B-1 is represented by one of the following Chemical Formulae B-7, B-8, or B-9, in which * is a bonding location to a nitrogen atom of Chemical Formula B-1:

[Chemical Formula B-7]

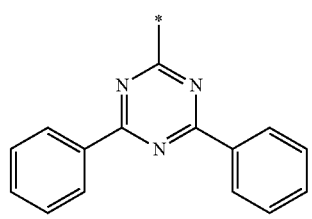

[Chemical Formula B-8]

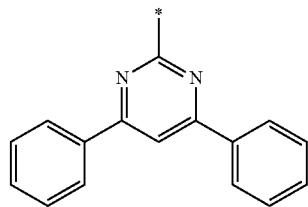

[Chemical Formula B-9]

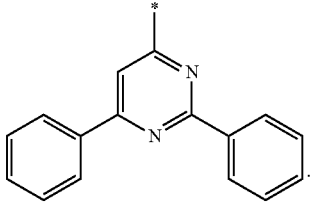

7. The material for an organic optoelectronic device as claimed in claim 1, wherein $Ar^3$ of Chemical Formula B-1 is a substituted or unsubstituted triazinyl group.

8. The material for an organic optoelectronic device as claimed in claim 1, wherein $Ar^3$ of Chemical Formula B-1 is a substituted or unsubstituted pyrimidinyl group.

9. The material for an organic optoelectronic device as claimed in claim 1, wherein the compound represented by Chemical Formula A-1 is represented by one of the following Chemical Formulae A-101 to A-121:

[Chemical Formula A-101]

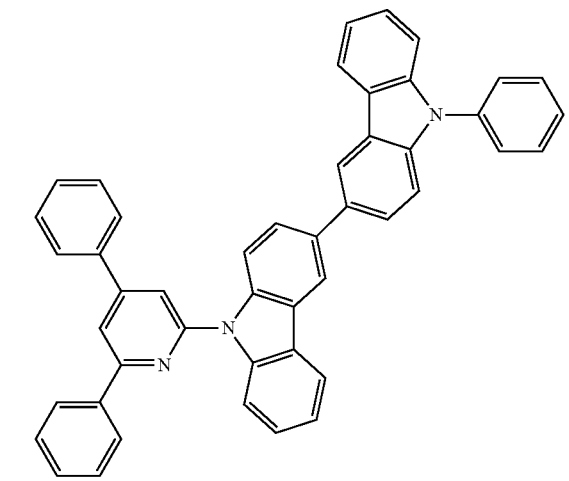

[Chemical Formula A-102]

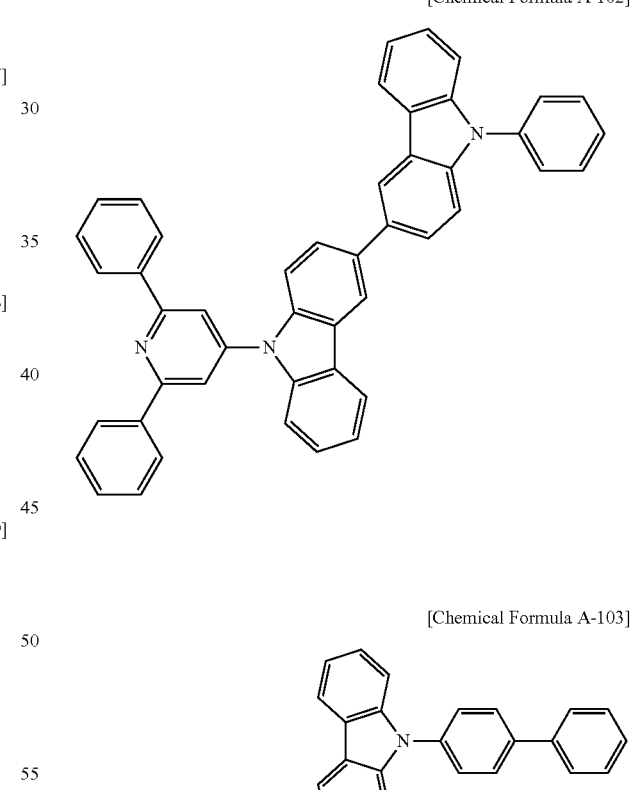

[Chemical Formula A-103]

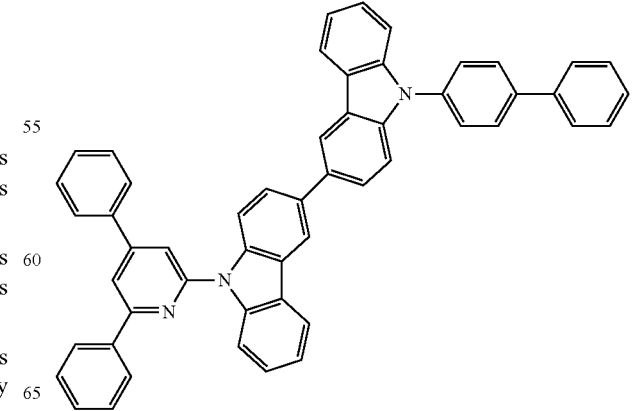

[Chemical Formula A-104]
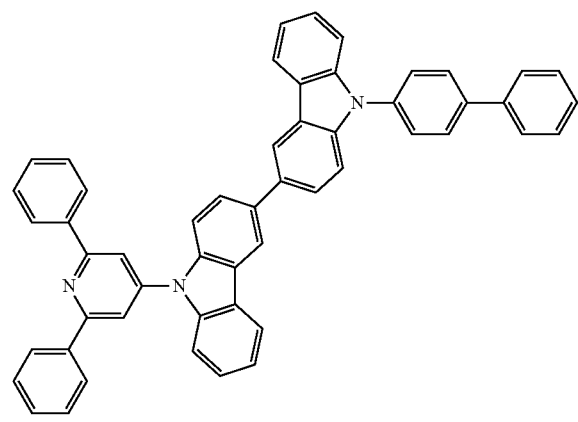
[Chemical Formula A-107]
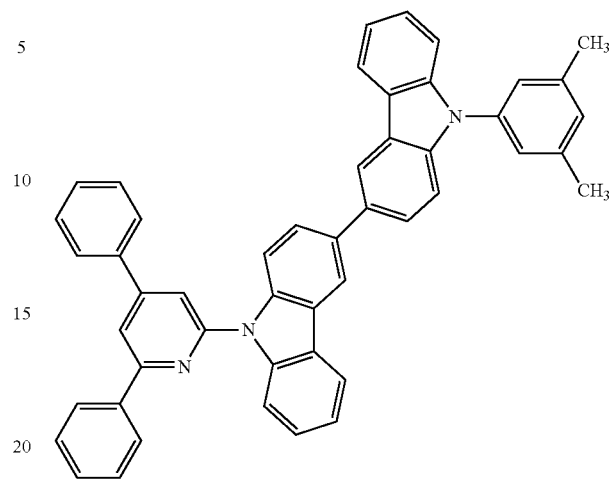
[Chemical Formula A-105]
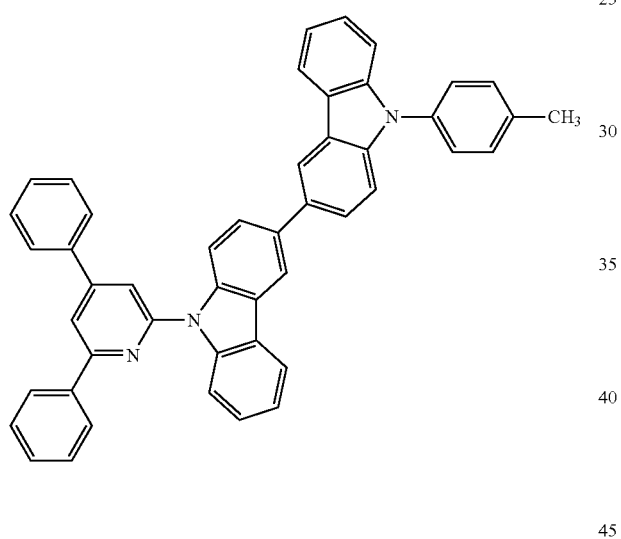
[Chemical Formula A-108]
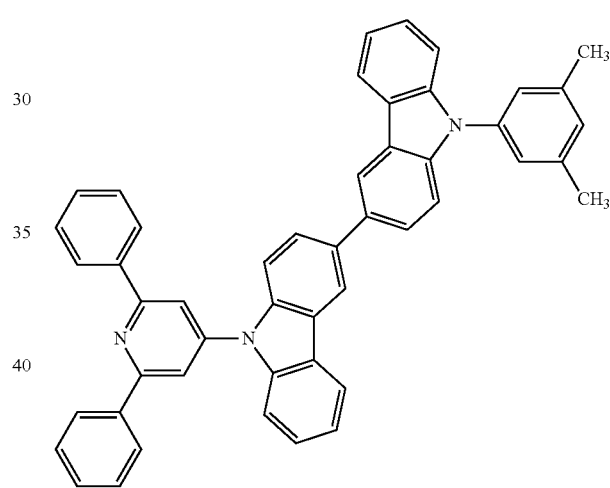
[Chemical Formula A-106]
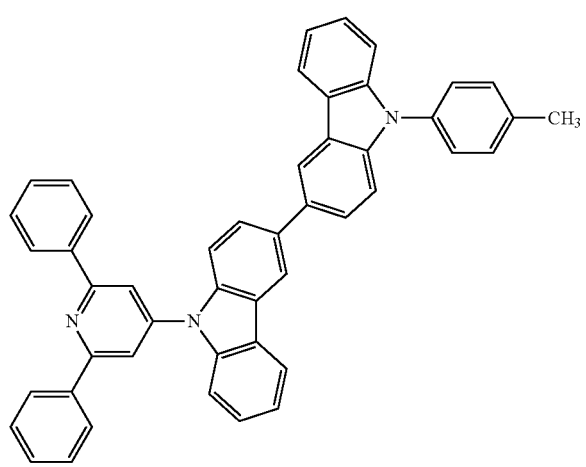
[Chemical Formula A-109]
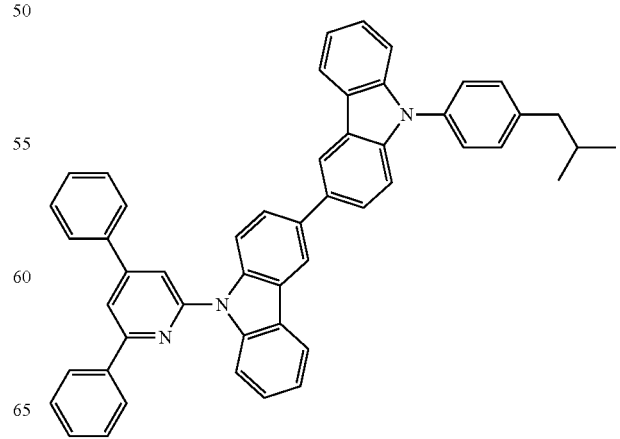

[Chemical Formula A-110]
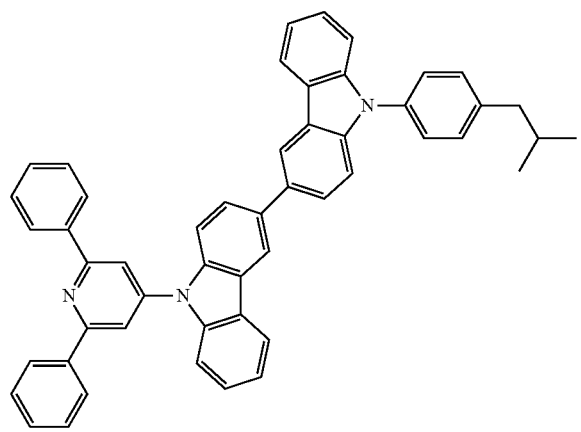
[Chemical Formula A-111]
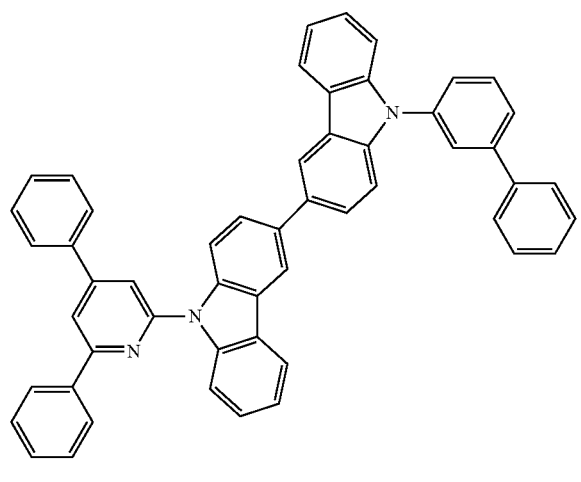
[Chemical Formula A-112]
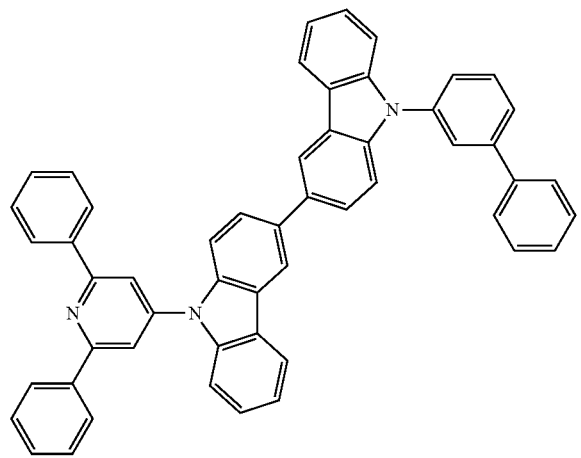
[Chemical Formula A-113]
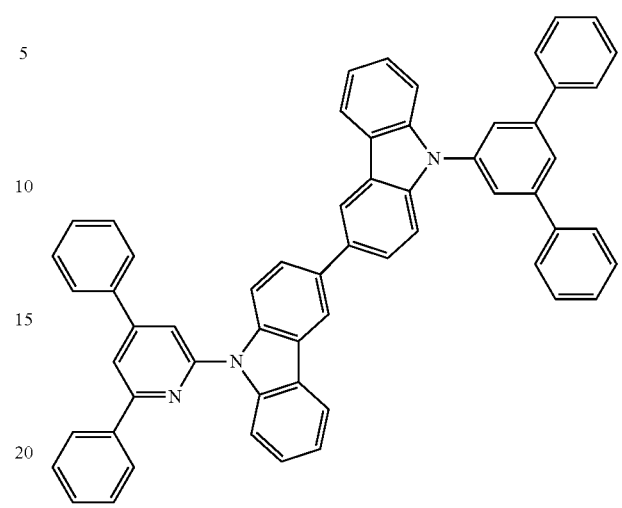
[Chemical Formula A-114]
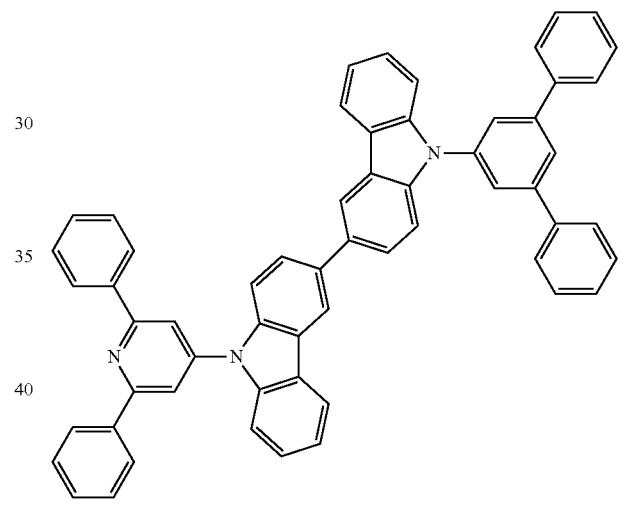
[Chemical Formula A-115]
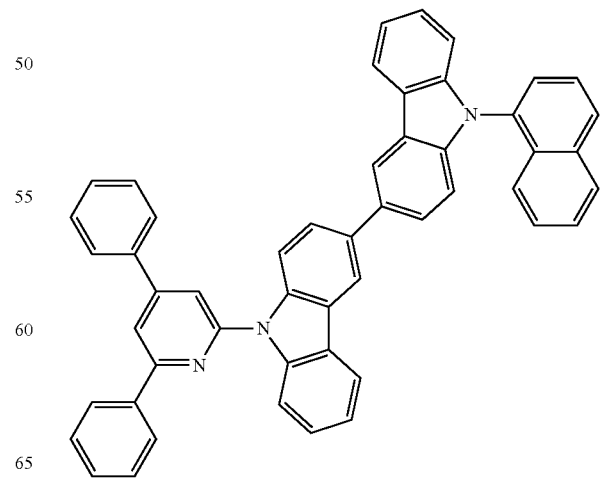

[Chemical Formula A-116]
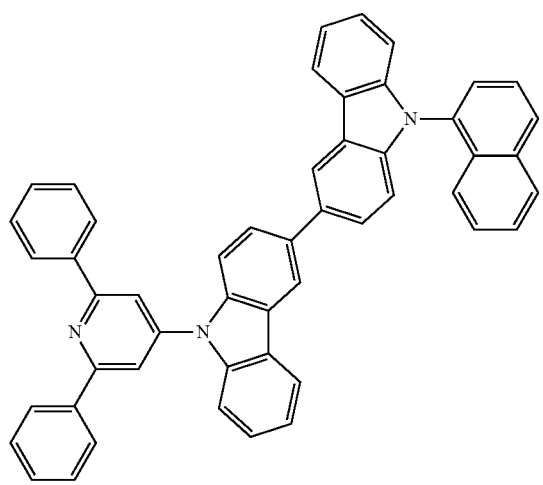
[Chemical Formula A-117]
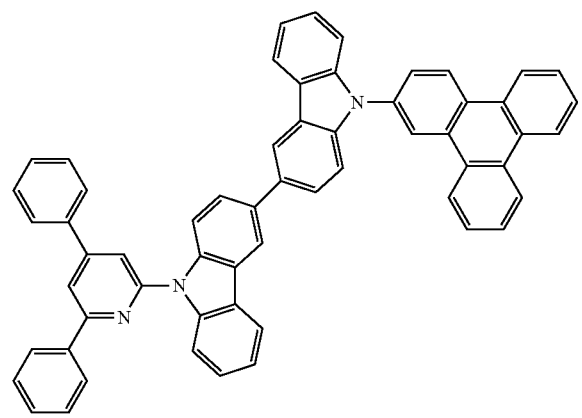
[Chemical Formula A-118]
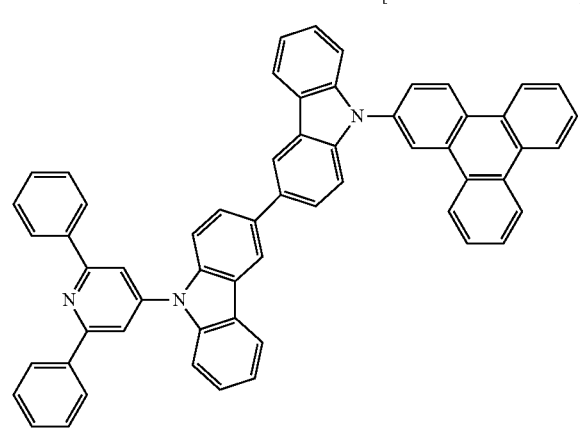
[Chemical Formula A-119]
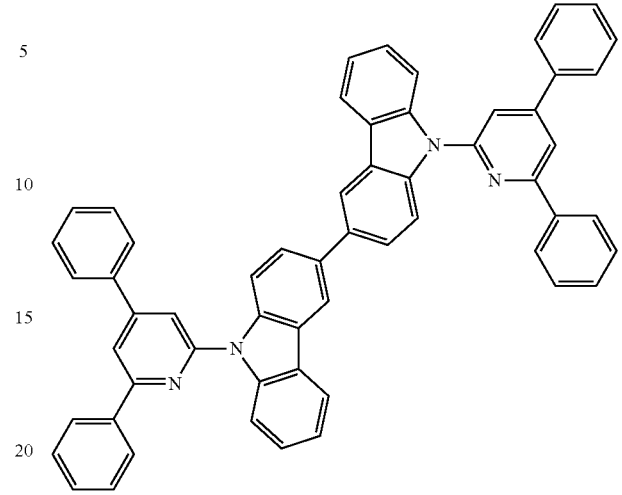
[Chemical Formula A-120]
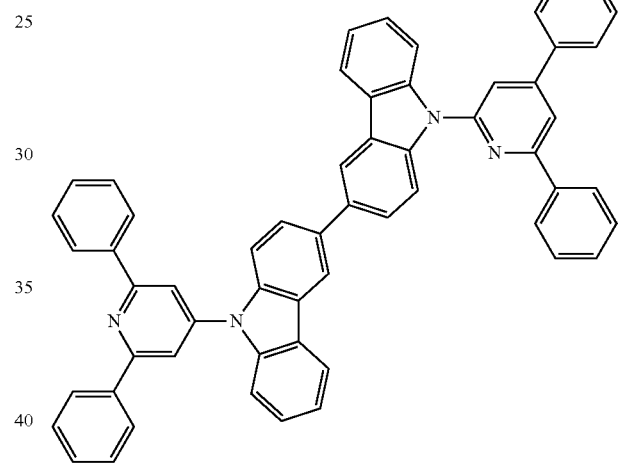
[Chemical Formula A-121]
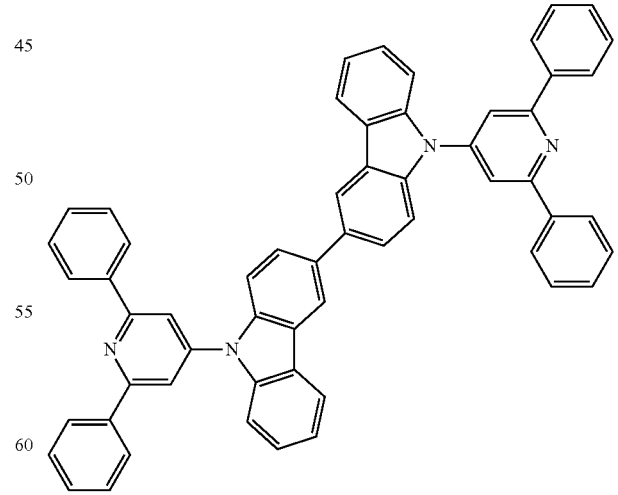
10. The material for an organic optoelectronic device as claimed in claim 1, wherein the compound represented by Chemical Formula B-1 is represented by one of the following Chemical Formulae B-101 to B-111:

[Chemical Formula B-101]
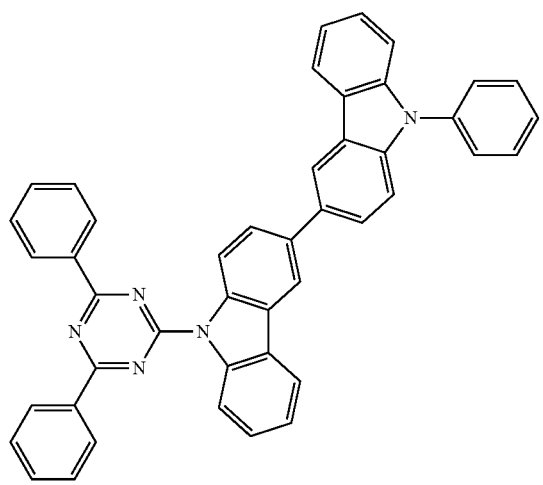
[Chemical Formula B-102]
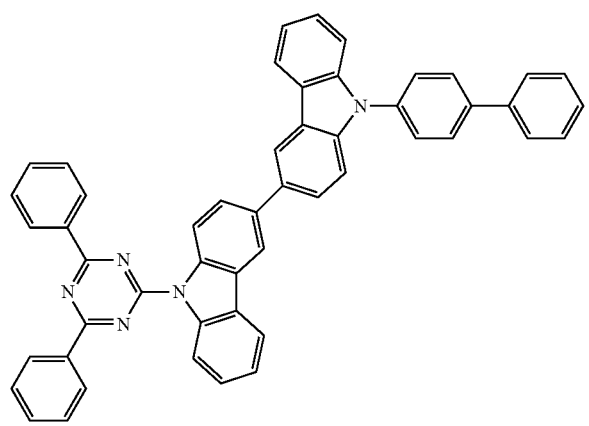
[Chemical Formula B-103]
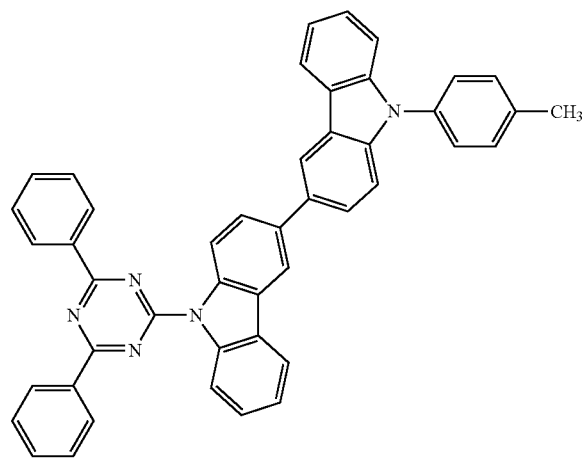
-continued
[Chemical Formula B-104]
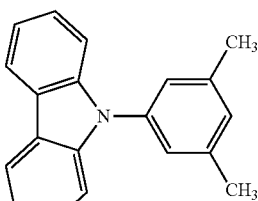
[Chemical Formula B-105]
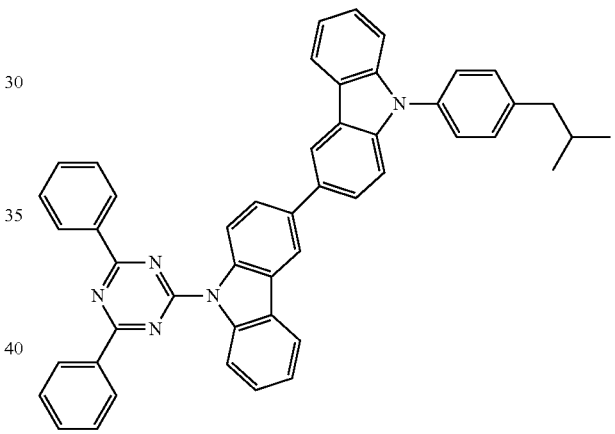
[Chemical Formula B-106]
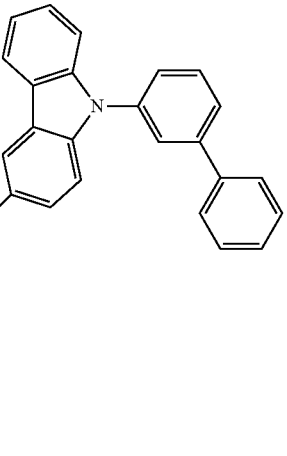

[Chemical Formula B-107]
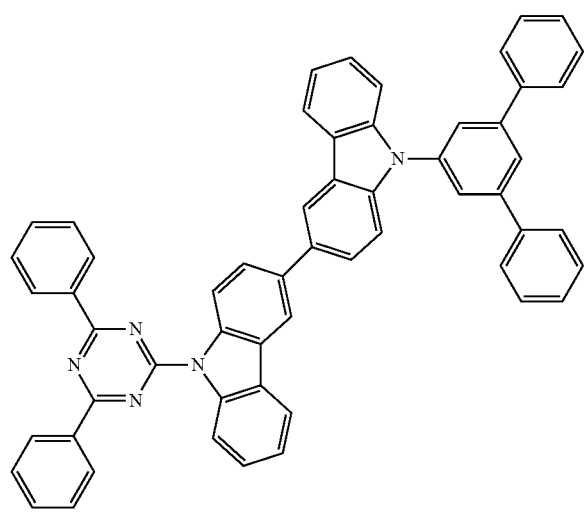
[Chemical Formula B-108]
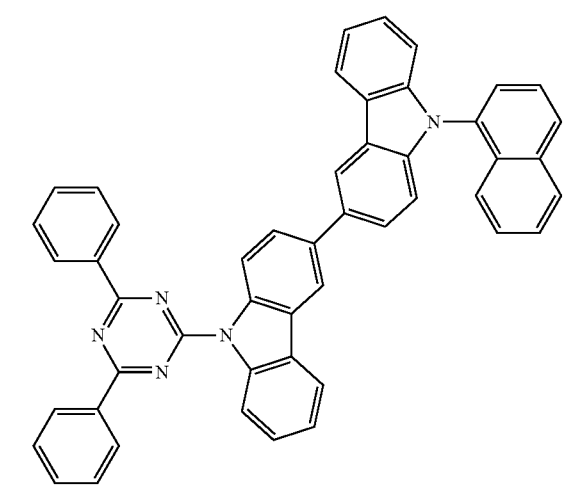
[Chemical Formula B-109]
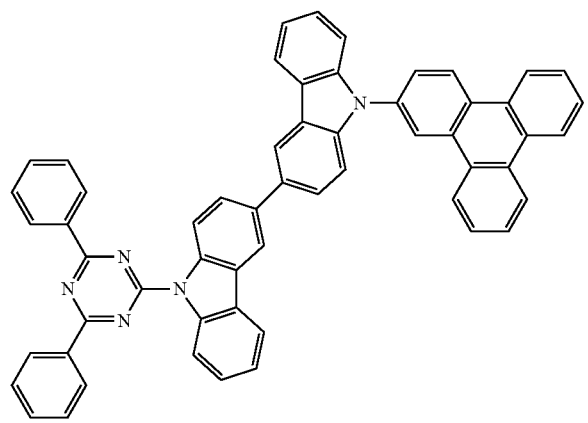
[Chemical Formula B-110]
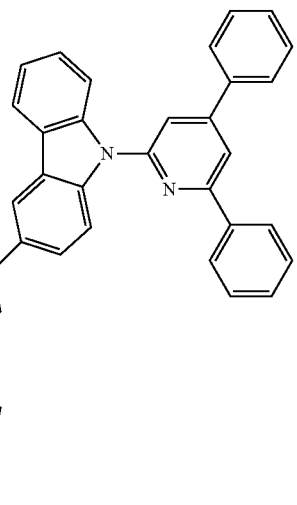
[Chemical Formula B-111]
11. The material for an organic optoelectronic device as claimed in claim 1, wherein the compound represented by Chemical Formula B-1 is represented by one of the following Chemical Formulae B-201 to B-221:
[Chemical Formula B-201]
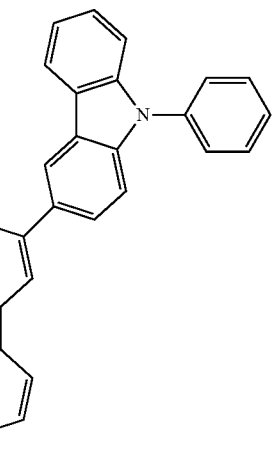

[Chemical Formula B-202]
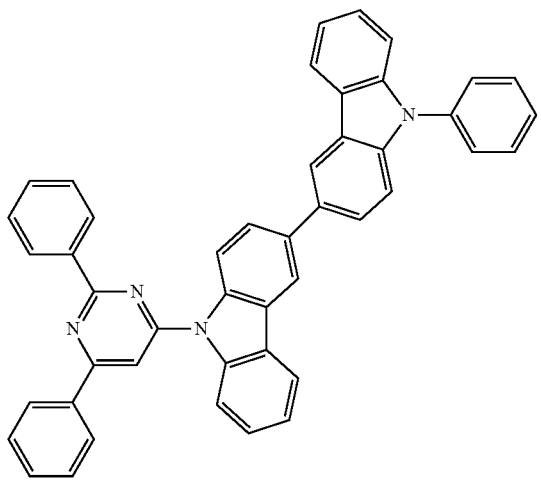
[Chemical Formula B-203]
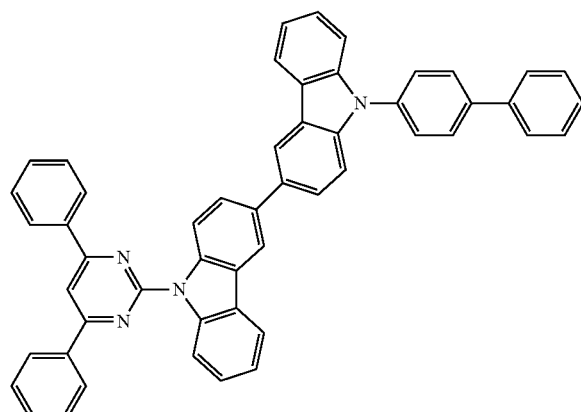
[Chemical Formula B-204]
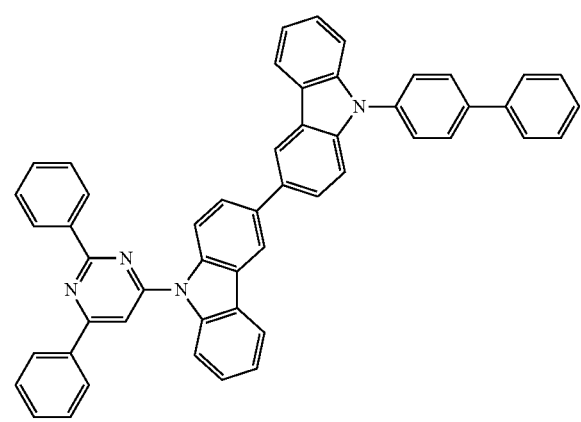
[Chemical Formula B-205]
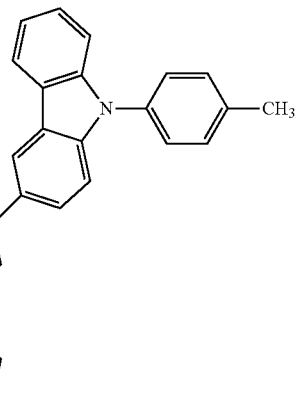
[Chemical Formula B-206]
[Chemical Formula B-207]
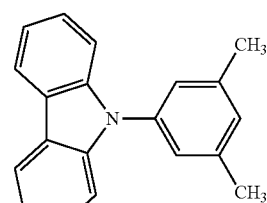

[Chemical Formula B-208]
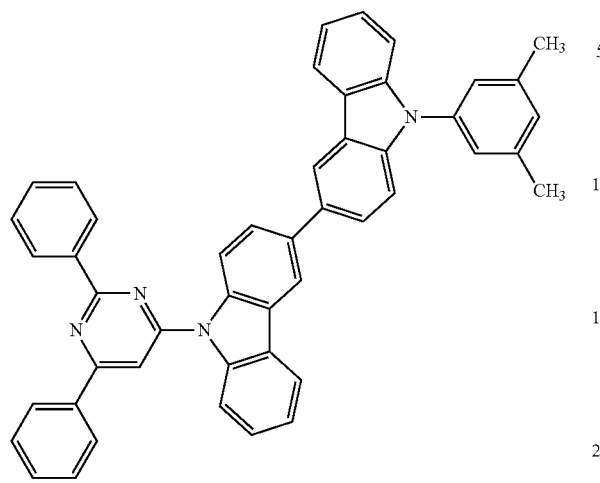
[Chemical Formula B-211]
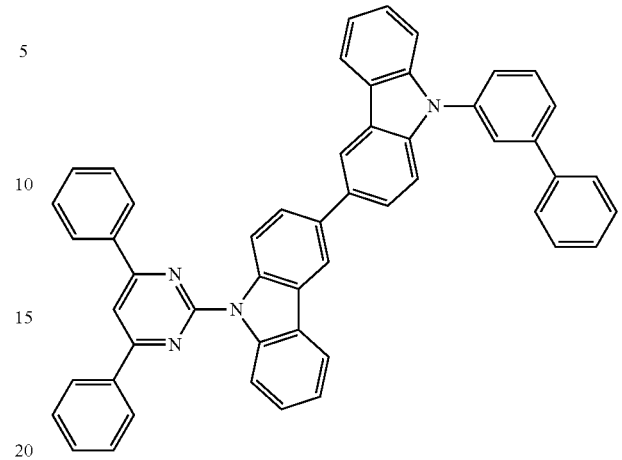
[Chemical Formula B-209]
[Chemical Formula B-212]
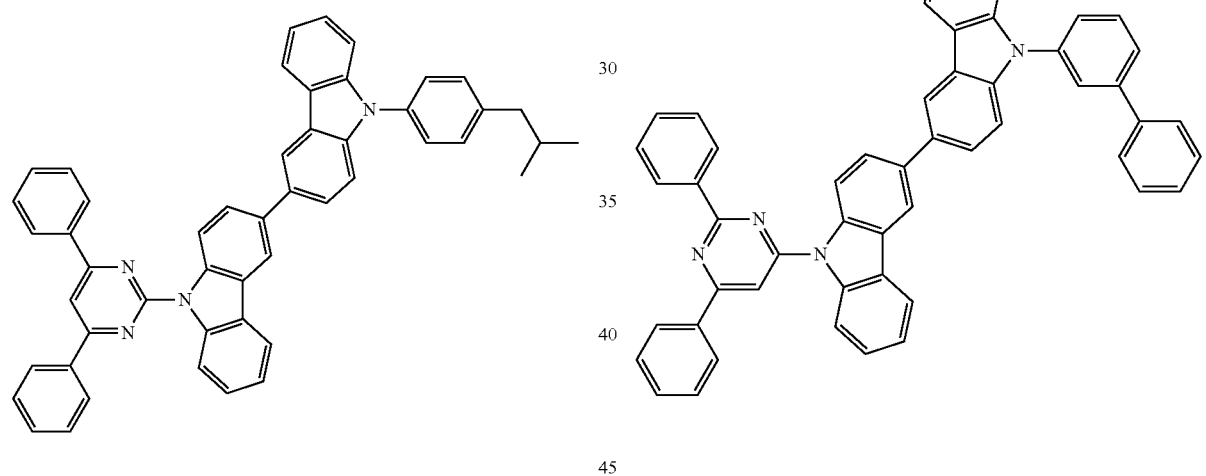
[Chemical Formula B-210]
[Chemical Formula B-213]
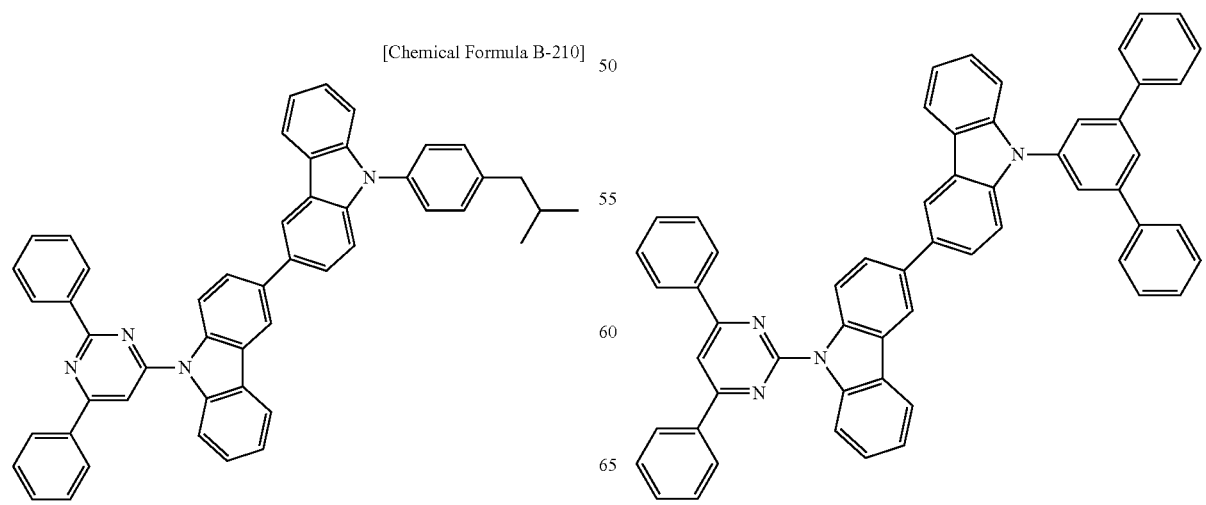

[Chemical Formula B-214]
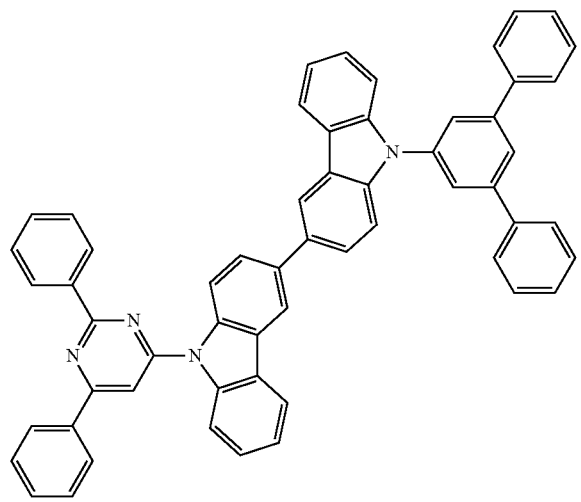
[Chemical Formula B-215]
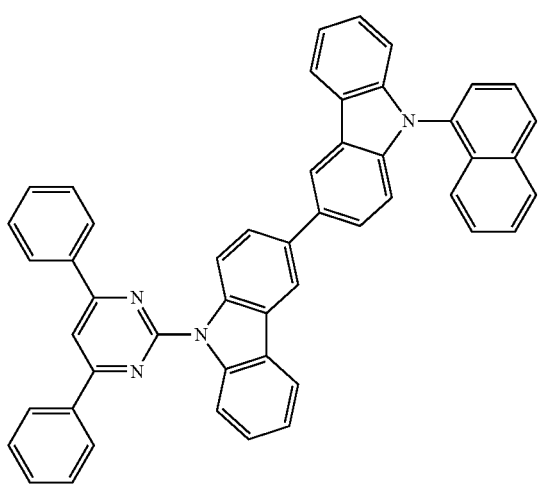
[Chemical Formula B-216]
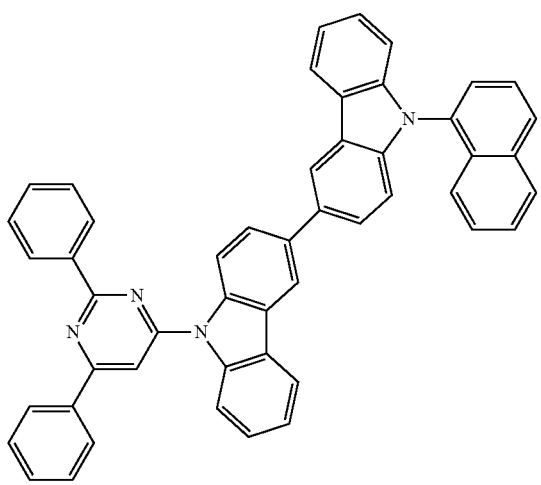
[Chemical Formula B-217]
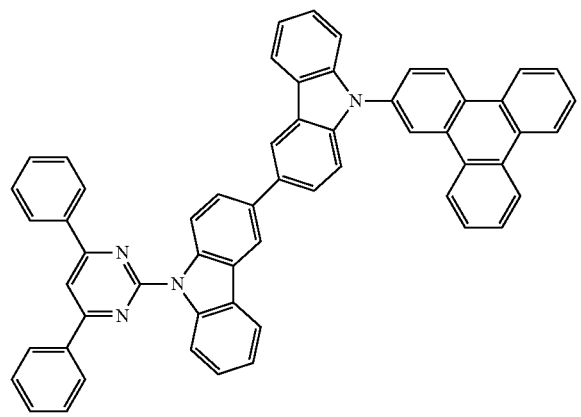
[Chemical Formula B-218]
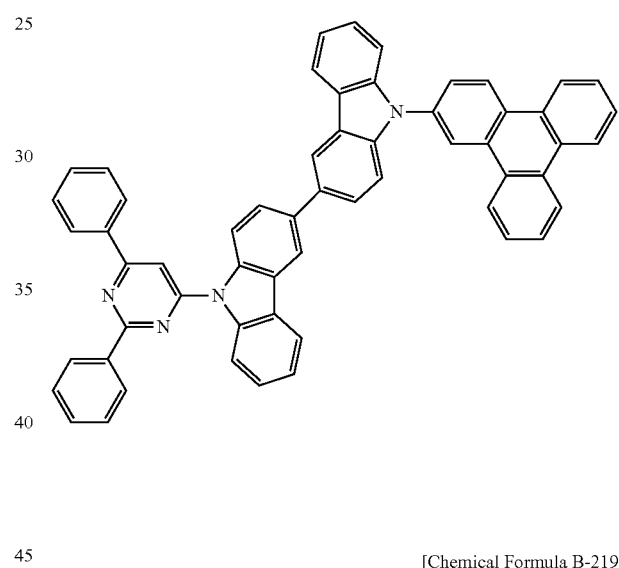
[Chemical Formula B-219]
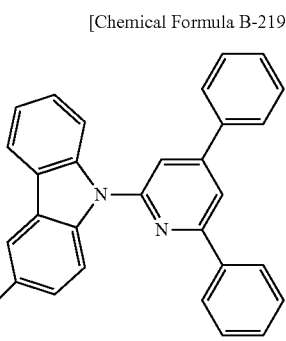

[Chemical Formula B-220]

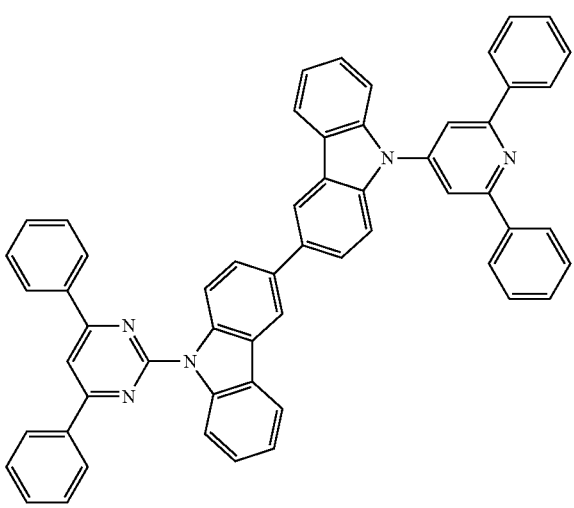

[Chemical Formula B-221]

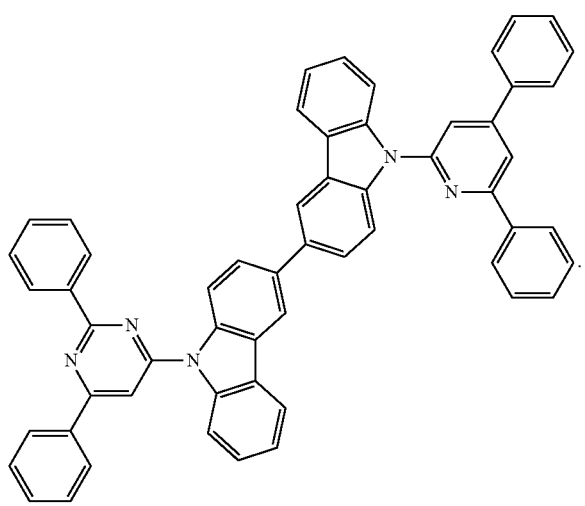

12. The material for an organic optoelectronic device as claimed in claim 1, wherein the compound represented by Chemical Formula B-1 has a LUMO energy level that is lower by 0.2 eV or more than a LUMO energy level of the compound represented by Chemical Formula A-1.

13. The material for an organic optoelectronic device as claimed in claim 1, wherein the organic optoelectronic device is selected from the group of an organic photoelectric device, an organic light emitting diode, an organic solar cell, an organic transistor, an organic photo-conductor drum, and an organic memory device.

14. An organic light emitting diode, comprising:
an anode;
a cathode; and
at least one organic thin layer between the anode and the cathode,
wherein the at least one organic thin layer includes the material for an organic optoelectronic device as claimed in claim 1.

15. The organic light emitting diode as claimed in claim 14, wherein the at least one organic thin layer is an emission layer, a hole transport layer (HTL), a hole injection layer (HIL), an electron transport layer (ETL), an electron injection layer (EIL), a hole blocking layer, or a combination thereof.

16. The organic light emitting diode as claimed in claim 15, wherein:
the at least one organic thin layer includes the hole transport layer (HTL) or the hole injection layer (HIL), and
the material for an organic optoelectronic device is included in the hole transport layer (HTL) or the hole injection layer (HIL).

17. The organic light emitting diode as claimed in claim 15, wherein:
the at least one organic thin layer includes the electron transport layer (ETL) or the electron injection layer (EIL), and
the material for an organic optoelectronic device is included in the electron transport layer (ETL) or the electron injection layer (EIL).

18. The organic light emitting diode as claimed in claim 15, wherein:
the at least one organic thin layer includes the emission layer, and
the material for an organic optoelectronic device is included in the emission layer.

19. The organic light emitting diode as claimed in claim 18, wherein the material for an organic optoelectronic device is a phosphorescent or fluorescent host material in the emission layer.

20. A display device comprising the organic light emitting diode as claimed in claim 14.

* * * * *